(12) United States Patent
Maimon et al.

(10) Patent No.: US 12,419,117 B2
(45) Date of Patent: Sep. 16, 2025

(54) ISRAEL HYBRID PHOTOVOLTAIC DEVICE HAVING RIGID PLANAR SEGMENTS AND FLEXIBLE NON-PLANAR SEGMENTS

(71) Applicant: SOLARPAINT LTD., Yokneam Illit (IL)

(72) Inventors: Eran Maimon, Kibbutz Nahsholim (IL); Ramon Joseph Albalak, Haifa (IL); Oded Rozenberg, Kibbutz Nahsholim (IL)

(73) Assignee: SOLARPAINT LTD., Yokneam Illit (IL)

( * ) Notice: Subject to any disclaimer, the term of this patent is extended or adjusted under 35 U.S.C. 154(b) by 0 days.

(21) Appl. No.: 18/664,329

(22) Filed: May 15, 2024

(65) Prior Publication Data

US 2024/0304740 A1 Sep. 12, 2024

Related U.S. Application Data

(63) Continuation-in-part of application No. 18/635,039, filed on Apr. 15, 2024, now Pat. No. 12,274,096,
(Continued)

(51) Int. Cl.
*H10F 19/30* (2025.01)
*H10F 71/00* (2025.01)
*H10F 77/20* (2025.01)

(52) U.S. Cl.
CPC ............. *H10F 19/30* (2025.01); *H10F 71/00* (2025.01); *H10F 77/227* (2025.01)

(58) Field of Classification Search
CPC .......... H02S 20/22; H02S 20/23; H02S 20/25; H02S 20/26; H02S 30/00; H02S 30/10;
(Continued)

(56) References Cited

U.S. PATENT DOCUMENTS 5,024,953 A * 6/1991 Uematsu ............... H10F 77/703
257/E23.179
5,213,626 A * 5/1993 Paetz ................ B32B 17/10036
136/251
(Continued)

FOREIGN PATENT DOCUMENTS

CN 203721747 U 7/2014
CN 109659382 A 4/2019
(Continued)

OTHER PUBLICATIONS

JP-H07312434-A English machine translation (Year: 1995).*
(Continued)

*Primary Examiner* — Andrew J Golden
(74) *Attorney, Agent, or Firm* — AlphaPatent Associates Ltd.; Daniel J. Swirsky

(57) ABSTRACT

A hybrid photovoltaic (PV) device includes: a rigid PV segment, having one or more PV cells that convert light to electricity, wherein the rigid PV segment is non-foldable and non-bendable; and a co-located flexible PV segment, wherein the flexible PV segment is foldable or bendable without being damaged; electric connectors, that connect between (i) electric current or voltage generated by the rigid PV segment, and (ii) electric current or voltage generated by the flexible PV segment; a unified encapsulation layer, encapsulating together both the rigid PV segment and the co-located flexible PV segment. The rigid PV segment, the co-located flexible PV segment, the electric connectors, and the unified encapsulation layer, form together the hybrid PV device as a single stand-alone PV device that converts light to electricity, and has at least one rigid region corresponding to the rigid PV segment and at least one flexible region corresponding to the co-located flexible PV segment.

30 Claims, 2 Drawing Sheets

Related U.S. Application Data which is a continuation of application No. 17/353,867, filed on Jun. 22, 2021, now Pat. No. 11,978,815, which is a continuation-in-part of application No. 16/362,665, filed on Mar. 24, 2019, now Pat. No. 11,081,606, said application No. 17/353,867 is a continuation-in-part of application No. PCT/IL2019/051146, filed on Dec. 26, 2019, which is a continuation-in-part of application No. 16/362,665, filed on Mar. 24, 2019, now Pat. No. 11,081,606, application No. 18/664,329 is a continuation-in-part of application No. 17/802,335, filed as application No. PCT/IL2021/050217 on Feb. 25, 2021, now abandoned, application No. 18/664,329 is a continuation of application No. 18/631,106, filed on Apr. 10, 2024, which is a continuation of application No. PCT/IL2022/051416, filed on Oct. 30, 2022, said application No. 18/631,106 is a continuation-in-part of application No. 18/129,865, filed on Apr. 2, 2023, which is a continuation of application No. PCT/IL2021/051202, filed on Oct. 7, 2021, which is a continuation-in-part of application No. 17/353,867, filed on Jun. 22, 2021, now Pat. No. 11,978,815, said application No. 18/129,865 is a continuation-in-part of application No. 17/353,867, filed on Jun. 22, 2021, now Pat. No. 11,978,815, which is a continuation-in-part of application No. 16/362,665, filed on Mar. 24, 2019, now Pat. No. 11,081,606, said application No. 17/353,867 is a continuation-in-part of application No. PCT/IL2019/051416, filed on Dec. 26, 2019, which is a continuation-in-part of application No. 16/362,665, filed on Mar. 24, 2019, now Pat. No. 11,081,606, said application No. 18/129,865 is a continuation-in-part of application No. 17/802,335, filed as application No. PCT/IL2021/050217 on Feb. 25, 2021, now abandoned.

(60) Provisional application No. 62/785,282, filed on Dec. 27, 2018, provisional application No. 62/982,536, filed on Feb. 27, 2020, provisional application No. 63/273,940, filed on Oct. 31, 2021, provisional application No. 63/088,535, filed on Oct. 7, 2020.

(58) Field of Classification Search
CPC .......... H02S 30/20; H02S 40/34; H02S 40/36; H10F 19/00; H10F 19/30; H10F 19/80; H10F 19/804; H10F 19/85; H10F 19/902; H10F 77/147; H10F 77/227; H10F 77/955; H10F 71/00
See application file for complete search history.

(56) References Cited

U.S. PATENT DOCUMENTS

| | | | | |
|---|---|---|---|---|
| 2007/0295388 A1* | 12/2007 | Adriani | ................... | H02S 20/23 136/251 |
| 2011/0100451 A1* | 5/2011 | Krause | .................. | H10F 19/904 257/E31.124 |
| 2011/0239450 A1* | 10/2011 | Basol | .................... | H10F 19/902 29/729 |
| 2013/0061913 A1* | 3/2013 | Willham | ................. | H10F 19/00 136/251 |
| 2013/0206219 A1* | 8/2013 | Kurtin | ................... | H10F 77/169 136/255 |
| 2014/0000683 A1* | 1/2014 | Pretorius | ................. | H10F 19/80 438/66 |
| 2014/0167677 A1 | 6/2014 | Voelkner | | |
| 2014/0283898 A1* | 9/2014 | Pilat | ........................ | H10F 19/80 438/66 |
| 2015/0053265 A1* | 2/2015 | Gaume | ................. | H10F 19/804 438/66 |
| 2015/0136207 A1 | 5/2015 | Giron | | |
| 2019/0036480 A1* | 1/2019 | Barr | ...................... | H10F 19/807 |
| 2019/0081592 A1 | 3/2019 | Oldridge | | |
| 2019/0319148 A1* | 10/2019 | Zhu | .......................... | H02S 30/20 |

FOREIGN PATENT DOCUMENTS

| | | | |
|---|---|---|---|
| EP | 3712964 A1 | 9/2020 | |
| JP | H07312434 A | * 11/1995 | |
| WO | WO-2020136653 A1 | * 7/2020 | ........... H01L 27/142 |

OTHER PUBLICATIONS

International Search Report dated Feb. 16, 2023 in PCT/IL2022/051146.
Written Opinion of the International Searching Authority dated Feb. 16, 2023 in PCT/IL2022/051146.
International Search Report dated Jun. 22, 2021 in PCT/IL2021/050217.
Written Opinion of the International Searching Authority dated Jun. 22, 2021 in PCT/IL2021/050217.
Machine Translation of CN 109659382 A, obtained from "Google Patents" on Jul. 29, 2025 from: https://patents.google.com/patent/CN109659382A/en.
Letter dated Feb. 29, 2024 from the European Patent Office in patent application EP 21760196.2.
Machine Translation of CN 203721747 U, Obtained from "Google Patents" on Jul. 29, 2025 from: https://patents.google.com/patent/CN203721747U/en.

* cited by examiner

ISRAEL HYBRID PHOTOVOLTAIC DEVICE HAVING RIGID PLANAR SEGMENTS AND FLEXIBLE NON-PLANAR SEGMENTS

CROSS-REFERENCE TO RELATED APPLICATIONS

This patent application is a Continuation-in-Part (CIP) of U.S. Ser. No. 18/635,039, filed on Apr. 15, 2024, which is hereby incorporated by reference in its entirety.

The above-mentioned U.S. Ser. No. 18/635,039 is a Continuation of U.S. Ser. No. 17/353,867, filed on Jun. 22, 2021, now patent number U.S. Pat. No. 11,978,815 (issued on May 7, 2024), which is hereby incorporated by reference in its entirety.

The above-mentioned U.S. Ser. No. 17/353,867 is a Continuation-in-Part (CIP) of U.S. Ser. No. 16/362,665, filed on Mar. 24, 2019, now patent number U.S. Pat. No. 11,081,606 (issued Aug. 3, 2021), which is hereby incorporated by reference in its entirety; which claims priority and benefit from U.S. 62/785,282, filed on Dec. 27, 2018, which is hereby incorporated by reference in its entirety.

The above-mentioned U.S. Ser. No. 17/353,867 is also a Continuation-in-Part (CIP) of PCT international application number PCT/IL2019/051416, having an international filing date of Dec. 26, 2019, which is hereby incorporated by reference in its entirety; which claims priority and benefit (I) from U.S. Ser. No. 16/362,665, filed on Mar. 24, 2019, now patent number U.S. Pat. No. 11,081,606 (issued Aug. 3, 2021), which is hereby incorporated by reference in its entirety, and (II) from U.S. 62/785,282, filed on Dec. 27, 2018, which is hereby incorporated by reference in its entirety.

This patent application is also a Continuation-in-Part (CIP) of U.S. Ser. No. 17/802,335, filed on Aug. 25, 2022, which is hereby incorporated by reference in its entirety.

The above-mentioned U.S. Ser. No. 17/802,335 is a U.S. National Stage of PCT international application number PCT/IL2021/050217, having an international filing ate of Feb. 25, 2021, which is hereby incorporated by reference in its entirety; which claims benefit and priority from U.S. 62/982,536, filed on Feb. 27, 2020, which is hereby incorporated by reference in its entirety.

This patent application is also a Continuation-in-Part (CIP) of U.S. Ser. No. 18/631,106, filed on Apr. 10, 2024, which is hereby incorporated by reference in its entirety.

The above-mentioned U.S. Ser. No. 18/631,106 is a Continuation of PCT international application number PCT/IL2022/051146, having an international filing date of Oct. 30, 2022, which is hereby incorporated by reference in its entirety.

The above-mentioned PCT/IL2022/051146 claims priority and benefit from U.S. 63/273,940, filed on Oct. 31, 2021, which is hereby incorporated by reference in its entirety.

The above-mentioned U.S. Ser. No. 18/631,106 is also a Continuation-in-Part (CIP) of U.S. Ser. No. 18/129,865, filed on Apr. 2, 2023, which is hereby incorporated by reference in its entirety.

The above-mentioned U.S. Ser. No. 18/129,865 is a Continuation of PCT international patent application number PCT/IL2021/051202, having an international filing date of Oct. 7, 2021, which is hereby incorporated by reference in its entirety.

The above-mentioned PCT/IL2021/051202 claims priority and benefit: (i) from U.S. 63/088,535, filed on Oct. 7, 2020, which is hereby incorporated by reference in its entirety; and (ii) from U.S. Ser. No. 17/353,867, filed on Jun. 22, 2021, now patent number U.S. Pat. No. 11,978,815 (issued on May 7, 2024), which is hereby incorporated by reference in its entirety.

The above-mentioned U.S. Ser. No. 18/129,865 is also a Continuation-in-Part (CIP) of U.S. Ser. No. 17/353,867, filed on Jun. 22, 2021, now patent number U.S. Pat. No. 11,978,815 (issued on May 7, 2024), which is hereby incorporated by reference in its entirety.

The above-mentioned U.S. Ser. No. 17/353,867 is a Continuation-in-Part (CIP) of U.S. Ser. No. 16/362,665, filed on Mar. 24, 2019, now patent number U.S. Pat. No. 11,081,606 (issued on Aug. 3, 2021), which is hereby incorporated by reference in its entirety; which claims priority and benefit from U.S. 62/785,282, filed on Dec. 27, 2018, which is hereby incorporated by reference in its entirety.

The above-mentioned U.S. Ser. No. 17/353,867 is also a Continuation-in-Part (CIP) of PCT international application number PCT/IL2019/051416, having an international filing date of Dec. 26, 2019, which is hereby incorporated by reference in its entirety.

The above-mentioned PCT/IL2019/051416 claims priority and benefit: (i) from U.S. Ser. No. 16/362,665, filed on Mar. 24, 2019, now patent number U.S. Pat. No. 11,081,606 (issued on Aug. 3, 2021), which is hereby incorporated by reference in its entirety, and (ii) from U.S. 62/785,282, filed on Dec. 27, 2018, which is hereby incorporated by reference in its entirety.

The above-mentioned U.S. Ser. No. 18/129,865 is also a Continuation-in-Part (CIP) of U.S. Ser. No. 17/802,335, filed on Aug. 25, 2022, which is hereby incorporated by reference in its entirety; which is a National Stage of PCT international application number PCT/IL2021/050217, having an international filing date of Feb. 25, 2021, which is hereby incorporated by reference in its entirety; which claims priority and benefit from U.S. 62/982,536, filed on Feb. 27, 2020, which is hereby incorporated by reference in its entirety.

FIELD

Some embodiments are related to the field of photovoltaic (PV) cells and solar panels.

BACKGROUND

The photovoltaic (PV) effect is the creation of voltage and electric current in a material upon exposure to light. It is a physical and chemical phenomenon.

The PV effect has been used in order to generate electricity from sunlight. For example, PV solar panels absorb sunlight or light energy or photons, and generate current electricity through the photovoltaic effect.

SUMMARY

Some embodiments may include a combined or hybrid photovoltaic (PV) article, or a combined or hybrid PV device, or a combined or hybrid PV module, or a combined or hybrid electricity-generating PV device or PV article; as well as methods and systems for manufacturing such combined or hybrid PV device.

The combined or hybrid PV device may comprise, for example: (i) a first segment, which is a first electricity-generating PV segment that is planar and/or rigid; connected mechanically and/or electrically to (ii) a second, co-located, segment, which is a second electricity-generating PV segment that is flexible and/or non-planar and/or curved and/or angular; wherein the first electricity-generating PV segment and the second electricity-generating PV segment are encapsulated and/or enclosed and/or surrounded together within a single encapsulant, or within a single set of multiple encapsulating materials or encapsulation layers or encapsulation coatings; forming a single electricity-generating PV device, which may be monolithic (e.g., cannot be broken or separated or dis-assembled into smaller PV units; yet also, has sufficient flexibility in at least one region to allow at least that region to bend or to fold or to otherwise modify its spatial structure).

Some embodiments may provide other and/or additional benefits and/or advantages.

DETAILED DESCRIPTION OF SOME DEMONSTRATIVE EMBODIMENTS

Figure 1:
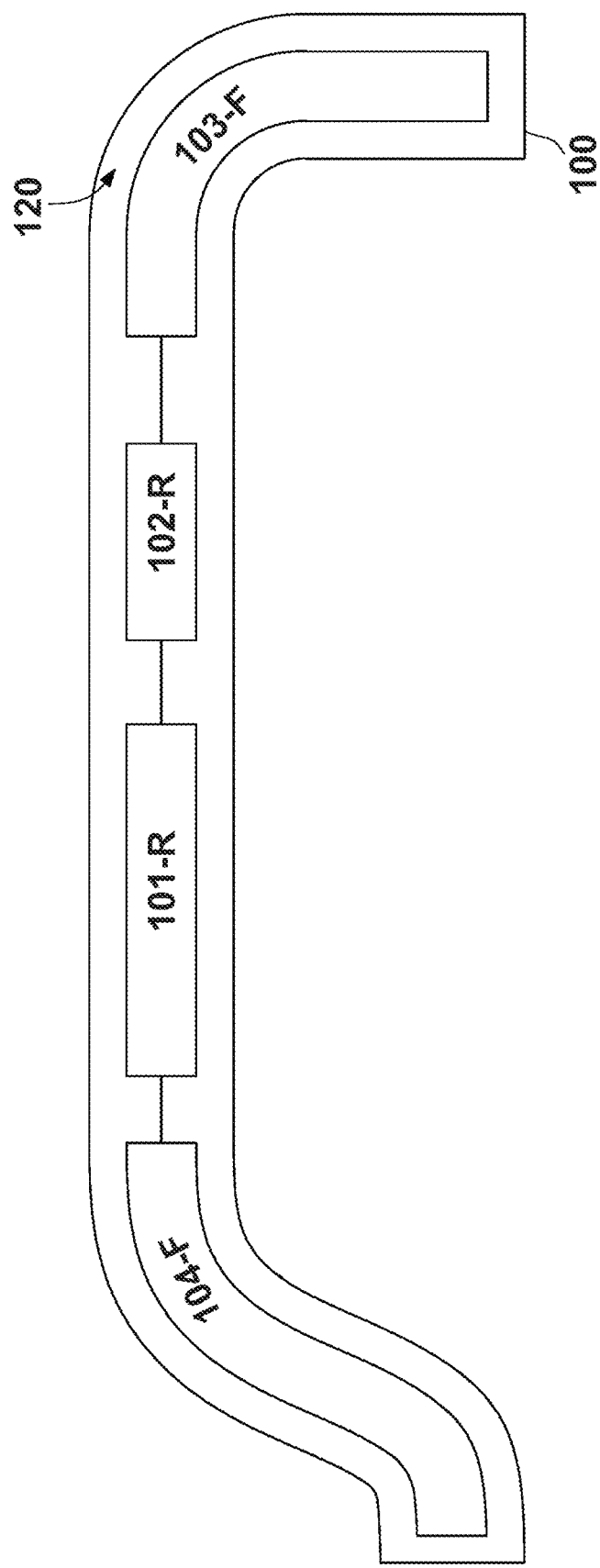
FIG. 1 is a schematic illustration of a photovoltaic (PV) device, in accordance with some demonstrative embodiments.

In accordance with some embodiments, solar modules or photovoltaic (PV) modules, or other surface-based electronic products (e.g., display units) may be divided or categorized according to their degree of flexibility and/or according to their level of flexibility and/or according to their level of elasticity and/or according to their level of rigidity or rigidness and/or according whether they have a planar structure or a non-planar (e.g., curved or angular) structure.

For example, a first electricity-generating PV unit or segment is rigid and planar, such that it has a spatial structure of a plane, without any curves or curvatures, and such that it has a high level of rigidity which does not allow it to be folded or rolled or bent; and such that an attempt to fold or curve such rigid PV unit by applying mechanical force(s) to it would typically cause breaking or damaging of such rigid PV unit.

For example, a second electricity-generating PV unit is flexible and/or non-planar; such that it may change its spatial structure, or may be bent or folded or rolled, or may become curved or partially-curved or non-planar or angular or partially-angular, in response to application of mechanical force(s); without such mechanical force(s) causing it to break or damaging it (e.g., at least while such mechanical force(s) are within a pre-defined range of forces that may be safely applied to the PV unit in order to safely modify its shape or structure or curvature without damaging it).

The Applicants have realized that such rigid and planar PV unit, while not being able to be bent or folded, typically has the highest efficiency in converting light or sunlight into electricity; relative to a curved or a non-planar PV unit, or relative to a flexible or non-rigid PV unit.

The Applicants have realized that it may be beneficial to provide a combined or hybrid PV device or PV article or PV unit; which includes, for example: (i) a first segment, which is a first electricity-generating PV segment that is planar and/or rigid; connected mechanically and/or electrically to a second segment, which is a second electricity-generating PV segment that is flexible and/or non-planar and/or curved and/or angular; wherein the first electricity-generating PV segment and the second electricity-generating PV segment are encapsulated and/or enclosed together within a single encapsulant, or within a single set of multiple encapsulating materials or encapsulation layers or encapsulation coatings; forming a single electricity-generating PV device.

Each solar segment or PV segment may comprise a semiconductor, such as silicon or other suitable substrate or material(s). For example, the underlying components of a PV segment are solar cells or a plurality of PV cells, formed of relatively large semiconductor wafers (e.g., formed of silicon wafers, or other suitable substrate or material), which may be very brittle (e.g., hard, but might break or shatter easily) and thus require one or more protection layer(s).

The flexibility of a PV segment or PV unit, or the capability for such PV unit or PV segment to take a curved form or a non-planar form or an angular form (or a combination of such forms), may depend on: (i) the flexibility of the particular PV cells from which the entire PV module is composed, and (ii) the composition and/or selection and/or structure of coating layers, encapsulating layers, protective layers, electricity conductive layers (or components), and/or or other functional layers that are utilized in forming the PV unit.

Some PV units are based upon rigid silicon wafers, which are very brittle and which have a very low level of flexibility; which are mounted on rigid structures that are protected by at least a glass layer as a top protective layer. Some semi-flexible PV units may be based upon one or more types of PV cells that are protected by a polymer-based top-sheet or top-side sheet, and may have a semi-flexible stack of materials or layers which limit the extent to which the PV unit can be bent (or rolled, or folded, or curved, or bent, or bended), mainly in order to protect the underlying PV cells (which are brittle) from breakage. Some fully-flexible PV modules may be based upon one or more relevant technologies, and may include PV cells that are "sandwiched" between polymeric layers on both sides.

The Applicants have realized that conventional PV devices include, exclusively, a single type of PV cells or a single type of PV segments: for example, a first conventional PV device includes, exclusively, only rigid and non-flexible and planar PV segments, forming together an entire conventional PV device that is rigid and planar in its entirety; or, a second conventional PV device includes, exclusively, only flexible and non-planar PV segments, forming together an entire conventional PV device that is flexible and is curved (and/or angular) and non-planar.

The Applicants have realized that there does not exist, and that there is a need for, a combined or hybrid PV device. Accordingly, some embodiments provide a combined or hybrid PV device, which includes, within one encapsulant, or within one set of the same encapsulants, both a rigid PV segment and a flexible PV segment. Additionally or alternatively, some embodiments provide a combined or hybrid PV device that includes, within one encapsulant, or within one set of the same encapsulants, both a rigid and planar PV segment and a flexible and non-planar PV segment.

The Applicants have realized that the mechanical and/or electrical components (or characteristics) of a rigid and/or planar PV segment or PV unit, may be different from the mechanical and/or electrical components (or characteristics) of a flexible and/or non-planar PV segment or PV unit. The Applicants have realized that it may be beneficial to overcome such possible "mismatch" in the components or characteristics of PV units, in order to enable the production of a single PV device that includes therein both a rigid PV unit and a flexible PV unit, that are interconnected mechanically and/or electrically, and that are all encapsulated within the same encapsulant and/or within the same set of protective layers or protective encapsulants.

The Applicants have realized that conventional PV units have utilized only a single uniform type of PV cells (e.g., either rigid or flexible, but not both); in order to avoid a mismatch in their electrical characteristics (e.g., current and voltage) along the surface of the PV unit; and/or in order to simplify the production of the conventional PV unit via simple matching of current and/or voltage in serial or parallel interconnections. However, this assumes that the entire surface of the PV unit is experiencing the same illumination conditions (e.g., no shades; no reflections; no different lighting angles across the surface of the PV unit), and the Applicants have realized that this assumption may not necessarily hold true, and thus it may be beneficial to make the additional efforts to combine and connect together PV segments of different types (e.g., a rigid planar PV segment, with a flexible curved PV segment, or with a flexible angular PV segment); thereby producing a combined or hybrid PV device which may be installed or mounted or placed or positioned at particular locations or places (e.g., a roof of a house; a horizontal wall; a vertical wall; a slanted wall; a vehicle; a marine vessel; an aircraft; or the like), to accommodate such non-uniform lighting conditions that may exist, and/or to accommodate non-planar locations or items on which the PV device is mounted.

The Applicants have also realized that the electrical characteristics may differ between different types of PV cells, as well as in different lighting conditions; however, the voltage of the electricity that is generated is mainly determined by the type of material from which the PV cell is formed, whereas the electric current is more significantly affected by the actual lighting conditions.

The Applicants have realized that rigid PV segments have been used only in rigid and planar PV units or PV devices; and that flexible PV segments have been used only in flexible and non-planar PV units or PV devices.

The Applicants have also realized that the flexiangbility of flexible PV cells or flexible PV segments, enables to utilize them in the manufacturing of not only a fully-flexibly PV device, but also in the manufacturing of a semi-flexible PV device, and/or in the manufacturing of a PV device that is not necessarily flexible and/or that is not necessarily subject to mechanical forces or bending or rolling or curving or folding; and/or in the manufacturing of a PV device having a non-planar or non-flat structure, or having a curvature, or having one or more curved regions and/or concave regions and/or convex regions and/or angular regions; and flexible PV segments may be used for manufacturing such PV devices, having such non-planar or non-flat structure, instead of using one or more rigid planar PV cells that may fracture and/or break. The Applicants have also realized that the same is also true with regard to PV devices or PV articles which have joints of areas or joints of regions that need to be functionally flexible, but also have other surface areas that remain or stay rigid and are not expected to become curved or angular or non-planar, and/or that are not expected to be subject to folding forces and/or bending forces and/or rolling forces and/or curving forces, and/or are expected to maintain no curvature or a low degree or low level of spatial curvature. The Applicants have realized that the greater the curvature of the PV article, the greater is the degree of flexibility or the level of flexibility of the PV cells that is needed in order to withstand the incorporation of such PV cells into the curved (or angular) non-planar PV article. Therefore, realized the Applicants, flexible PV cells may be suitable for manufacturing PV modules having large curvature or having sharp angles, and rigid PV cells may be less suitable for those purposes.

The Applicants have realized that flexible PV cells often exhibit lower efficiency (in electricity generation) relative to that of rigid PV cells; and that curved PV articles or curved PV devices often encounter different lighting conditions at different areas or regions thereof; and that flexible PV devices may exhibit a smaller time-period of efficient performance relative to rigid planar (or flat) PV devices.

Some embodiments may combine PV cells or PV segments of different types (e.g., a PV segment that is rigid and planar; a PV segment that is rigid and non-planar; a PV segment that is flexible and curved; a PV segment that is flexible and planar), to form a single, unified, electronic surface PV product or PV device or PV article, which is not flat in its entirety, or which is not entirely flat, or which is not entirely planar.

In some embodiments, the combined or hybrid PV device may include multiple PV cells or multiple PV segments, each one of them having a different degree or a different level of flexibility or elasticity or rigidity or rigidness, and all those different PV segments are combined and connected (e.g., mechanically and/or electrically) within the same single PV device, and are all coated by, or encapsulated within, or "sandwiched" by, the same protective layer(s) and/or the same set of multiple protective layers.

Some embodiments may utilize, at a particular location or region of the PV device or the PV article, the particular type of PV cell or PV segment having the highest electricity-generating efficiency (and/or the highest cost-effective level of such efficiency), that can still withstand the curvature requirements (e.g., due to a planned installation or an expected mounting of that region of the PV device, onto or adjacent to a curved location or a non-planar location or object), and that can still withstand the mechanical stress that is expected to occur at such location (e.g., during production, and/or during mounting or installation, and/or during the service life of the PV device).

Some embodiments may thus enable incorporation of several different types of PV cells or PV segments, in the same single unified PV article or PV device. For example, rigid (and planar) PV cells or PV segments, having high electricity-generating efficiency, would be used at flat regions or flat portions or flat locations of the PV article (e.g., locations or regions that are not expected or intended to undergo bending or folding or rolling or curving); whereas, flexible PV cells or flexible PV segments would be used at other locations or regions or areas of the same PV device which require or which have a spatial curvature (e.g., which would cause rigid PV cells to fracture or to break) or which require some degree of mechanical flexibility in those particular regions of portions of the unified PV device.

The PV device is thus divided into areas or locations or regions or portions, each one of them having different electrical and/or mechanical characteristics, taking into account the type of PV cells that can match the intended usage of that particular device-portion or device-region, and/or taking into account the expected lighting conditions that are expected or are estimated with regard to each particular device-portion or device-region.

In such combined or hybrid PV device, for example, a group of PV cells that are expected to produce the same or similar electric currents may be connected to each other in series; whereas, a group of PV cells that are expected to produce the same or similar electric voltages may be connected to each other in parallel.

In some embodiments, "similar" currents or "similar" voltages may be defined or pre-defined, for example, by using numerical threshold value(s) of similarity; for example, value A may be defined as "similar" to value B, if (for example) $0.9A<B<1.1A$, or if value A is within 10 percent (or, within N percent, where N is a pre-defined number) more than value B or less than value B. Other suitable ways may be used to define a level of similarity between values, currents, voltages, illumination conditions, efficiency, or other characteristics or parameters.

Accordingly, in some embodiments, the difference in voltage and/or current between a first PV cell or a first PV segment, and a second PV cell or a second PV segment, may be overcome or mitigated or alleviated, by selecting in advance an electrical connection in parallel or in series. In other embodiments, a mismatch in current and/or voltage may not necessarily be overcome only by selective grouping of PV cells (or PV segments) in parallel or in series, and local Direct Current to Direct Current (DC/DC) converter(s) may be utilized within the combined or hybrid PV device, optionally with maximum power point tracking capabilities, such converters being connected to each group of PV cells in order to enable matching of current and/or voltage, and/or in order to increase the overall production of electricity at the expense of a more complicated or expensive solution or structure.

Some embodiments may be particularly suitable or particularly efficient for utilization in a situation where a PV device or a PV article is needed for being mounted on, or placed at or near, a curved object or curves surface, or a non-planar object or non-planar surface, or a mixed-shape or mixed-curvature object; for example, a curved object, a non-planar object, a vehicle, a car, a marine vessel, an aircraft, a drone, an object having patterned surface(s) and/or curved surface(s), car roof, car hood, car bonnet, carbon fiber and/or glass fiber articles, metal objects, metal car roof, carbon or glass fiber roof (or bonnet or hood or other vehicular part), plastic elements, spoilers, aerodynamic add-ons or extensions, a truck, a bus, a Recreational Vehicle (RV), a ship, a boat, a yacht, and/or other vessels; as well as stationary and/or non-mobile objects, for example, a non-planar roof of a house or a business venue, a non-planar storage facility or storage container, or the like.

In some embodiments, the rigid and/or planar PV segments or PV units, that are utilized in the combined or hybrid PV device, may be formed of crystalline silicon.

In some embodiments, the flexible and/or curved and/or angular and/or non-planar PV segments or PV units, that are utilized in the combined or hybrid PV device, may include one or more PV units that are described in patent publication number US 2020/0212238 A1 and/or in patent publication number WO 2020/136653 A1, both of which are hereby incorporated by reference in their entirety; for example, being a PV unit that is structured, using protrusions or channels or craters that are introduced into the wafer or the substrate, to become shock absorbent and/or more resilient to mechanical forces.

In some embodiments, the combined or hybrid PV article comprises one or more composite material(s), which may include, for example, glass and/or carbon fiber and/or other composite materials. Optionally, flexible and/or stretchable and/or elastic polymer(s) may be included in the composite material(s), to provide elasticity and/or flexibility and/or stretching ability to the combined or hybrid PV article or to selected regions thereof. Such polymer(s) may include, for example, polyester, epoxy, polyolefin, and/or a combination of two or more of these materials and/or other materials.

In some embodiments, a flexible PV segment of the combined or hybrid PV article may comprise PV cells formed of, for example: $CuIn(x)Ga(x-1)Se(y)S(y-1)$, wherein "x" is 0 or 1, wherein "y" is 0 or 1; amorphous silicon; organic solar cells, organic PV cells; perovskite solar cells, perovskite PV cells; $Cs_2SnI_6$ solar cells or PV cells; CdTe solar cells or PV cells; Se solar cells or PV cells; GaAs solar cells or PV cells; InP solar cells or PV cells; solar cells and/or PV cells that are formed of solar-paint material(s) (e.g., as described in patent publication number US 2016/0308155 A1, which is hereby incorporated by reference in its entirety); and/or a combination of two or more of the above.

In some embodiments, the rigid and/or planar PV segments of the combined or hybrid PV device may include, for example: mono-crystalline PV cells; poly-crystalline silicon PV cells; PV cells that include or that are formed of CdTe, InP, GaAs, CIGS, Perovskite, and/or the above-mentioned solar-paint material; and/or a combination of two or more of the above.

In some embodiments, a rigid and/or planar PV cell, and a neighboring or adjacent or inter-connected flexible or semi-flexible PV cell, are both coated with, or are mounted beneath, or are adjacent to, a single unified glass layer, or a set of several glass layers; or, they are sandwiched or embedded within two glass layers, or between two sets of multiple glass layers; and such glass layer(s) may provide mechanical protection to at least some regions of the PV device, while also being transparent to sunlight or light.

In some embodiments, a rigid and/or planar PV cell, and a neighboring or adjacent or inter-connected flexible or semi-flexible PV cell, are both coated with, or are mounted beneath, or are adjacent to, a single unified polycarbonate layer, or a set of several polycarbonate layers; or, they are sandwiched or embedded within two polycarbonate layers, or between two sets of multiple polycarbonate layers; and such polycarbonate layer(s) may provide mechanical protection to at least some regions of the PV device, while also being transparent to sunlight or light.

In some embodiments, optionally, a metal layer or a metallic support layer, or several such layers, may be mounted or connected or placed beneath the rigid PV cell(s) and beneath the nearby flexible PV cell(s); and such metal layer(s) may provide mechanical support to the structure of the PV device; and they need not be transparent to light as they are located beneath the PV cells, or on the side of the PV cell that is not intended to collect light. In some embodiments, such support layer is a unified support layer, that runs beneath or runs under all of the different types of PV cells or PV segments of that PV device; for example, a single unified support layer (e.g., metallic) which runs beneath, and supports, both the rigid PV segments and the co-located flexible PV segments. In some embodiments, such metal layer(s) or support layer(s) are insulated from any conducting poles, so as not to present an electrical hazard and to avoid a short to the electric circuit; and/or, in some embodiments, such metal layer(s) may be formed or structured in a non-planar form, to follow or to trace the spatial structure of the PV segments that are supported, and particularly to follow and to support and to trace beneath any curved or angular or non-planar PV segments; and/or, in some embodiments, such metallic support layer(s) may support only a portion of each PV segment (e.g., supporting only 70% or only 80% or only 90% of the bottom-side area of each PV segment), and not necessarily the entire 100% of the bottom-side area of each PV segment; for example, in order to allow placement of conducting electrodes at edges or sides of each PV segment without such electrodes touching the metallic support layer.

In some embodiments, the combined or hybrid PV device is manufactured using one or more of the following methods: autoclave, hot press, Pressure Sensitive Adhesive (PSA), epoxy, Resin Transfer Molding (RTM), Vacuum Assisted Resin Infusion (VARI), humidity curing, Ultra Violet (UV) curing, a process utilizing one or more adhesives, a coating process, or the like.

In some embodiments, the solar cells or the PV cells of the combined or hybrid PC device, or the various PV segments of the combined or hybrid PV device, are encapsulated within a layer of composite material(s), or within a set of two or more layers of composite material(s). For example, one or more protective layer(s) that are located above the PV cells (e.g., located at the "sunny side", the side that is intended to face the illumination source) are transparent, and may be composed of materials such as, for example, a pre-preg epoxy layer (e.g., a layer of epoxy or resin that is pre-impregnated with fibers), a wet lay-up layer (e.g., of epoxy or resin that is enriched with fiber), a layer of glass fiber(s) or a glass mat, or the like. In some embodiments, one or more layers or protective layers may cover or coat or protect the PV cells from beneath, located at the "non-sunny side" (e.g., the side that is opposite to said "sunny side"); and such bottom-side protective layer(s) may be formed of the same material(s) that are used for the top-side protective layer(s), and/or from other suitable materials as the bottom-side protective layers need not necessarily be transparent to light; for example, layers containing carbon, flax, or other natural or man-made fibers or synthetic fibers. In some embodiments, the combined or hybrid PV article produced may have a lower level of mechanical flexibility, and may be characterized by having multiple areas or regions of different spatial curvature that are produced simultaneously.

In some embodiments, the PV segments (one or more rigid PV segments and nearby, co-located, one or more flexible PV segments) are encapsulated or sandwiched or embedded within one or more protective layers of thermoplastic material(s). For example, protective layer(s) that are located above the PV cells (e.g., at the "sunny side" which is intended to face the sun or the illumination source) are transparent, and may be composed of one or more materials such as, for example, polycarbonate, polymethyl methacrylate, or other transparent materials, or a combination or mixture of two or more such materials. The layer(s) that are located below or beneath or under the PV cells (e.g., not facing the sun, or not facing the illumination source) may optionally be transparent (e.g., to thereby provide a PV device that is bi-facial, and/or that is capable of collecting light from two opposite directions or from to different directions and converting such incoming light to electricity), or may be non-transparent; and may be formed of one or more materials such as, for example, polycarbonate, polymethyl methacrylate, polyurethane, polyethylene, polypropylene, polyamide, Acrylonitrile Butadiene Styrene (ABS), rubber, plastic, polymer, flexible plastic, flexible polymer, rigid plastic, rigid polymer, or other polymeric materials, or a combination or mixture of two or more of such materials.

In some embodiments, the PV device may optionally include a pre-preg or wet lay-up of epoxy and/or resin, and/or glass fibers and/or a glass mat, and/or fibers of a mat, of other materials such as, for example, carbon, flax, or other natural or man-made or artificial or synthetic fibers. In such embodiments, the PV device that is produced, or the relevant PV segments that include such material(s), may have a lower level of flexibility, and may be characterized by having regions or areas or PV segments of different curvature that are produced or manufactured simultaneously or concurrently or within a single unified manufacturing process.

In some embodiments, the PC segments may be encapsulated or pre-encapsulated or coated with, or sandwiched within, one or more soft material(s) such as, for example, Polyolefin Elastomer (POE), Thermoplastic Polyurethane (TPU), Thermoplastic Olefin or Thermoplastic Polyolefin (TPO) or olefinic thermoplastic elastomer, Ethylene-vinyl acetate (EVA), poly (ethylene-vinyl acetate) (PEVA), and/or similar encapsulants. In some embodiments, all, or most, or at least some of the encapsulated or pre-encapsulated PV cells or PV segments (e.g., rigid and/or flexible PV segments), or at least some region of the PV cell matrix, is then further encapsulated or re-encapsulated within a rigid thermosetting or thermoplastic system, as described above. Other parts are re-encapsulated in a flexible thermoplastic system thus creating a flexible area of the article.

Some embodiments may comprise a hybrid PV device or a hybrid PV article; for example, a non flat-surface based PV electronic article, containing therein PV electronic units having different levels of curvature or having different spatial curvature properties or having different curvature characteristics. Some embodiments may comprise a flexible-surface based PV electronic article, wherein different PV units or PV segments that form the PV article exhibit different levels of mechanical flexibility and/or bending ability and/or folding ability and/or rolling ability and/or elasticity and/or stretch-ability.

In some embodiments, the flexibility of the PV electronic units enables the creation of the non-flat surface during manufacturing process. In some embodiments, the different flexibility of the PV units in different areas of the PV article enable flexing or bending or folding or rolling of the article during its operation, at different ratios, and at different areas or regions or portions of the PV article.

In some embodiments, the PV article is a solar module, or a PV device able to convert light or light energy into electricity or electric energy or electric voltage or electric current.

In some embodiments, the PV article is, or comprises, or is mounted on, or is configured to be mounted on, or is configured to be part of, a vehicular body-part; and particularly, the non-flat surface of the PV article is an automotive body-part or a vehicular body-part, or is mountable on a vehicular body-part.

In some embodiments, at least some of the electronic components of the PV article are solar cells or PV cells having different levels of mechanical flexibility. In some embodiments, flexible PV cells or flexible solar cell include, for example, toughened silicon solar cells or toughened substrate solar cells or shock-resistant solar cells or force-resilient solar cells, or PV cells that are manufactured by introducing craters or channels or gaps into a silicon or into a substrate or into a wafer of a PV unit, to provide resilience to mechanical forces and/or to provide shock absorption capabilities and/or to provide shock propagation capabilities and/or to provide enhanced resistance to withstand mechanical forces.

In some embodiments, one or more of the rigid PV cells or the rigid PV segments include, for example, mono-crystalline and/or poly-crystalline silicon solar cells or PV cells.

In some embodiments, the solar cells or the PV cells, or groups of solar cells or groups of PV cells, are connected in series in areas that are expected or intended to receive approximately the same amount and/or properties of incoming radiation and/or incoming illumination, and/or that have or that generate approximately the same expected electric current.

In some embodiments, the solar cells or the PV cells, or groups of solar cells or groups of PV cells, are connected in parallel in areas that are expected or intended to receive different amount and/or different properties of incoming radiation and/or incoming illumination, and/or that have or that generate different levels of electric current.

In some embodiments, the manufacturing process of the hybrid PV device may include one or more of, or may utilize one or more of: autoclave; hot press; lamination to metal, aluminum, glass, fiberglass, carbon fiber, fiber composites, particulate composites, paint, polymers, using PSA, magnet(s), magnetic layer(s), magnetic components, mechanical attachment, thermal adhesive, UV curable adhesive, immersion, and/or other production processes and/or production materials.

Reference is made to FIG. 1, which is a schematic illustration of a hybrid PV device 100, in accordance with some demonstrative embodiments. PV device 100 comprises for example, two rigid and planar PV segments (101-R and 102-R), and two flexible PV segments (103-F and 104-F) which are shown at a curved or non-planar position but may be folded or bent or rolled or otherwise shape-shifted to acquire other shape(s). The four PV segments are interconnected mechanically and/or electrically; and they are all encapsulated within a single unified sealant 120 (or, within a single unified group of multiple sealants or of multiple protective layers). The various PV segments need not be identical to each other; and they may have different shapes, different thickness values, different dimensions, different length values, different width values, different levels of efficiency in generating electricity from light or in converting light into electricity, and/or other properties which may have different values.

Figure 2:
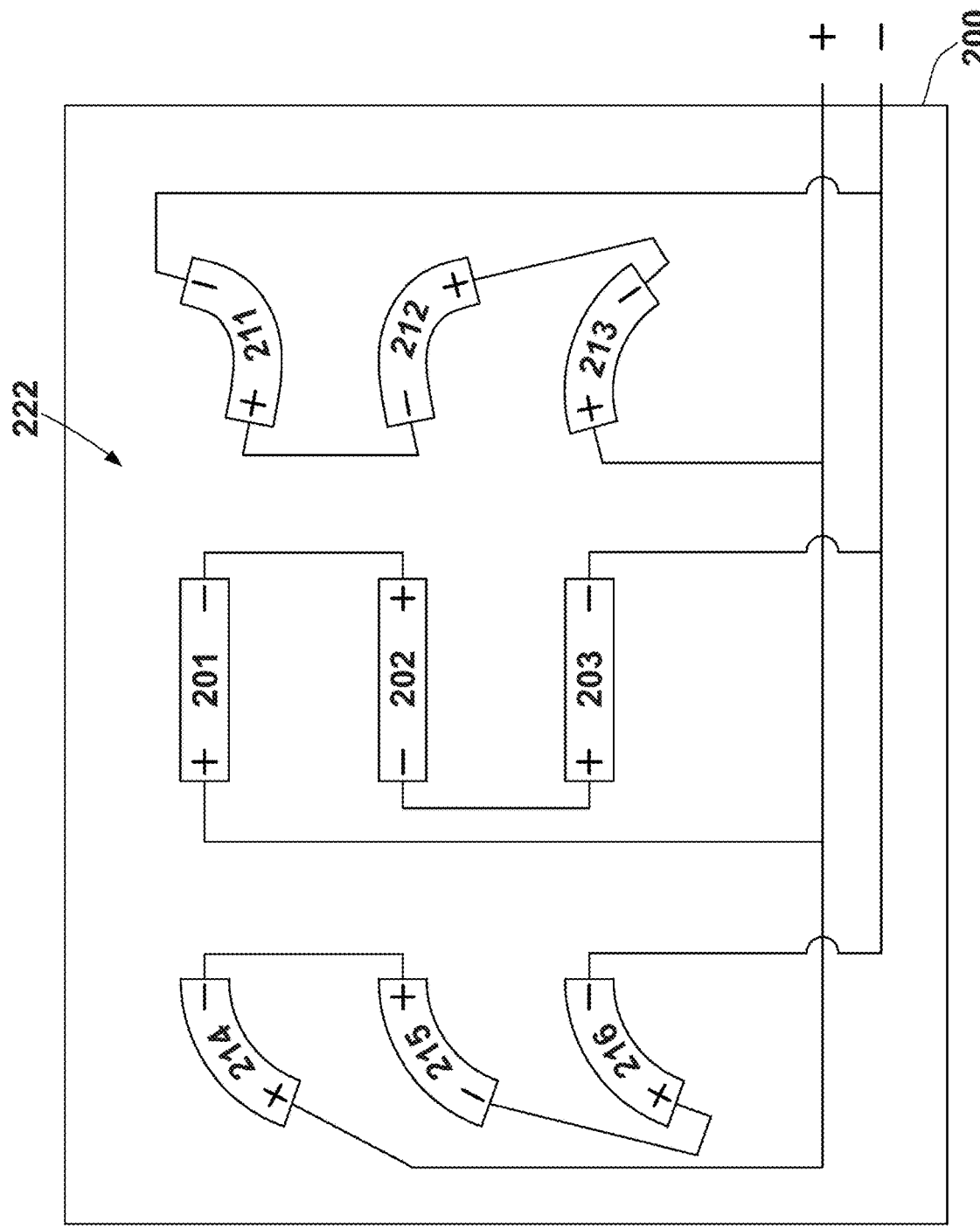
FIG. 2 is a schematic illustration of another PV device, in accordance with some demonstrative embodiments.

Reference is made to FIG. 2, which is a schematic illustration of a hybrid PV device 200, in accordance with some demonstrative embodiments. PV device 200 comprises for example, three rigid PV segments 201-203, and six flexible PV segments 211-216; all of them being electrically and/or mechanically inter-connected; and all of them being encapsulated within a single unified sealant 120 (or, within a single unified group of multiple sealants or of multiple protective layers).

For demonstrative purposes, some portions of the discussion herein may relate to "silicon" as a possible semiconductor or substrate or material from which the PV segment(s) or the PV cell(s) may be formed; however, this is only a non-limiting example, and some embodiments may include or may utilize, or may be formed of, other suitable substrate(s) and/or material(s) and/or semiconductor(s), instead of silicon and/or in addition to silicon.

In some embodiments, a hybrid photovoltaic (PV) device comprises: (a) a rigid PV segment, comprising a first set of one or more PV cells that convert incoming light to electricity, wherein the rigid PV segment is non-foldable and non-bendable; (b) a co-located flexible PV segment, comprising a second set of one or more PV cells that convert incoming light to electricity, wherein the flexible PV segment is foldable or bendable, wherein folding or bending of the flexible PV segment does not damage at all (or, does not significantly damage, or, essentially does not damage) the flexible PV segment (and/or its operational functionality, and/or its operational properties, and/or its operational efficiency in converting light into electricity); (c) one or more electric connectors, that connect between (i) electric current or electric voltage that are generated by the rigid PV segment, and (ii) electric current or electric voltage that are generated by the flexible PV segment; (d) a unified encapsulation layer, which encapsulates together both the rigid PV segment and the co-located flexible PV segment. The rigid PV segment, the co-located flexible PV segment, the one or more electric connectors, and the unified encapsulation layer, form together said hybrid PV device which is a single stand-alone PV device that converts incoming light to electricity and that has at least one rigid region corresponding to said rigid PV segment and at least one flexible region corresponding to said co-located flexible PV segment.

In some embodiments, the rigid PV segment is a rigid planar PV segment; the flexible PV segment is a flexible non-planar (e.g., curved and/or angular) PV segment; the rigid planar PV segment and the flexible non-planar PV segment are co-located next to each other and are electrically connected to each other, and are encapsulated by the same unified encapsulation layer.

In some embodiments, the rigid PV segment is a rigid planar PV segment; the flexible PV segment is a flexible planar PV segment; the rigid planar PV segment and the flexible planar PV segment are co-located next to each other and are electrically connected to each other, and are encapsulated by the same unified encapsulation layer.

In some embodiments, the rigid PV segment is a rigid non-planar (e.g., curved and/or angular) PV segment; the flexible PV segment is a flexible non-planar (e.g., curved and/or angular) PV segment; the rigid non-planar PV segment and the flexible non-planar PV segment are co-located next to each other and are electrically connected to each other, and are encapsulated by the same unified encapsulation layer.

In some embodiments, the rigid PV segment is a rigid non-planar (e.g., curved and/or angular) PV segment; the flexible PV segment is a flexible planar PV segment; the rigid non-planar PV segment and the flexible planar PV segment are co-located next to each other and are electrically connected to each other, and are encapsulated by the same unified encapsulation layer.

In some embodiments, the rigid PV segment is a pre-encapsulated rigid PV segment, that is pre-encapsulated by itself within a first particular encapsulant which is functionally suitable for rigid PV segments; the rigid PV segment is a pre-encapsulated rigid PV segment, that is pre-encapsulated by itself within a second particular encapsulant which is functionally suitable for flexible PV segments and which is different from the first particular encapsulant of the rigid PV segment; the pre-encapsulated rigid PV segment and the co-located pre-encapsulated flexible PV segment are both further encapsulated by said unified encapsulation layer of the PV hybrid device.

In some embodiments, said hybrid PV device comprises said rigid PV segment at a first particular device-region that is intended to be maintained non-folded and not-bended; and said hybrid PV device comprises said flexible PV segment at a second particular device-region that is intended to be folded or bended.

In some embodiments, the rigid PV segment is configured to generate, on average, a first value $I1$ of electric current; the flexible PV segment is configured to generate, on average, a second value $I2$ of electric current; a difference between $I1$ and $I2$ is less than 10 percent (or, less than 5% or 15% or 20% or 25%) of $I1$; wherein the rigid PV segment and the flexible PV segment are electrically connected to each other in series due to said difference between $I1$ and $I2$ (or, due to the ratio between said different and I1; or, due to the ration between said difference and I2).

In some embodiments, the rigid PV segment is configured to generate, on average, a first value I1 of electric current; the flexible PV segment is configured to generate, on average, a second value I2 of electric current; a difference between I1 and I2 is at least 10 percent (or, is at least 5% or 15% or 20% or 25%) of I1; the rigid PV segment and the flexible PV segment are electrically connected to each other in parallel due to said difference between I1 and I2 (or, due to the ratio between said different and I1; or, due to the ration between said difference and I2).

In some embodiments, the hybrid PV device comprises a plurality of co-located PV segments which comprise: a plurality of rigid PV segments and a plurality of flexible PV segments, that are all co-located; each one of the rigid PV segments is electrically connected, directly or indirectly, to at least one of the flexible PV segments; each one of the flexible PV segments is electrically connected, directly or indirectly, to at least one of the rigid PV segments.

In some embodiments, said hybrid PV device comprises a first particular rigid PV segment that is co-located adjacent to a first particular flexible PV segment; the first particular rigid PV segment is configured to generate, on average, a first value I1 of electric current; the first particular flexible PV segment is configured to generate, on average, a second value I2 of electric current; wherein a difference between I1 and I2 is less than 10 percent of I1; the first particular rigid PV segment and the first particular flexible PV segment are electrically connected to each other in series due to said difference between I1 and I2; said hybrid PV device comprises a second particular rigid PV segment that is co-located adjacent to a second particular flexible PV segment; the second particular rigid PV segment is configured to generate, on average, a third value I3 of electric current; the second particular flexible PV segment is configured to generate, on average, a fourth value I4 of electric current; a difference between I3 and I4 is less than 10 percent of I3; the second particular rigid PV segment and the second particular flexible PV segment are electrically connected to each other in series due to said difference between I3 and I4.

In some embodiments, the hybrid PV device comprises a plurality of co-located PV segments which comprise: a plurality of rigid PV segments and a plurality of flexible PV segments, that are all co-located; a pair of two co-located PV segments, that generate respectively a first value of average electric current I1 and a second value of average electric current I2, are electrically connected to each other in series if a difference between I1 and I2 is less than N percent of I1, and are electrically connected to each other in parallel if the difference between I1 and I2 is at least N percent of I1; wherein N is a pre-defined threshold value between 0 and 25.

In some embodiments, at least one of the PV segments comprises: a silicon wafer, having a plurality of craters that penetrate into the silicon wafer and do not reach a bottom side of the silicon wafer; wherein the plurality of craters assist in mechanical forces absorption and provide resilience to mechanical forces.

In some embodiments, the rigid PV segment is configured to generate, on average, a first value I1 of electric current; the co-located flexible PV segment is configured to generate, on average, a second value I2 of electric current; a difference between I1 and I2 is at least 10 percent of I1; the rigid PV segment and the co-located flexible PV segment are electrically connected to each other indirectly via a Direct Current to Direct Current (DC/DC) converter unit that converts a level of electric current generated by the rigid PV segment to a level of electric current generated by the flexible PV segment.

In some embodiments, the rigid PV segment is configured to generate, on average, a first value I1 of electric current; the co-located flexible PV segment is configured to generate, on average, a second value I2 of electric current; a difference between I1 and I2 is at least 10 percent of I1; the rigid PV segment and the co-located flexible PV segment are electrically connected to each other indirectly via a Direct Current to Direct Current (DC/DC) converter unit that converts a level of electric current generated by the flexible PV segment to a level of electric current generated by the rigid PV segment.

In some embodiments, the unified encapsulation layer, which encapsulates together both the rigid PV segment and the co-located flexible PV segment, comprises at least: (A) a top-side encapsulating layer, which is transparent and enables passage of light therethrough, and is located at a first side of the PV device that is intended to receive incoming illumination for electricity generation; and (B) a bottom-side encapsulating layer, which is non-transparent and blocks passage of light therethrough, and is located at a second side of the PV device that is not intended to receive incoming illumination for electricity generation.

In some embodiments, the unified encapsulation layer, which encapsulates together both the rigid PV segment and the co-located flexible PV segment, comprises at least: (A) a top-side encapsulating layer, which is transparent and enables passage of light therethrough, and is located at a first side of the PV device that is intended to receive incoming illumination for electricity generation; and (B) a bottom-side encapsulating layer, which is transparent and enables passage of light therethrough, and is located at a second side of the PV device that is also intended to receive incoming illumination for electricity generation; the hybrid PV device is a bi-facial PV device or a dual-direction PV device that is capable of receiving incoming light at two opposite sides of the hybrid PV device and converts said incoming light to electricity.

In some embodiments, the bottom-side encapsulating layer comprises a metal layer that provides structural and mechanical support to said hybrid PV device; said metal layer is located within said unified encapsulation layer, which encapsulates together both the rigid PV segment and the co-located flexible PV segment.

In some embodiments, the rigid PV segment is located at a first particular region of the hybrid PV device that is expected to receive a first level of light energy; the flexible PV segment is located at a second particular region of the hybrid PV device that is expected to receive a second level of light energy that is smaller than said first level of light energy.

In some embodiments, the unified encapsulation layer, which encapsulates together both the rigid PV segment and the co-located flexible PV segment, comprises: (A) a first encapsulation layer, which is a transparent top-side unified encapsulation layer that covers a top-side of the rigid PV segment and a top-side of the flexible PV segment; and (B) a second encapsulation layer, which is a non-transparent bottom-side unified encapsulation layer that covers a bottom-side of the rigid PV segment and a bottom-side of the flexible PV segment.

In some embodiments, the unified encapsulation layer, which encapsulates together both the rigid PV segment and the co-located flexible PV segment, comprises: (A) a first encapsulation layer, which is a transparent top-side unified encapsulation layer that covers a top-side of the rigid PV segment and a top-side of the flexible PV segment; and (B) a second encapsulation layer, which is a transparent bottom-side unified encapsulation layer that covers a bottom-side of the rigid PV segment and a bottom-side of the flexible PV segment; wherein the hybrid PV device is a bi-facial PV device or a dual-direction PV device, that is capable of receiving incoming light at two opposite sides of the hybrid PV device and converts said incoming light to electricity.

In some embodiments, the top-side unified encapsulation layer is formed of one or more materials selected from: polycarbonate, polymethyl methacrylate; wherein the bottom-side unified encapsulation layer is formed of one or more materials selected from: polycarbonate, polymethyl methacrylate, polyurethane, polyethylene, polypropylene, polyamide, Acrylonitrile Butadiene Styrene (ABS), rubber, plastic, polymer, flexible plastic, flexible polymer, rigid plastic, rigid polymer.

In some embodiments, the rigid PV segment is pre-encapsulated within a first pre-encapsulation material, separately from the co-located flexible PV segment; the flexible PV segment is pre-encapsulated within a second pre-encapsulation material, separately from the co-located rigid PV segment; wherein the first pre-encapsulation material is a material selected from: Polyolefin Elastomer (POE), Thermoplastic Polyurethane (TPU), Thermoplastic Olefin or Thermoplastic Polyolefin (TPO) or olefinic thermoplastic elastomer, Ethylene-vinyl acetate (EVA), poly (ethylene-vinyl acetate) (PEVA); wherein the second pre-encapsulation material is a material selected from: Polyolefin Elastomer (POE), Thermoplastic Polyurethane (TPU), Thermoplastic Olefin or Thermoplastic Polyolefin (TPO) or olefinic thermoplastic elastomer, Ethylene-vinyl acetate (EVA), poly (ethylene-vinyl acetate) (PEVA).

In some embodiments, the hybrid PV device comprises a plurality of co-located PV segments which include at least one rigid PV segment and at least one flexible PV segment; wherein at least a first PV segment of said plurality of co-located PV segments is electrically connected in series to a second PV segment of said plurality of PV segments; wherein at least a third PV segment of said plurality of co-located PV segments is electrically connected in parallel to a fourth PV segment of said plurality of PV segments.

In some embodiments, the hybrid PV device comprises a plurality of co-located PV segments which include at least one rigid PV segment and at least one flexible PV segment; at least a first rigid PV segment of said plurality of co-located PV segments is electrically connected in series to a second flexible PV segment of said plurality of PV segments; at least a third rigid PV segment of said plurality of co-located PV segments is electrically connected in parallel to a fourth flexible PV segment of said plurality of PV segments.

For demonstrative purposes, some portions of the discussion may relate to a particular numerical value (e.g., "10 percent"); however, this is only a non-limiting example, and such particular numerical value may be replaced with another particular numerical value (e.g., "N") that is pre-defined and/or hard-coded and/or modifiable (depending on the particular implementation), and/or that is configured to accommodate a particular spatial structure and/or a particular operational functionality.

In some embodiments a "PV segment" may include a single, discrete, photovoltaic cell. In other embodiments, a "PV segment" may include, or may be formed of, a set or group or collection of multiple photovoltaic cells (or micro PV cells, or nano PV cells) which may be electrically and/or mechanically inter-connected.

In some embodiments, the hybrid PV device is a vehicular component that generates electricity for a vehicle. In some embodiments, the hybrid PV device is a marine vessel component that generates electricity for a marine vessel. In some embodiments, the hybrid PV device is an aircraft component that generates electricity for an aircraft. In some embodiments, the hybrid PV device is a rooftop PV solar panel that generates electricity for a venue or a home or an office or a non-mobile structure or a mobile structure.

The term "gap" as used herein may include, for example, a cavity or tunnel or crater, or groove or elongated groove, or recessed cavities among islands or among island-like protrusions, or basins or elongated basins, or other type of spatial separation or recess or groove or pocket or crater between objects or walls; without necessarily causing such objects to be entirely discrete or separate from each other. For example, a "gap" may be a crater or a cavity between two neighboring micro PV cells, which may still be inter-connected to each other mechanically and/or electrically. The terms "gap" and "crater", as used herein, may be interchangeable. The term "crater" as used herein, may include any suitable pocket or recess, which may not necessarily be rounded or circular; and may include a basin, an elongated basin, an elongated pocket, an elongated recess, a crater or pocket or recess that is shaped as an upside-down trapezoidal prism or as an upside-down elongated trapezoidal prism (e.g., upside-down because its larger panel is facing upwardly, and its smaller panel is facing downwardly), an upside-down prism or polyhedron having a side-panel that is generally V-shaped or U-shaped or triangular, an upside-down elongated pyramid, a series or a set or a batch of the above-mentioned craters or recesses or pockets or basins, or the like; and such crater or groove or pocket or basin may have flat surfaces, or planar surfaces, or non-planar surfaces, or curved surfaces, or irregular surfaces, or slanted surfaces, or a combination of two or more such (or other) types of surfaces and/or side-walls.

The present invention includes methods, devices and materials for producing toughened semiconductor substrates. Semiconductor substrates and semiconductor devices produced from such substrates may exhibit toughened physical characteristics making them more suitable for use in mechanically challenging or stressful applications and environment. Semiconductor substrates and semiconductor devices produced from such substrates may exhibit toughened thermal characteristics, making them more suitable for use in environmentally challenging applications. Semiconductor substrates and semiconductor devices produced from such substrates may exhibit sufficiently toughened characteristics to permit packaging in non-rigid and light weight encapsulant(s). Semiconductor substrates and semiconductor devices produced from such substrates may exhibit sufficient flexibility on a scale suitable to permit for rolling up during shipment and/or for non-destructive deformation during deployment over uneven surfaces.

Embodiments of the present invention may include a toughened semiconductor substrate comprising a substrate body composed of semiconductor material and having top, bottom and side surfaces. The semiconductor body may have at least one intentionally placed gap therein, wherein the intentionally placed gap may be placed by separating segments of the body, either from the top, the bottom or both (e.g. cracking, breaking, etc.), or by removing material from the body, either from the top, the bottom or both (e.g., sawing, etching, cutting, laser cutting, dicing, milling, etc.).

An intentionally placed gap according to embodiments of the invention may be is at least 0.01 mm deep. An intentionally placed gap according to embodiments of the invention may have a varying depth and/or a varying width. Said gap may act as a crack, micro-crack, and/or nano-crack propagation inhibitor.

According to embodiments, at least some semiconductor body gaps may include a gap filler within said at least one intentionally placed gap. The gap filler may be at least partially composed of a material possessing mechanical force or shock absorption, compressibility and/or stretchability and/or flexibility and/or toughening properties. Accordingly, some gap filler material may also be referred to as toughening agents. The gap filler may be at least partially composed of a material possessing thermal absorption and/or thermal dissipation properties. The gap filler may be at least partially composed of a material possessing electrically insulative properties. According to some embodiments, a gap filler may be reactively grown within a respective gap, while according to other embodiments, a gap filler may be deposited within a respective gap. A gap filler may form a coating over sidewalls of a respective gap. A gap filler may form a coating over shoulders of sidewalls of a respective gap and may form a continuous layer at the level of said shoulders.

Gap filler according to some embodiment may be composed of at least one material selected from the group consisting of: (a) a polymer; (b) a resin, (c) amorphous silicon; (d) glass; (e) a metal; (f) carbon; (g) oxygen; (h) a monomer; (i) a second semiconductor; (j) an oligomer; (k) a reactive system (e.g. monomer and photo-initiator); (l) EVA; (m) PVDF; (n) Silicone; and (o) a combination of 2 or more of the above. Gap filler may be homogeneous, or may be a heterogeneous system comprised of at least one matrix material (e.g. a polymer) and at least one additive (e.g. discrete domains of a second, softer polymer)

According to embodiments of the present invention, a gap filler may be reactively produced inside of a respective gap. According to a first example, a reactive chemical such as oxygen or ammonia may be introduced during laser cutting or chemical etching of the gap, and a reaction between the reactive chemical and material of the gap sidewalls may form a coating on the sidewalls. The coating may be of varying thickness, and in some cases may expand to push the sidewalls apart. According to other examples, a reactive mixture of chemicals may be introduced into an already placed/produced gap, and the reactive mixture may be allowed to react within the gap, thereby filling the gap with a product of the reaction, which in some cases may physically push the gap sidewalls apart.

According to further embodiments, a gap filler may include a set of materials deposited as discrete layers within or across said gap. Different layers of the deposited discrete layers may have different properties and serve different toughening functions in accordance with the present invention.

Gap filler material may include a single elastomer, or a mixture or combination of two or more elastomers, or Polymer/oligomer/monomer systems for mechanical toughening or for mechanical resilience to forces or for absorbing/dissipating mechanical shocks and forces; EVA, HIPS (high-impact polystyrene), thermoplastic elastomers (TPEs), block copolymers of polystyrene-polybutadiene and/or polystyrene-polyisoprene (diblock, triblock, multiblock and random copolymers), polybutadiene neoprene, EPDM and other rubbers/elastomers and flexible materials Gap filler material for heat and electrical conductivity may include or contain carbon fibers, metallic powders, nano-particles, nano-fibers, filings and/or fibers, including but not limited to iron, copper, silver, aluminum and/or mixtures and/or alloys of the above distributed in a polymeric, ceramic or other matrix as well as conductive polymers, CNTs, Graphene.

Gap filler which provide reactive mixtures that swell upon reaction include such mixtures as a poly-isocyanate and a polyol with or without the presence of water to produce a foamed polyurethane. Alternative blowing agents such as azodicarbonamide may also be incorporated in order to create foam resulting in expansion of the material within the gaps and an increase in volume that will increase the width of the gaps.

According to embodiments, at least part of the gap filler material may be an anisotropic material. According to an exemplary embodiment, anisotropic particles of fibers may be affixed in a specific direction relative to the top or bottom surface of the body matrix as well as conductive polymers, CNTs, or Graphene, suspended within a binding material such as a polymer. Anisotropic particles, such as microfibers may be aligned, in one direction or another relative to a top or bottom surface or a different specific plane in the substrate, prior to curing of the filler material by using a magnetic or an electric field. Such a mixture may serve to toughen the substrate physically and thermally. Particles, isotropic or anisotropic in nature, may be present either below or above the percolation threshold.

Gap filler material which is anisotropic can lend anisotropic characteristics to the semiconductor substrate/wafer. The filler material may contain anisotropic particles (e.g. microfibers) that me be aligned or oriented using an external force field, such as a magnetic or electrical field. If these anisotropic particles are embedded in a filler matrix which can be "set" (such as a polymer, monomer or oligomer that can be crosslinked), these properties will remain with a permanent preferred orientation even after turning off the external aligning force field.

According to embodiments, the semiconductor body may be composed of at least one semiconductor material selected from the group consisting of: silicon, silicon dioxide, aluminum oxide, sapphire, germanium, gallium arsenide (GaAs), CdTe, organic/inorganic perovskite based materials, CIGS (CuGaInS/Se) and indium phosphide (InP). The semiconductor body may be configured to provide a semiconductor device selected from the group consisting of: a Photo Voltaic Cell, a Light Emitting Diode, a Transistor, a Power Transistor, an Integrated Circuit, a Very Large Scale Integration, and a Microelectromechanical systems (MEMS).

According to embodiments of the present invention, the intentionally placed gap may be produced by removing material from the substrate body, either physically, chemically, with a laser or otherwise. The intentionally placed gap may extend across at least the top surface of the substrate body in a single line or in a pattern composed of an array of lines or other shapes. The intentionally placed gap may actually extend across each of the top surface and the bottom surface of the substrate body, thereby forming separate and different gap patterns both on the top surface and on the bottom surface of the substrate. The singulating pattern or map on the top of the wafer may or may not coincide with the singulating pattern/map on the bottom of the wafer. Gap filler may be introduced into some or all of the gaps, on either side. In the case of singulating from both sides a continuous layer of the semiconductor substrate or wafer, some material may remain through a middle layer of the wafer (not necessarily at the location of half the thickness). According to further embodiments, gap patterns on different sides of the substrate may be filled with different gap filler material. While according to even further embodiments, some or all of a gap pattern on either or both surfaces may be left empty.

The material used to fill the gaps on the bottom of the wafer may be the same material used to fill the gaps on the top of the substrate/wafer, or may be a different material. The material introduced into a gap may partially fill the gap vertically (i.e. fill the bottom of the gap), may fill the gap completely (i.e. flush with the top surface adjacent to the gap), or may overflow and partially or fully cover the top surface adjacent to the gap.

According to embodiments of the present invention, the intentionally placed gap may be produced by removing material from said substrate body all the way completely through the semiconductor body from top surface to bottom surface. The intentionally placed gap, completely passing from top to bottom surface, may extend across the top or bottom surface of said substrate body in a single line or in a pattern composed of an array of lines or other shapes. According to such embodiment, the semiconductor substrate may be completely singulated or split into pieces. According to such fully singulated embodiments, the gap filler material and/or an external films placed over the top surface, over the bottom surface or over both surfaces may serve to maintain the substrate's physical integrity. According to further embodiments, one or more electrical conductors connecting terminals on the singulated substrate pieces to one another may serve to maintain an electrical functionality of the semiconductor substrate.

Embodiments of the present invention may include photovoltaic (PV) cells, arrays of PV cells and methods of producing same. Further embodiments of the present invention may include PV cells and arrays of PV cells with enhanced toughness and/or durability and/or flexibility, and methods of producing same. According to embodiments of the present invention, a PV cell with enhanced toughness and/or durability and/or flexibility may be produced by separating, partially or completely, segments of material within a semiconductor substrate or wafer with which the PV cell is produced, before or after producing the PV cell from the semiconductor substrate and introducing a toughening agent or material, such as a flexible polymer, resin or other flexible impurity, between the separated wafer or substrate segments (the terms "wafer" and "substrate" are used interchangeably herein or above). The toughening material may be a composite material, deposited as a single layer or in multiple layers within the gaps. According to multi-layer gap filler embodiments, different layers may exhibit different properties and may perform different functions within the enhanced wafer. Some gap filler materials may provide enhanced heat conduction functionality, for example, by including and/or introducing heat conduction additives into the wafer gaps. Any of the gap filler materials previously mentioned is applicable to the PV cell embodiment. Any substrate body material previously mentioned is applicable to the PV cell embodiment.

According to some embodiments, material of a wafer or substrate (terms used interchangeably) may be separate by means of fracturing, where little to no material is removed or otherwise lost from the wafer. According to other embodiments, segments of a PV cell wafer may be separated by cutting, scribing, etching, dicing and/or any other method known today or to be devised in the future, where some of the wafer material is removed. Removal of wafer material may be complete, from a top surface through to a bottom surface of the wafer, or it may be partial, leaving some wafer material behind at the top or bottom of the wafer. Separation of wafer segments, complete or partial, with or without material removal, may be performed from one end of the wafer to the other end, and/or may be performed multiple times in order to form a pattern of separations. According to further embodiments, a separation pattern may be selected to correspond to a specific orientation with respect to a crystal lattice of the wafer being separated.

According to embodiments of the present invention, irrespective of whether substrate or wafer segment gaps in between wafer segments of a PV cell wafer are complete or partial, with or without material removal, a flexible material may be deposited in the gaps. Deposition may optionally include melting, physical spreading, vapor deposition, solvent assisted deposition, chemical bath deposition (CBD), printing, or other suitable method(s) for depositing material onto a semiconductor wafer. Deposition of the material in the gap may be conducted simultaneously with another process in which the filler material also plays a role; for example, a filler material may also act as an adhesive to a top sheet or layer laminated to the semiconductor wafer. For example, some embodiments may use EVA as filler material which simultaneously acts as an adhesive layer to a topsheet of ETFE. In this example, EVA may be incorporated in film form, which at given temperature and pressure liquifies, penetrates the gaps, and simultaneously forms an encapsulating film covering the semiconductor wafer and also functioning as an adhesive to the top sheet above. The gap filing material may be composed of a flexible (compressible and stretchable) polymer as previously elaborated. The gap filing material may exhibit good mechanical shock absorption and/or dissipation characteristics. In some embodiments, the gap filling material may be deposited as part of a top or bottom lamination process of the respective PV cell wafer.

According to embodiments of the present invention, a PV cell may be mechanically toughened by segmenting its semiconductor body, composed of semiconductor substrate/wafer, into micro PV cells. The micro PV cells may be formed by segmenting the PV cells body completely in a repeating pattern which forms the micro PV cells. The repeating pattern may be composed of one or more sets of cutting/scribing lines, that form discrete functional areas. Each of the micro PV cells may be electrically connected to other micro PV cells, forming an array of micro PV cells; the collection or array of micro PV cells, working together, may perform substantially the same function as the original (non-segmented) PV cell. Deposition of the gap filler material between sidewalls of the micro PV cell may produce a toughened PV cell with similar electrical characteristics not substantially different from those of the original PV cell prior to material separation, but having considerably better toughness characteristics and flexibility characteristics when compared to the original PV cell. The addition of the toughening material may increase, decrease or have no effect on performance of the original PV cell.

According to embodiments of the present invention, there may be provided one or more micro PV cells with dimensions (e.g. lengths, widths and thicknesses) in the millimeter range. The one or more micro PV cells may be provided with a width ranging between a fraction of a millimeter and several centimeters. A top and bottom surface of a micro PV cells may be provided in various shapes including: triangle, circle, square, rectangle, hexagon and any otherwise suitable polygon. According to embodiments of the present invention, a micro PV cell may be provided with dimensions and geometry (i.e. length, shape, width and angles) selected to allow a maximum bending moment of at least 500% or at least 600% that of the semiconductor substrate before toughening.

Embodiments of the present invention may include various PV array applications which are: (1) weight sensitive, (2) involve "high" or repetitive mechanical loading, and/or (3) may require the use of irregularly shaped surfaces with contours as the mechanical support for the PV array. According to some embodiments, the micro PV cells may be laminated and used as a sail. According to further embodiments, the array may be affixed to the side of a building or temporary structure (e.g. tent). The array may be placed on a walkway or roadway. According to some embodiments, the micro PV cells may be spread at a low density across a wide area of transparent material, such as glass or plexiglass to provide a relatively transparent building or car envelope which also produces electricity. According to further embodiments, arrays of micro PV cells may be orientated in a vertical direction and placed behind structured prisms, pyramid arrays or lenticular lenses to provide electricity from sunshine arriving from above and presenting/projecting a billboard image to observers passing by below.

According to further embodiments, at least one sidewall or side-surface of a micro PV cell according to the embodiments may be produced with a non-right, sloped angle relative to the active surface of the micro PV cell. A sidewall or side-surface of a micro PV cell according to embodiments of the present invention may include one or more coatings of material different from the material of the rest of the cell. According to embodiments, the coating may be part of a passivation layer on the sidewall. According to further embodiments, the sidewall coating may be part of an electrical insulation layer on the sidewall. According to yet further embodiments, the coating layer(s) may have additional functionalities and may be part of any another type of layer, such as for example an anti-reflection layer, etc. According to some embodiments, the coating layer(s) may be formed in-situ, for example during dicing or cutting of the sidewall. The coating may be intentionally deposited or may be otherwise formed, for example from a reaction which occurs during cutting (e.g. lase cutting) of the sidewalls in the presence of reactive gases. The presence of reactive gasses or other gap filler agents/materials intended to infuse and react within or around the gap during laser cutting may be intentional according to some embodiments.

Micro PV cells according to embodiments of the present invention may be arranged into interconnected arrays of micro PV cells. Arrays according to embodiments of the presentation may be one, two or three dimensional. According to some one and two-dimensional embodiments of the present invention, adjacent micro PV cells within an array of micro PV cells may be spaced at some distance apart from one another, for example between 0.01 and 2.0 millimeters apart. Space in between sidewalls of adjacent cells may be left empty or may be filled with a gap filler material, which material may be a flexible and/or a compressible material. The gap filler material may have additional properties and may perform additional functions, such as for example providing electrical insulation and/or providing mechanical shock protection to the micro PV cells. According to further embodiments, the gap filler material filling the gaps between adjacent micro PV cells may include an additive to trigger passivation of exposed silicon sidewalls.

Adjacent micro PV cells may be electrically connected to one another via flexible electrical conductors, which may carry both positive and negative charge from the cells, either in parallel or in series configurations. Adjacent micro PV cells may share at least one common electrically conductive connector, such as for example a positive terminal. Bottom surfaces of each of two or more adjacent micro PV cells, such as for example the respective cell's respective P-type semiconductor regions, may connect to the same electrical connector. According to further embodiments, a shared electrical conductor may be integral or may otherwise include a P-type semiconductor layer with which each of two adjacent cells may form a separate PN junction.

Large numbers of micro PV cells forming an array may be interconnected by a network of positive and negative conductors. Some arrays of micro PV cells according to embodiments of the present invention may include hundreds, thousands and even millions or billions of micro PV cells arranged along a common surface in either one or two dimensions for example when fabricated on a roll of hundreds to thousands of meters length. Some embodiments may include micro PV cells arranged in three dimensional arrays, with multiple layers of two-dimensional arrays placed or stacked on top of each other, where gaps between micro PV cells in the upper layers of the 3D array may allow for light to pass through and onto PV cells in the lower regions. This 3D array configuration may be referred to as stacked arrays.

According to further embodiments, different groups of micro PV cells within an array of micro PV cells may be interconnected according to different arrangements, wherein some groups of cells may be interconnected to adjacent cells in parallel while other groups may be interconnected to adjacent cells in series. According to further embodiments, a micro PV cell may be interconnected with one adjacent cell in parallel and at the same time interconnected with another adjacent cell in series. Such multi-method interconnects within an array may provide for a combination of voltage boosting, due to serial interconnections, and current aggregation, due to parallel interconnections. Selection of a conductor mesh configuration, out of many possible combinations, during micro PV cell array fabrication may be performed in accordance with rules intended to customize array electrical output parameters, such as output voltage and output current for a given power level. One specific application of such array output engineering, by conductor mesh selection, is boosting voltage to current ratios for a given power in order to minimize resistive loses during transmission of the PV generated electricity.

According to some embodiments, an array of micro PV cells may be produced by physically splitting or separating a larger PV wafer or cell into smaller adjacent micro PV cells. The processing or mechanical splitting a PV Cell can also be referred to as singulation and may be performed by various processes including: (a) mechanical sawing or dicing (normally with a machine called a dicing saw); (b) scribing and breaking; (c) laser cutting (e.g. using CW laser or pulsed lasers in the UV, VIS or IR ranges); (d) E-Beam cutting; (e) Ion Beam Cutting; (f) wet etching; (g) dry etching; (h) ultrasonic cutter; (i) milling and (j) Thermal Laser Separation (TLS). Any process for singulation of semiconductor material, known today or to be devised in the future, may be applicable to present invention.

Some or all of the methods of PV cell singulation, according to embodiments of the present invention, may be automated to ensure precision and accuracy to producing micro PV cells with intended dimensions. Accordingly, dicing saw and/or laser spot width or mask geometry may be selected to correspond to an intended gap size and shapes between the micro PV cells. Cutting angles may also be selected to correspond to intended slopes and/or shapes of micro PV cell active surfaces and sidewalls. The micro PV cell created by a mechanical dicer saw may be any shape comprised of straight lines, but are typically rectangular or square-shaped but can also be other polygons. In some cases, when lasers or other methods are used, the micro PV cells can be produced in the form of many other shapes. A full-cut laser dicer may produce an array of micro PV cells in a variety of shapes, not just those formed of straight lines.

According to some embodiments, singulation or cutting or dicing of a PV cell or wafer into an array of micro PV cells may be performed from a top surface of the wafer or PV cell to be parsed into an array of micro PV cells. According to further embodiments, singulation or cutting may be performed from a from a bottom surface of the wafer or PV cell to be parsed into an array of micro PV cells. The terms singulation, cutting, dicing, and the like, as used in this application, may be used interchangeably unless there is a specific reference to specific methods and/or its inherent features. According to yet further embodiments, singulation or cutting may be performed from both top and bottom of the wafer or PV cell; in this case the cutting map or pattern on the top and bottom sides of the wafer may be the same or different. The singulation map or pattern of a PV wafer may be designed in correspondence to constraints such as the location of electrical conductors and contact points of a system to which the singulated PV wafer is to be attached.

Additional embodiments of the present invention may include an encapsulation of an array of interconnected micro PV cells within a material or set of materials. According to embodiments, a first set of materials placed in contact with a bottom surface of a micro PV cell array may join with and adhere to a second set of materials placed above a top surface of the PV cell array. Either the top or bottom set of materials may also include or act as a gap filler for spaces in between adjacent cells. The materials placed above the top of the array, where the photo-active surface is located, are selected to be sufficiently strong, flexible and sufficiently transparent to the relevant wavelengths in solar radiation in order to produce a strong, durable, flexible, conversion efficient and easily installable PV sheet or product. The materials placed below the bottom surface of the micro PV cell array are selected for strength, durability, flexibility and compatibility with the array material and with the top encapsulation material. At least one of the set of materials, either above or below the PV cells array may be composed of a stretchable and/or compressible to allow the total stack to curve to a desired radius. The layers above the PV cell array need to protect the PV micro cells against corrosion, and mechanical shock (such has hail impact, heavy loads e.g. trucks etc.) and to insulate even for series connected cells with high voltage against the ground (e.g. 600VDC, 1000VDC, 1500VDC) in dry and wet conditions. The bottom layers may protect the PV micro cells against corrosion, and mechanical shock (such has hail impact, heavy loads e.g. trucks etc.) and to insulate even for series connected cells with high voltage against the ground (e.g. 600VDC, 1000VDC, 1500VDC) in dry and wet conditions.

The process of encapsulating a micro PV cell array may also be referred to as lamination (usually when this process also includes adhesion of the PV Cell Array to a material usually in sheet or roll form). Lamination of a micro PV array according to embodiments of the present invention may include placement below the micro PV array: (a) bottom encapsulant film, and (b) a back-sheet film, in that respective order. Lamination of a micro PV array according to embodiments of the present invention may also include placement above the micro PV array a top encapsulant film and then a front-sheet film. Both encapsulant films may be composed of highly adhesive and malleable material, optionally adhesive and malleable when heated. Both the top and bottom sheets may be composed of durable materials. The top sheet and top encapsulant may both have low photon attenuation properties for photons with wavelengths within a band of wavelengths at which the micro PV array operates (i.e. converts photons into electricity). In addition to the typical structure described here consisting of a backsheet, a bottom encapsulant, a PV Cell Array, a top encapsulant and a topsheet, the structure would also typically contain elements for electrically connecting the PV Cells to each other, for connecting PV Cell Arrays to each other, and for electrical connections to an external load, thus allowing utilization of the electrical power produced by the PV cells.

According to embodiments of the present invention, the top and/or bottom sheets may be elastic. Either the top sheet or the bottom sheet, or both sheets may be flexible. Either the top sheet or the bottom sheet, or both sheets may be compressible. Elasticity of either top, bottom or both sheets may provide for rollability of the laminated micro PV arrays. Elasticity of either top, bottom or both sheets may provide for placement on the laminated micro PV arrays on top irregular or contoured surfaces.

A top sheet, according to further embodiments, may include optical concentrators positioned over areas where the micro PV cells are located. Each optical concentrator may cover one or more rows of Micro PV cells. Each optical concentrator may cover one or more columns of Micro PV cells. Each optical concentrator may cover one or more clusters of Micro PV cells. Or, each optical concentrator may be a micro-concentrator and may cover only one micro PV cell. Optical concentrators may be affixed to the top sheet, either before, during or after the lamination process. Optical concentrators may be embossed on the top sheet, either before, during or after the lamination process. According to some embodiments, optical concentrators are embossed or pressed onto a top sheet by a heated roller with protrusions in the shape of the optical connector, optionally during the lamination process. According to other embodiments, optical concentrators are formed onto a top sheet by micro-machining, laser ablation, patterned chemical etching or other processes.

According to some embodiments, singulation and lamination can be performed as part of a continuous process. According to further embodiments, forming of the optical concentrators may also be performed during the lamination process. According to alternative embodiments, different phases of producing an array of micro PV cells may be separated into discrete processes.

According to further embodiments, an electrical conductor mesh may be provided in form of a conductive backsheet, between the supportive backsheet and toughened PV cell array (arrays of micro PV cell arrays). This conductive backsheet may provide for electrically connecting cells with soldering, conductive adhesive, Surface Mount Technology (SMT) epoxy or adhesive or bonding materials, circuits, bus bars, electronics inside module such as Maximum Power Point Tracking (MPPT) tracking ICs; and method of producing same, e.g., using laser ablation, conductive stickers, soldering, Surface Mount Technology (SMT) processes, or the like.

According to some specific Photovoltaic focused embodiments, there may be provided methods of processing rigid (typically crystalline/polycrystalline cell of thickness above 10 um and preferably above 50 um) solar cells, of various configurations, in order to toughen and render more flexible the processed cell. The processed cells may then be used to produce flexible solar films and rolls of solar films based on a combination of these now flexible solar cells with encapsulating materials. The method can include producing long continuous films with modular electrical connections throughout in a roll format.

In order to render a rigid/semi rigid solar cell into a flexible one, a pseudo-singulation by grooving/dicing/cutting/breaking/cleaving (hereafter called "grooving") stage may be performed on a PV cell. Provided that the current collectors of both polarities remain intact and allow electricity flow out of the cell, the grooving may be done in steps similar or larger than adjacent current collectors of opposite sign during this stage, a minimal reduction in overall efficiency is expected. Grooving may preferably be done in electrically shaded sections of the solar cell to the maximum possible way in order to preserve maximum efficiency.

The distance between grooves determines the maximum radius of curvature of the film. In one preferred embodiment the distance between grooves is equal to the distance between adjacent conductors. In another embodiment the distance is between 100 um and 10 cm and preferably between 0.5 mm and 5 mm.

The kerf left by the grooving process may be minimal and may allow for the rolling of the film only in one direction in order not to apply stress and break the top of the solar cell when bending it inward. The kerf maybe of a defined width of between 0 and 300% of the height of the solar cell, to allow any desired radius of curvature when bending towards the top of the solar cell. To clarify terms: the top of the cell is the side which interacts with solar radiation.

The grooving may be performed perpendicular to the machine direction to allow rolling of the film in a small radius, parallel to the machine direction to allow flexibility in the width direction, or both to allow flexibility in all directions. The grooving can be made in diagonals, hexagons or any other pattern to render the flexibility needed by the product. Grooving may be conducted in one direction, in two directions or in more than two directions. Grooving may be conducted with an equal or with a different index in the different directions. The grooving index in any given direction may be constant or may vary.

In some embodiments, the grooving may be done by a mechanical saw or by a gang or group or batch of mechanical saws (e.g., a dicing saw). Alternatively, in another embodiment, grooving may be conducted by means of a "water jet" (high speed concentrated jet of liquid with or without abrasive particles in the liquid).

In another embodiments, the film may enter a curved space with bumps or other indentations or protrusions that induces breakage in the desired locations as depicted in drawing 4C in one direction and may be induced to break in the other direction by entering a roller system with bumps at the correct index. The PV units may be pre-weakened in specific desired locations either mechanically or by means of a laser, for example. In certain embodiments, the wafer would be stressed or grooved in direction(s) corresponding to the crystal lattice of the semiconductor material thus inducing "clean" breakage along crystal planes.

In yet another embodiment the grooving may be done by laser. Preferably, the laser is capable of rastering through the pattern in alignment with the speed of the machine (web) with enough power to perform grooving deep enough and fast enough. In another embodiment the laser beam is split by a e.g. a DOE to perform parallel grooving of between 2 to 1000 beamlets or more. The laser may be rastered and/or split optically or mechanically e.g. by an SLM or by any other beam shaper and/or a mechanical head. In further embodiments more than one laser head may be used in order to increase throughput, i.e. perform a higher number of grooves of specified depth, width, shape, angle and index in a given amount of time.

In one embodiment, a process for producing a product as described herein, is exemplified in which individual photovoltaic cells are first attached to a continuous flexible support sheet in an e.g. "pick and place" or dispenser manner and electrically connected to each other, either directly or by means of separate connecting elements. In one variation, the support film or sheet would already have electrical connecting elements preplaced on it in the correct locations to electrically connect adjacent photovoltaic elements/solar cells. This process would typically be a continuous process fed by a roll of support material with an automated station for placing the individual photovoltaic units and a station for performing the electrical contacts. The support sheet with the electrically connected photovoltaic elements is then moved to a pseudo-singulation (e.g. scribing, dicing, grooving etc.) station which would typically, but not necessarily, be located directly after the electrical contact station. The pseudo-singulation station is equipped with a mechanical (e.g. dicing saw) or laser unit, or both, or other means such as a water-jet or controlled breaking with capabilities to pseudo-singulate in at least one direction. The pseudo-singulation unit may be in a "gang configuration" enabling multiple scribes and/or cuts in a single pass of the machine head. Relative movement between the scribing/cutting head(s) and the photovoltaic elements in the machine direction may be accomplished by continuous movement of the support sheet. The machine head may be capable of conducting all scribes and cuts in a single pass or may have the capability to move in the transverse direction to reposition itself at a location required to perform additional scribes and/or cuts in the machine direction. The production line may be equipped with more than one cutting/scribing head for use in the machine direction. Scribing and/or dicing in other directions (including the transverse direction, perpendicular to the machine direction) may be performed by an additional head or additional heads with movement capability in the transverse direction. The dicing and/or scribing may be performed in a step and repeat semi-continuous manner where the support sheet with the photovoltaic elements would remain stationary in the transverse direction scribing/cutting area while the transverse direction scribing/cutting is conducted. Upon completion of transverse direction scribing/cutting of a given area, the support sheet with the photovoltaic units would move in the machine direction bringing into the transverse direction scribing/cutting area an additional portion of the material for transverse direction scribing/cutting. This order is just an example, and a certain direction grooving may be performed, before, after or simultaneously with grooving in a different given direction(s). Scribing and/or dicing in other directions (typically the transverse direction, perpendicular to the machine direction) may also be performed by an additional head or additional heads with movement capability in both the machine direction and the transverse direction, in which case the dicing and/or scribing would be performed in a continuous manner, with the machine head for dicing and/or scribing in the transverse direction would follow the movement of the support sheet with the photovoltaic units, and perform the scribing and/or dicing while moving in the machine direction. Upon completing certain area, the machine head would reposition itself upstream in the machine direction in order to perform the next set of transvers scribes and/or dicing cuts. Upon completion of dicing and/or scribing, the support sheet with the scribed and/or diced photovoltaic units is flexible enough to be rolled up and moved to a different line for subsequent processing or may undergo further processes downstream on the same line. The kerfs' width may be wide enough to provide partial transparency to the solar film and allow some (0.1% to 99.9% and preferably 5% to 90%) of the optical radiation to pass through it.

In some embodiments, the connector units between adjacent photovoltaic units or PV cells may be spring-like and may allow for stretching or shrinking or contraction or expansion of the product; a frontsheet and/or a backsheet may be utilized, having sufficient elasticity (or rigidity, or rigidness, or flexibility) to enable such stretching or contraction or expansion. Stretching may be enabled in one or more particular direction(s). Some embodiments may utilize PVDF (polyvinylidene fluoride, or polyvinylidene difluoride) layer or coating or film, as front-sheet or back-sheet or as a PV protector layer In a next processing step, the support sheet with the scribed and/or diced photovoltaic units may be laminated to a protective top sheet and/or bottom sheet. The lamination step may include encapsulation of the photovoltaic units with a protective material such as ethylene vinyl acetate (EVA). The protective top sheet needs to be transparent in order to maximize the intensity of solar radiation reaching the photovoltaic units and have good long-term resistance to environmental conditions. ETFE is one example of a material suitable for the protective top sheet. Transparent UV epoxy is another example and in one embodiment can be reinforced by fiberglass. A top durable transparent coating such as transparent synthetic "asphalt" may also be used to support heavy loads and protect the cells from breaking in e.g. solar roads applications. A glass filler may also be used in this application to enhance durability. In one embodiment fillers would be chosen with a refractive index similar to the matrix in which they are embedded. The top sheet may also be colored or tinted in order to suit certain applications. In this embodiment, narrow bandwidth reflection particles in a particular color may be embedded within the top sheet. In another example a holographic diffraction induced color may be generated through particles and geometries inside the sheet that induce color in certain directions and may in some cases also be transparent in other directions. In another embodiment the top sheet may include embedded lenses (e.g. micro-lenses) to concentrate the received radiation only upon the active area of the cells (i.e. excluding the kerfs formed when grooving and/or the area of the chamfered corners of the individual photovoltaic units/silicon wafers).

In another embodiment, relative movement between the scribing/cutting head and the photovoltaic elements in the machine direction may be accomplished by continuous movement of the support sheet. The machine head may be programmed to scribe and/or dice in a "Zig-Zag" pattern by combining mechanical movement of the head in the transverse direction and optical and/or mechanical manipulation of the laser beam in the machine direction. Combining consecutive lines of "Zig-Zag" scribing/dicing results in an array of scribes/cuts along both diagonals of the PV unit. Upon completion of dicing and/or scribing, the support sheet with the scribed and/or diced photovoltaic units is flexible enough to be rolled up and moved to a different line for subsequent processing or may undergo further processes downstream on the same line. In yet another embodiment relative movement between the scribing/cutting head and the photovoltaic elements in the machine direction may be accomplished by continuous movement of the support sheet. The machine head is programmed to scribe and/or dice in a hexagonal pattern by combining mechanical movement of the head in the transverse direction and optical and/or mechanical manipulation of the laser beam in the machine direction. Consecutive lines of partial hexagonal scribing/dicing trajectories result in an array of scribes/cuts that form a complete hexagonal ("bee hive") pattern across the PV cell in order to achieve better ration between cut and intact areas on the original cell to optimize performance. Upon completion of dicing and/or scribing, the support sheet with the scribed and/or diced photovoltaic units is flexible enough to be rolled up and moved to a different line for subsequent processing or may undergo further processes downstream on the same line. Patterning is not limited to the "Zig-Zag" or hexagonal grooving patterns described here and may include other geometrical trajectories and combinations thereof.

Various automated machines can be used to produce the flexible solar rolls based on treated rigid/semi rigid solar cells. In general, the machine can produce flexible solar films using any solar cell in which the both conductors are placed on the bottom of the cell such as, interdigitated back contact (IBC) solar cells, metal wrap through (MWT) solar cells, Emitter Wrap Through (EWT) solar cells, or other types of solar cells.

In one embodiment, monocrystalline, polycrystalline and/or any other type of silicon-based solar cells can be used.

In one embodiment the carrier sheet (e.g. backsheet and/or encapsulant sheet) may be stretchable and may be first metallized e.g. with (non-stretchable or stretchable) contact. A solar cell without the metallization is placed upon this metalized and patterned substrate in the correct placement and subsequently cut with minimal kerf and preferably no kerf (e.g. by breaking). A kerf is subsequently created by stretching the carrier sheet and thus moving the areas with active photovoltaic material away from each other.

In yet another embodiment an identification tag such as a RFID may be embedded in the product to allow for smart control and antitheft of the product. the adhesive of the film layers may be designed to prevent the opening of the cells without tearing apart and ruining the cells. Designing the antitheft electronics adjacent to the cell with adhesive designed to destroy it in case of tampering will prevent cutting and taking only part of the cell array.

In another embodiment the top sheet and/or encapsulant may be metallized in a fine line, stretchable or not, and subsequently electrically connected to the top of the solar cell, which in this case has one electrode on the bottom and the other at the front such as standard type silicon photovoltaic cell.

In one embodiment, the machine is a R2R (roll-to-roll) type system where at the end of the process the solar film is rolled onto a core to be packed and shipped. Packing and shipping may be in the form of "Jumbo rolls" (the full size of the incoming support roll) or in the form of smaller rolls which may be slit from the full-size roll in both the machine direction and/or the transverse direction. Packing and shipping of the end product is expected to be limited only by practical constraints of handling—weight, availability of raw materials in required widths, maximized efficiency of packing rolls in a shipping container, etc.

In some embodiments, the backside of the product would be coated with an adhesive (e.g. pressure sensitive adhesive, PSA) and laminated to a release layer to ensure that no contamination of the PSA occurs. The functionality of the adhesive is to facilitate easy attachment to a substrate (wall, car roof, etc.).

In one embodiment the machine may include a soldering station where individual cells are electrically connected in series and parallel in order to reach the desired current and voltage of the film/module. The soldering process may be done in several stages during the fabrication of the module. In one example bypass diodes, jumpers, smart logic, transistor, ideal diode circuits, cell-wise (or few cells) Maximum Power Point Tracking (MPPT) circuitry, and more may be used inline in the connection and soldering between cells to allow e.g. MPPT of cells in different orientation (due to flexibility), antitheft electronics, rapid shutdown logic, AC current inversion, as well as bus bars and communications. The connectors between cells and solder are designed to meet environmental conditions as well as expansion due to temperatures with low fatigue.

In order to allow production at higher speeds, the soldering stations may be distributed along the line and do not need to perform the electrical connection at the same time. In further embodiments, soldering may be replaced fully or partially by the use of electrically conductive adhesives.

In one embodiment the solar cells after grooving and soldering may be ready for encapsulation by encapsulants (e.g. polymer encapsulants, foil encapsulants, liquid encapsulants, vapor encapsulants or other types and combinations thereof), of the back sheet and front sheet at the next station of the machine.

In one embodiment the grooved cells may pass through a passivation stage to either passivate dangling bonds in the exposed silicon, protect it and/or create a field that pushes carriers away similar to the one on the top surface of e.g. IBC cell. This may be done by form of e.g. ALD, CVD, PVD, wet or other technique of e.g. SiO2, SiNx, AlOx, TiO2, among others.

In one embodiment the system does not need encapsulation at all, or at least in the sense of humidity, oxygen or other environmental corrosion agents due to the inherent stability of the components and expected life time that satisfy the requirements of a given application.

The encapsulation material(s) may include EVA, a fiberglass-reinforced composite and/or fluorinated polymer e.g. ETFE or in another embodiment, a polyolefin or any other appropriate material. The encapsulation can be composed of one layer or more than one layer of different polymers, or other dielectric materials such as oxides, nitrides, etc. to render the encapsulation (electrical and chemical), flexibility and optical properties needed for the product, and meet necessary standards. e.g. withstand 1500V breakdown voltage, allow only low degradation of performance for tens of years, withstand mechanical impact such as hail etc.

One or both of the frontsheet and the backsheet can be transparent. Areas for connecting peripherals may be designed in the front and/or back sheets for contacting bus bars, auxiliary electronics etc. These may be fabricated as e.g. holes or as weak spots that allow a penetration of a connector designed to provide good electrical connection.

The busbars may be designed as metalizations e.g metal foil laminates between the front and backsheet/and/or encapsulant film and to provide a pocket like area for the connection of a penetrating and expanding electrical connection that may sit once attached between the two metalizations with a compressive stress e.g. spring or washer spring to its place and subsequently it may be sealed as well.

In one embodiment, the electrical connection to photovoltaic units and between adjacent photovoltaic units may be conducted at a later stage by a machine capable of penetrating either the frontsheet and/or the backsheet, performing the desired electrical connection, and retracting without leaving damage to the said sheet. The process may include a post-electrical connection "healing step" in which damage to the frontsheet or backsheet is repaired by an encapsulation material or by other means.

The flexible solar films may be designed to be cut at certain shapes and lengths as required by the application and not necessarily be in only one form factor as the state of the art. They may be cut to shape at the installation location.

The flexible solar film sizes may be scalable with sizes between 1 mm and 100 km, and preferably between 12 m at 24 km it the roll direction and between 1 mm and 10 m, and preferably between 12 cm and 4 m in the perpendicular direction.

The flexible solar film may be constructed in a modular fashion allowing for different combinations and connections of PV cells to create areas capable of generating a required voltage and current combination.

Embodiments of the present invention may include a toughened semiconductor substrate comprising a substrate body composed of at least some brittle semiconductor material having a thickness of above 0.01 mm. The semiconductor material may have top, bottom and side surfaces. At least one intentionally placed gap may be introduced into said substrate body, wherein said intentionally placed gap may be at least 10% of semiconductor material thickness deep and at least 10% of semiconductor thickness wide. The toughened substrate may include a gap filler within the at least one intentionally placed gap which may be composed of a softer/tougher material possessing compressible/stretchable and/or flexible mechanical properties. According to embodiments, the gap filler may convey or introduce mechanical impact or force absorption and/or toughening properties to the composite semiconductor substrate as well as rendering it flexible.

The toughened semiconductor substrate semiconductor body may be composed of at least one semiconductor material selected from the group consisting of: intrinsic semiconductors, Group IV semiconductors, III-V semiconductors, II-VI semiconductors, silicon, silicon dioxide, aluminum oxide, sapphire, germanium, gallium arsenide (GaAs), and indium phosphide (InP) germanium, C, SiC, GaN, GaP, InSb, InAs, GaSb semiconductor on glass, silicon on glass, glass, silica, alumina, quartz, gallium arsenide (GaAs), and indium phosphide (InP), CdTe, organic/inorganic perovskite based materials, CIGS (CuGaInS/Se) including doped versions of the aforementioned materials and mixtures thereof.

Composite substrate bodies may include epitaxesial semiconductors on glass: CIGS (CuInGaS/Se) on glass AZO/ZnO/CIGS on glass, FTO/ZnO/CIGS on glass, ITO/ZnO/CIGS on glass, AZO/CdS/CIGS on glass, FTO/CdS/CIGS on glass, ITO/CdS/CIGS on glass, FTO/TiO2/CIGS, CdTe on glass, glass AZO/ZnO/CdTe on glass, FTO/ZnO/CdTe on glass, ITO/ZnO/CdTe on glass, AZO/CdS/CdTe on glass, FTO/CdS/CdTe on glass, ITO/CdS/CdTe on glass, FTO/TiO2/CdTe.

The semiconductor body may be configured to produce a semiconductor device selected from the group consisting of: a Photo Voltaic Cell, a Light Emitting Diode, a Transistor, a Power Transistor, an Integrated Circuit, a Very Large Scale Integration, a detector, a diode and a Microelectromechanical systems (MEMS).

According to embodiments, the gap filler may be composed of at least one material selected from the group consisting of: (a) a polymer; (b) a resin, (c) amorphous silicon; (d) glass; (e) a metal; (f) carbon; (g) oxygen; (h) a monomer; (i) a second semiconductor; (j) an oligomer; (k) a reactive system (e.g. monomer and photo-initiator); (l) EVA; (m) PVDF; (n) Silicone; (o) a fluoropolymer, (p) SiNx, (q) EPDM, (r) rubber, (s) PDMS, (t) PFE, (u) nitrogen, (v) titanium, (w) TaN, (x) AlN, (y) organic compound, (z) inorganic compound, (aa) nitrides, (ab) phosphides, (ac) carbides, (ad) selenides, (ae) halcogenides, (af) halides, and/or (oag) a combination of two or more of the above.

Gap filler comprised of an elastic or a plastic filler may include (a) a polymer, (b) a resin, (c) a monomer, (c) an oligomer, (e) PDMS, (f) EVA, (g) PFE, (h) a reactive system (e.g. monomer and photo-initiator, (i) PVDF, (j) Silicone, (k) EPDM and (l) rubber. Gap filler comprised of an passivating material may include: (a) SiNx, (b) SiO2, (c) AlN, (d) TaN, (e) nitrides, (f) phosphides, (g) carbides, (h) selenides, (i) halcogenides, (j) halides, (k) amorphous silicon. Gap filler comprised of composite material for chemical, thermal and mechanical durability may include at least one of the following materials: a) a metal, b) carbon, c) ceramic material. The gap filler may be comprised of any combination of the above listed options.

According to embodiments, the gap filler material may be reactively grown within a respective gap. The gap filler may be formed by reacting some gas or other substance with wall material of the gap sidewall. The gap filler may form a coating on said gap sidewall. The coating on said gap walls may be formed by the reaction of sidewall material with a specific ambient (e.g., gas) provided during the cutting/dicing process, for example during laser cutting.

According to embodiments, the gap filler may physically expand and may push gap walls apart. The gap filler may expand during reaction with material from the sidewalls. Alternatively, the gap filler may be introduced into the gap as a mixture of reactive materials which expand from reacting with themselves.

The toughened semiconductor substrate may include a gap filler mixture with anisotropic particles affixed in a specific direction relative to the top or bottom surface or any other specific plane in the substrate.

The toughened semiconductor substrate may include gap filler composed of materials deposited as discrete layers within or across a gap. The deposited material(s) may lay generally parallel to the top and bottom surfaces of the semiconductor substrate, or parallel to any other direction, including vertically to the top and bottom surfaces of the substrate. Different layers of the deposited discrete layers have different properties and serve different toughening functions.

According to embodiments, the toughened semiconductor substrate may include intentionally placed gap produced by removing material from the substrate body. The intentionally placed gap may extend across at least the top surface of said substrate body in a single line or in a pattern composed of an array of lines or other shapes. The array of lines may intersect at different points to create discrete areas of the top surface separated from adjacent similar discrete areas.

The toughened semiconductor substrate according to embodiments may include an intentionally placed gap which extends across each of the top surface and the bottom surface of said substrate body, thereby forming separate and different gap patterns within each of top surface and bottom surface. Gap filler material used for filling the gap patterns within each of top surface and/or bottom surface may be different, wherein one of the two gap patterns may be left unfilled.

The toughened semiconductor substrate according to embodiments may include intentionally placed gaps produced by removing material from the substrate body and which may pass completely through the semiconductor body from top surface to bottom surface. According to embodiments, the intentionally placed gap may be produced by expanding the distance between the semiconductor substrate parts from the sides of the gap.

The intentionally placed gap may be perpendicular to the top surface and to the bottom surface. The intentionally placed gap may be at an angle other than 90 degrees to the top surface and to the bottom surface. The intentionally placed may be a regular contour with flat walls. The intentionally placed gap may be of an irregular contour such a "V-shaped", "U-shaped", flat or other shape.

Embodiments of the present invention include all steps known today or to be devised in the future to provide the semiconductor features mentioned.

Embodiments of the present invention may include a mechanically toughened Photovoltaic (PV) cell comprising a semiconductor body composed of semiconductor material with a form factor including a top surface, a bottom surface and at least one sidewall, at least one intentionally placed gap within said body; and gap filler deposited in the gap formed within the cell body. Gaps within said cell semiconductor body may extend in a pattern so as to partition or to segment said PV cell (or PV cell array, or PV micro-cell array) into two or more micro PV cells, each micro PV cell having a body, a top surface, a bottom surface and sidewalls.

According to embodiments, each micro PV cell may include at least two electrode contacts of said micro PV cell and each electrically connected to a different side of a P-N junction within its respective micro PV cell. According to embodiments, the electrode contacts may be laterally spaced apart on a bottom surface of the micro PV cell. The micro PV cell may include at least two electrode contacts on any surface of said micro PV cell and each electrically connected to a different side of a P-N junction within its respective micro PV cell.

The micro PV cell top surface may be a polygon selected from the group consisting of: (a) a square; (b) a rectangle; (c) a decagon; (d) a hexagon; (e) a heptagon; and an octagon. Each side of said polygon may have a length in the range of 0.1 mm to 5 mm. The micro PV cell bottom surface may have the same shape and substantially the side lengths as said top surface. According to embodiments, the bottom surface may have different side lengths from that of the top surface.

A thickness of said micro PV cell, from top surface to bottom surface, may be in the range between 0.01 mm and 5 mm. At least one micro PV cell sidewall may be at a slope to said top surface or may have a curved surface.

According to embodiment a micro PV cell sidewall may be coated with a material different from the material comprising said micro PV cell body. The sidewall may be coated with a passivation material. The sidewall may be coated with an electrically insulative material. The sidewall may be coated with an electrically insulative material. The sidewall may be coated with a compound produced when reacting the cell body material with a substance selected from the group consisting of: (a) oxygen, (b) ammonia, (c) nitrogen, (d) hydrogen, and (e) argon and (f) compounds of these materials and (g) mixtures thereof.

According to embodiments, each of the micro PV cell electrodes is connected to a separate flexible conductor which interconnect corresponding electrodes on separate micro PV cells. According to embodiments, a conductive mesh may include conductors which electrically connect corresponding electrodes on different toughened PV cells.

The toughened PV cell according to embodiments may include a clear or transparent polymer laminate, located above said top surface. The PV cell may include a clear (or transparent) top sheet and/or encapsulant. The top sheet may include optical concentrators located above micro PV cells. The optical concentrators may or may not cover all or part of the gap between micro PV cells. The optical concentrators may be embossed or otherwise added to said clear top sheet. Adding may include chemical etching, micro-machining, laser ablation or other means, during or after the laminate is affixed to the PV cell.

According to embodiments, the concentrators may be geometrically optimized to direct the sunlight from an optimized inclination angle to an active area of a respective micro PV cell. The concentrators may be geometrically optimized to direct light away from non-active part of respective micro PV cells.

Embodiments of the present invention may include mechanically toughened Photovoltaic (PV) cell array comprising a bendable and/or stretchable support sheet upon which two or more toughened PV cells may be arranged relative to one another. The array may include an electrical conductor mesh to electrically interconnect corresponding electrical output terminals of at least two toughened PV cells, and at least one of said toughened PV cells may be formed of a semiconductor substrate with a form factor including a top surface, a bottom surface and at least one sidewall, at least one intentionally placed gap within said body with gap filler deposited therein.

The array may be composed of toughened PV cells as described above. The electrical contacts may be attached to each toughened cell and may be placed upon the support sheet which includes interconnections between the toughened PV cells. The PV cells may include dot contacts dispersed through respective bottom surfaces and may include P and N contacts.

A toughened PV cell according to embodiments may include dot contacts dispersed through its bottom surface and may include p and n contacts that connect two or more dot contacts of the same polarity.

An array according to embodiments may include an electrical conductor mesh to electrically interconnect corresponding electrical output terminals of at least two toughened PV cells, whereas the array may also connect micro PV cells and/or group of micro PV cells and/or one or more toughened PV cell.

An array according to embodiments may provide a flexible PV module composed of a continuous flexible array which is rollable on a roll with a diameter of less than 50 cm. The flexible module may be composed of a continuous flexible array with a length of between 0.12 m to 24 km, and with a width of between 0.12 m to 12 m.

According to some embodiments, the specific weight of the PV module may be lower than 1, and it may float on water (or on other liquids). The array support sheet may be made from a closed cell foamed polymer. The closed cell foamed polymer may be made of a polymeric material including: polyolefin, PDMS, EPDM, silicone, polyurethane. The support sheet may be made out of fluoropolymer, PET, PVC, EPDM, ETFE, ECTFE, acrylic, PC, PVDF, PEF, POE, PP, PE, Al, silicone and combinations thereof. A top sheet of the array may be made out of transparent and/or colored and/or patterned and/or embossed fluoropolymer, PET, PVC, EPDM, ETFE, ECTFE, acrylic, PC, PVDF, PEF, POE, PP, PE, Al, silicone and combinations thereof, ETFE, PET, PVDF, PP, PE, EVA and FEP. In some embodiments, a PV module or an array of PV cells may be formed of, or may comprise, one or more layers that have a specific weight that is smaller than 1, in order to enable the entire module or product to float on water and/or to float on other liquids; for example, by utilizing one or more layers of sponge or foamed lightweight plastic or polystyrene or foamed polystyrene or Styrofoam, optionally with closed pores or coated pores. Such layer(s) may be glued or bonded or otherwise connected or mounted, under the lowest layer of the module or array, or beneath some portions or regions thereof, or at side-edges or side-panels thereof, or at other suitable locations.

Some embodiments provide a system for toughening a semiconductor substrate or wafer (wafer and substrate interchangeably used in this application), and a production method for toughening a semiconductor substrate to make it mechanically resilient.

A bottom support sheet along with a bottom encapsulant are unrolled and combined to form a bottom support upon which electrical interconnects, such as a conductor mesh (inter-digitated or not), are unrolled and placed. Upon the composite film and electrical support structure a pick & place machine places one or more semiconductor substrates in any configuration applicable to the present invention. An electrical contact station makes contacts between relevant electrodes on the placed substrates and corresponding conductors on the mesh, after which the bottom encapsulant is cured at an adhesive curing station. A top surface of the electrically connected and adhesive affixed substrates are separated/singulated/grooved to form semiconductor substrate body gaps in accordance with embodiments using a cutting, dicing or breaking station. The substrate gaps, which can be clean through cuts, are then filled by a gap filler material in accordance with embodiments of the present invention, at a gap filling station. A clear top laminating film and a clear top sheet are then applied and pressed together on top of the substrates, after which the output product is rolled up at a rolling station.

Optional processes and devices in the context of the system are discussed. For example, a pick & place process may be used, by which semiconductor substrates are placed on a support sheet as part of an exemplary embodiment of the present invention. A set of semiconductor substrates may be positioned on a supporting sheet and being separated, grooved or trenched or singulated by a physical scribing or dicing (cutting) process performed by an automated cutter at a cutting station in accordance with embodiments of the present invention. A set of semiconductor substrates may be positioned on a supporting sheet and may be fully or partially singulated in accordance with a multi-step singulation embodiment of the present invention where a combination partial physical scribing or dicing (cutting) in two dimensions and physical deformation is used to fully singulate the substrates or wafer(s) in a predefined pattern. A semiconductor substrate or wafer may transition through a separation/singulation process in accordance with embodiments of the present invention.

In some embodiments, a beam-based semiconductor separation system may be used. The beam can be a laser, an electron beam, a sonic beam, a water stream, a gas/jet stream and/or any other beam types known today or to be developed in the future. The semiconductor substrate or wafer transitions through exemplary separation/singulation processes in accordance with beam-based embodiments of the present invention.

Some embodiments may provide a semiconductor substrate body or wafer which has been separated or grooved or trenched or singulated, and which includes an electrical conductor mesh under the gaps formed by the singulation in accordance with further embodiments of the present invention. Several optional semiconductor body gap formation geometries can be used and produced in accordance with embodiments, with various gap or crater shapes. In an example, the wafer is pre-attached to a conductor mesh, but this is not necessarily always the case.

In some embodiments, a semiconductor body or wafer or substrate is used according to PV device embodiments of the present invention, where interdigitated positive and negative electrodes protrude out of the bottom of the substrate body, and wherein different separation/cutting patterns are used depending on a placement and arrangements of negative electrodes relative to corresponding positive electrodes. For example, when opposite corresponding electrodes align, rectangular cuts may be used to singulate the PV cell. In some embodiments, when opposite corresponding electrodes do not align, diagonal cuts are used to singulate the PV cell. Other patterns may be used.

Some embodiments provide a beam-based semiconductor separation system, where a reactive substance is provided during beam separation and which reactive substance may react with portions of the semiconductor body exposed to the separator beam. This is only one possible option for gap filling in accordance with embodiments of the present invention. Every filler insertion or deposition known today or to be devised in the future may be applicable.

Some embodiments provide a semiconductor substrate body that is singulated or trenched or grooved with non-transcending gaps or craters; and including or filled with a gap filler such as in the form of a coating on the gap/crater sidewalls. Various optional semiconductor body gap formation geometries may be used, which could be produced and/or used in accordance with embodiments, optionally also including a coating layer. The gap filling material may only coat the walls of the gap or crater, or may completely fill the gap/crater, or may fill the gap/crater and also overflow, thus creating a coating layer on the upper surface of the wafer. In some embodiments, the gap/crater filler occupies up to 25 percent of the volume of the gap/crater; or, at least 25 percent of the volume of the gap crater; or, up to 50 percent of the volume of the gap/crater; or, at least 50 percent of the volume of the gap crater; or, more than 50 percent of the volume of the gap crater; or, up to 75 percent of the volume of the gap/crater; or, at least 75 percent of the volume of the gap crater; or, up to 80 percent of the volume of the gap/crater; or, at least 80 percent of the volume of the gap crater; or, up to 90 percent of the volume of the gap/crater; or, at least 90 percent of the volume of the gap crater; or, up to 95 percent of the volume of the gap/crater; or, at least 95 percent of the volume of the gap crater; or, up 100 percent of the volume of the gap/crater.

In some embodiments, a semiconductor substrate/wafer body is used, wherein each set of PV cells has a transition of semiconductor substrate/wafer body from an untoughened configuration into each of three separate toughened configurations in accordance with some embodiments, such as: (1) partial top separation/singulation, filling and coating; (2) top and bottom partial separation/singulation, filling and coating; (3) complete separation/singulation, filling and coating. In case (2) the top and bottom grooving maps may be the same or different and the filler material used in the gaps on either side may be the same or different.

Some embodiments may use a system for producing a Photovoltaic (PV) device wherein separated/singulated/grooved/trenched substrates or wafer(s) or semiconductor body, optionally on support sheets, are encapsulated within top and bottom EVA films (as an example of an encapsulating material) and then within top and bottom polymer sheets. Materials other than polymer sheets may be used. The polymer sheets are optionally formed (embossed, etched, machined, ablated) with concentrating optics on the top sheet. In some embodiments, a clear polymer embossing assembly can be used, to provide micro or mini lenses on a top sheet covering a toughened and resilient PV cell. Some embodiments provide an array of micro PV cells that are toughened, encapsulated and covered with a micro-lens embossed top sheet in accordance with embodiments of the present invention. Optionally, asymmetric concentric micro-lenses may be used in correspondence to angle of solar radiation.

In some embodiments, the manufacturing process may include operations of cleaning or brushing or washing or washing-away, or otherwise removing or discarding of, particles or residue material(s) that resulted from the removal treatment (e.g., due to dicing, grooving, cutting, or the like). Such particles or residue, and/or the material(s) that was or were removed in order to create gaps or craters or tunnels, may be washed away or washed out, or brushed away or brushed out, or may be blown away via air blasts, or may be shaken away by shaking or vibrating, or may be cleaned away or removed or discarded by applying a laser beam or a laser-based particle removal process (e.g., optionally utilizing a different type of laser than the laser utilized for grooving or cutting), or by temporarily dipping the materials in a bath or container of liquid(s) for cleaning purposes (such as ultrasonic bath), or may otherwise be removed or discarded.

For demonstrative purposes, some portions of the discussion above or herein, and/or some of the drawings, may relate to (or may demonstrate) a single type of pattern or a single type of patterning that is performed with regard to an entire wafer or an entire set or array of PV cells or other semiconductor device(s); however, these are only non-limited examples, and some embodiments may utilize or may features two or more different patterns within (or applied to) a single wafer or a single array of PV cells or other semiconductor devices. For example, a first region of a wafer may be manufactured to have gaps or grooves or craters in accordance with a first pattern (e.g., a crisscross pattern, or a pattern of horizontal lines intersecting with vertical lines), whereas a second region of that same wafer may feature gaps or grooves or craters in accordance with a second, different, pattern (e.g., a zigzag pattern; or a pattern of curved lines; or a pattern of horizontal lines that intersect with diagonal lines). Similarly, a first region may comprise gaps or grooves or craters at a first density (e.g., N gaps or N grooves or N craters per square centimeter), whereas a second, co-located region or nearby region or neighboring region may feature gaps or grooves or craters at a second density (e.g., 2N or 3N or 5N gaps or grooves or craters per square centimeter). Similarly, the density of lines or other geometrical shapes that are formed by such gaps or grooves or craters, may differ between or among different regions of the same wafer or array of PV cells. This is not merely a design feature, but rather, a functional feature; for example, a single surface or wafer or device or final product, may thereby be adapted to have different levels of rigidity or rigidness or flexibility or elasticity or toughness in different regions, to achieve particular functional goals. For example, a first region or component of the final product may be manufactured with a greater number or density of gaps or craters, or a first particular pattern thereof, to enable a greater level of mechanical flexibility at that region; whereas a second region or component of the final product may have a smaller number or density of gaps or craters, or a second particular pattern thereof, to enable a greater level of mechanical rigidity of said second region or a reduced level of mechanical flexibility there.

In some embodiments, gaps or grooves or craters or pockets or recesses or basins or islands may be arranged or created in a pattern other than crisscross, or other than horizontal lines that intersect at 90 degrees with vertical lines. For example, some embodiments may utilize a pattern of gaps or grooves or craters, in which a first set of generally parallel lines intersect at a particular angel (e.g., not a right angle) with a second set of generally parallel lines; or intersect with a set of curved lines; or the like.

In some embodiments, a manufactured wafer or PV cells array, or other semiconductor device, may comprise multiple layers such that a top layer thereof expands when it is being curved or bent, whereas a bottom layer thereof shrinks or contracts when it is curved or bent; or vice versa. Accordingly, the grooving, cutting, gap creation, and patterning in the manufacturing process, may be configured in advance to accommodate such mechanical expansion or mechanical contraction of layer(s); and may optionally utilize different patterns in different regions, and/or different density of gaps or grooves in different regions, and/or different types or shapes of gaps or grooves or craters or tunnels at different regions, to ensure that such expansion or contraction are enabled.

One or more laser processes, or laser-based processes or operations, that are described above and/or herein, may be performed at one or more different stages of the manufacturing process. For example, laser treatment or cutting or grooving may be performed as an initial operation or as a first operation or as a preparation operation in the manufacturing process; and/or as an operation performed during the manufacturing process itself; and/or as part of post-processing or post-manufacturing operations; and/or as part of cleaning operations or as part of residue removal operations; or by applying the laser, selectively, to one or more layer(s) and not to other layers, or selectively to one or more particular encapsulant layers or encapsulant materials (or to all of them), and/or for the manufacturing of connectors or electrical connectors, or as an operation that precedes or accompanies or follows one or more other operations (e.g., soldering, low temperature soldering, SMT soldering or mounting, hot-air soldering, reflow soldering using a reflow oven or a reflow machine, soft soldering which uses tin-lead alloy as filler metal, or the like). In some embodiments, laser treatment may be applied selectively only to one or more layer(s) and not to other layer(s), and/or to only particular regions. In some embodiments, the laser treatment may operate selectively on an inner layer or on a bottom layer, while passing through yet not necessarily treating or affecting one or more layer(s) above the treated layer(s), for example, selectively laser-treating only the silicon layer and not other layers above it and/or below it.

In some embodiments, a single encapsulant layer may be utilized, at or near the bottom part of the manufactured module. In other embodiments, a single encapsulant layer may be utilized, at or near the top part of the manufactured module. In other embodiments, two or more encapsulant layers may be utilized, at two (or more) different regions or portions of the manufactured module; such as, one encapsulant layer at or near the bottom part of the manufactured module, and another encapsulant layer at or near the top part of the manufactured module. Such encapsulant layers may include or may be, for example, thermoplastic polyolefin (TPO) encapsulants, Polyolefin elastomer (POE), or other suitable materials.

In some embodiments, one or more layers of fiberglass or glass-fiber may be used or added or connected, or may be an integral part of the manufactured module. For example, a single fiberglass or glass-fiber layer may be utilized, at or near the bottom part of the manufactured module. In other embodiments, a single fiberglass or glass-fiber layer may be utilized, at or near the top part of the manufactured module. In other embodiments, two or more fiberglass or glass-fiber layers may be utilized, at two (or more) different regions or portions of the manufactured module; such as, one fiberglass or glass-fiber layer at or near the bottom part of the manufactured module, and another fiberglass or glass-fiber layer at or near the top part of the manufactured module. The fiber glass or glass-fiber components may be embedded in epoxy and/or polyester and/or POE or other stretchable/compressible polymer and/or other thermosetting or thermoplastic matrices or arrays or materials.

In some embodiments, one or more layers of carbon-fiber may be used or added or connected, or may be an integral part of the manufactured module. For example, a single carbon-fiber layer may be utilized, at or near the bottom part of the manufactured module. In other embodiments, a single carbon-fiber may be utilized, at or near the top part of the manufactured module. In other embodiments, two or more carbon-fiber layers may be utilized, at two (or more) different regions or portions of the manufactured module; such as, one carbon-fiber layer at or near the bottom part of the manufactured module, and another carbon-fiber layer at or near the top part of the manufactured module. The carbon species and/or carbon-fiber components may be embedded in epoxy and/or polyester and/or POE or other stretchable/compressible polymer and/or other thermosetting or thermoplastic matrices.

In some embodiments, the above-mentioned operations, or some of them, may be performed as (or in addition to) a pre-molding process, and/or may be performed as (or in addition to) a post-molding process. In some embodiments, the manufacturing of the module or the array of PV cells may be performed as part of (or in conjunction with) a particular molding process, in which a particular non-planar three-dimensional shape (e.g., a roof of a car) is utilized to create a mold, with PV cells being placed thereon.

In some embodiments, the manufacturing process may comprise doping and/or pre-doping and/or post-doping, of one or more layer(s) or components or regions, and particularly of the silicon layer. For example, a p-type PV cell may be manufactured, utilizing a positively charge (p-type) silicon base. In a demonstrative example, a wafer is doped with boron; the top of the wafer is then negatively doped (n-type) with phosphorus, thereby helping to form the p-n junction that enables the flow of electricity in the PV cell. In other embodiments, an n-type PV cell may be manufactured, with the side that is n-doped acting as the basis of the PV cell; optionally providing higher efficiency, or being more immune to Light Induced Degradation (LID). In some embodiments, the doping may be performed before the cutting or grooving or crater creation or gap creation. In other embodiments, the doping may be performed after the cutting or grooving or crater creation or gap creation.

In some embodiments, automatic manufacturing using rolls, with optional roll-to-roll automation, may be used. In other embodiments, utilization of such rolls may be optional; and the manufacturing process may avoid using rolls or rolled materials, at all or partially, and instead may utilize planar materials, planar layers, discrete components that are set and/or placed and/or mounted and/or connected and/or glued and/or soldered, and then the process is repeated for additional wafers or modules or arrays which are then inter-connected, and/or by using other suitable processes. In some embodiments, the process may be divided into parts, which are conducted in a-continuous mode, non-continuous mode, semi continuous mode (e.g. step-and-repeat), and/or in a batch mode. Each of these types of processes may be implemented to include between 0% and 100% of the overall process.

In some embodiments, stringing and tabbing of PV cells or PV modules may be performed by a tabber and stringer machine, or other suitable welding machine, which may automatically or semi-automatically join or connect PV cells to each other; optionally using a flat ribbon to form the required strings for the PV module, while reducing to minimum the mechanical and/or thermal stress. In some embodiments, connections between PV cells or PV modules may be performed in one or more suitable ways, for example, using welding, soldering, utilizing hot air and/or infra-red (IR) radiation or light, gluing, bonding, adhesive stickers, or the like. In some embodiments, one or more layers of hot or heated adhesive or glue or bonding material(s) may be applied, on top of the top layer and/or under the bottom layer and/or in particular regions or areas (e.g., selectively, at particular regions that are estimated or are planned to subsequently be curved or bent). Optionally, fiber glass or glass-fiber or carbon-fiber layer(s) may be added or used; as well as one or more glass layers or other transparent layer(s), which may contribute to toughening the module or to providing additional support or rigidity to particular regions thereof.

In some embodiments, optionally, a manufactured wafer or PV cells array or PV module may have reduced-size properties during some of the production operations, such as two or three or more of discrete wafers or discrete PV cell arrays are then soldered or connected together in series. For example, instead of manufacturing a single wafer or a single PV cells module having a total length of 120 millimeters, three smaller wafers or modules (each one having a length of 40 millimeters) may be produced separately, or six smaller wafers or modules (each one having a length of 20 millimeters) may be produced separately; and such discrete wafers or modules may then be connected in series, to thereby produce a module that supports or that provides a greater electrical voltage and a lower electrical current. In other embodiments, such discrete wafers or modules may be connected in parallel to each other, rather than in series; or, may be connected firstly in series and then multiple modules may be connected to each other in parallel; in order to achieve desired targets of voltage or current. In some embodiments, shingling connections may be used between or among adjacent wafers or modules, or singled cells or shingled modules may be connected to each other; whereas, in some embodiments, seamless soldering may be used, or other suitable types of mechanical connection and/or electrical connection of cells or cell-arrays or wafers or PV modules.

Some embodiments may be used for manufacturing PV cells or PV modules, or an array or matrix or PV cells or PV micro-cells, that are suitable for utilize on top of roofs, walls, roofs of buildings, roofs of vehicles; or as a roof shingle; or as a wall or side-wall or side-panel of a building or other construction object; or that are suitable for being part of, or being on top of, a car or truck or vehicle, a golf cart or a "club cart", a high-speed or a low-speed electric vehicle, a work vehicle, a tractor, a lift, a crane, a scooter, a mobility scooter, an electric scooter, a motorcycle, a motorbike, a wheelchair, an autonomous vehicle, a self-driving or self-operating vehicle, a remotely-controlled vehicle, an airplane, an aircraft, a drone, an Unmanned Aerial Vehicle (UAV), a self-flying or self-operating drone or UAV or aircraft, a remotely-controlled drone or UAV or aircraft, a satellite, a spaceship, a space shuttle, a train, a wagon or a car of a train, a ship or a boat or other watercraft, or other suitable devices.

Some embodiments of the present invention operate to replace conventional PV cells or conventional PV modules, which are typically easily breakable or which may comprise an easily breakable wafer, with novel and inventive PV cells and PV modules that have reduce breakability properties; for example, by introducing patterned cutting or grooving or gaps or craters in the product (e.g., particularly in the silicon layer, but may also be the silicon layer as well as a top-sheet or a further protecting layer such as PET, ETFE, PVDF, other topsheet materials, glass or fiber glass that is cut to the same dimension of the silicon layer under it, or the like), thereby creating an array or matrix or other arrangement of smaller PV cells which are more resistant to mechanical pressures and/or are less breakable upon application of force or pressure. An electrically-conducting back-sheet or mesh or other connection layer, or other tabbing technique or connecting technique for joining PV cells, may ensure that the electrical conductors are not disrupted and are not disturbed, located (for example) at the bottom layer of the PV module.

In accordance with the present invention, craters or gaps or recesses or pockets or cavities or tunnels or grooves or basins, which are created in accordance with a pre-defined pattern in or at the wafer or substrate to segment it into an array or matrix or batch or arrangement of inter-connected micro PV cells, are formed particularly by a laser beam or by laser cutting or by laser etching or other laser-based process; and are not formed via Deep Reactive Ion Etching (DRIE), and are not formed via a DRIE based corrugation technique. The Applicants have realized that the specific utilization of laser-based or beam-based processes to introduce and form such craters, and that the utilization of such laser-formed craters or recesses, may result in improved or enhanced performance and/or properties of the final product, relative to the utilization of DRIE-based craters or corrugation-based craters. The Applicants have also realized that in some embodiments, utilization and formation of laser-based or beam-based craters or recesses or grooves or basins or pockets may be preferred (e.g., relative to corrugation based methods, or DRIE based methods), as it may allow a faster production process and/or may allow creation of more accurate three-dimensional structures or two-dimensional patterns with increased precision. However, it is clarified that some embodiments of the present invention may utilize non laser-based methods, such as DRIE based methods or corrugation or chemical processes, to form such craters; and such methods may be used, in some embodiments, instead of using the laser-based or beam-based methods, or even in addition to them (e.g., before or after them). Similarly, dicing techniques, as well as various cutting techniques or mechanical grooving processes, may be used in some embodiments, instead of or in addition to the above-mentioned processes or some of them.

Some embodiments of the present invention particularly utilize a wafer or a substrate that has a sub-200 micron thickness, such as, a wafer thickness or a substrate thickness that is smaller than 200 microns, or a wafer thickness or a substrate thickness that is smaller than 190 microns, a wafer thickness or a substrate thickness that is smaller than 180 microns, a wafer thickness or a substrate thickness that is smaller than 170 microns, a wafer thickness or a substrate thickness that is smaller than 160 microns, a wafer thickness or a substrate thickness that is smaller than 150 microns, a wafer thickness or a substrate thickness that is smaller than 140 microns; or a wafer thickness or a substrate thickness that is 150 or 160 or 170 or 180 microns. The Applicants have realized that the specific utilization of such thickness values may contribute, in some embodiments, to improved or enhanced performance and/or properties of the final product. However, it is clarified that other embodiments of the present invention may utilize or may include wafers having other suitable thickness values or ranges-of-values; for example, a wafer having thickness of 200 or 220 or 240 or 250 microns, or a wafer having a sub-250 micron thickness, or a wafer having a sub-300 microns thickness, or a wafer having a sub-400 microns thickness, or a wafer having a sub-500 microns thickness; although, in some embodiments, utilization of thinner wafer(s) may be preferred in order to reduce the weight and/or dimension and/or form-factor of the final product, and/or in order to reduce costs, and/or in order to reduce the amount of material that needs to be removed or treated or discarded in order to reach a particular implementation of the final product.

In some embodiments, division or segmentation of the wafer or substrate is performed in two or more directions, or along two or more axes, or along two or more lines, or along (or in accordance with) two or more patterns or routes (which may not necessarily be linear or straight; or which may be curved, or may have other suitable shape). Furthermore, the division or the segmentation need not necessarily be perpendicular to the direction of the electrical contacts; and/or need not be only perpendicular to said direction; but rather, may be slanted or angled or diagonal relative to the general direction of the electrical contacts or relative to a plane in which the electrical contacts are located. The Applicants have realized that such multiple-dimension or multiple-direction segmentation, and/or such particular non-perpendicular direction(s) of segmentation or division, are not merely a design choice; but rather, they may contribute, in some embodiments, to improved or enhanced performance and/or properties of the final product.

In some embodiments, the recesses or craters or pockets or basins that are formed in the wafer, are non-elongated; such that the resulting produce has an array or a group of "islands" or "discrete islands", rather than having "strips" or "elongated strips". In some embodiments, the top area of each micro PV-cell may have a horizontal axis and a vertical axis, such that the ratio between them is, for example, not more than 1.25, or not more than 1.50, or not more than 1.75, or not more than 2, or not more than 3, or not more than 5. The Applicants have realized that utilization of such ratio is not merely a design choice; but rather, it may contribute, in some embodiments, to improved or enhanced performance and/or properties of the final product.

In some embodiments, the electrical contacts of the micro PV-cells, or the electrical contacts that are laid beneath the wafer or at the bottom portion thereof, are not exposed by the laser-based or beam-based formation of craters or recesses or basins or pockets; rather, in some embodiments, such formation only partially (and not fully) penetrates downwardly but still leaves non-penetrated silicon at the bottom, and does not expose the electrical contacts. The Applicants have realized that utilization of such partial and non-entire penetration may contribute, in some embodiments, to improved or enhanced performance and/or properties of the final product.

Some embodiments may be utilized with a variety of schemes or patterns of electrical contacts, which may be, for example, inter-digitated back contacts (IBC), non-interdigitated pattern or scheme of contacts, a contact scheme utilizing multiple parallel lines, grid contacts or grid-like contacts, a backsheet or a wafer having or comprising an array or a pattern of exposed dots for electrical contacting, or the like. Some embodiments may be utilized in conjunction with a single wafer; or in conjunction with a wafer or a panel that is comprised or composed of several PV cells. Additionally or alternatively, some embodiments may be utilized in conjunction with a continuous roll-to-roll process, or other scaled-up production methods.

In some embodiments, an apparatus comprises a segmented Photo Voltaic (PV) cell array, comprised of a plurality of micro PV cells. The PV cell array comprises one of: (I) a single wafer that is segmented via a plurality of craters, (II) a portion of a single wafer that is segmented via a plurality of craters, (III) a set of two or more inter-connected wafers that are segmented via a plurality of craters. Said wafer is a wafer selected from the group consisting of: (i) a composite metallized wafer having an underlying metallization layer, wherein each crater penetrates an entirety of the non-metalized layers of said wafer but does not penetrate said underlying metallization layer of the wafer; (ii) a semiconductor wafer, wherein each crater penetrates into not more than 99 percent of an entire depth of said semiconductor wafer. Each crater creates a physical recess separation between two neighboring micro PV cells, which are still inter-connected to each other but only across some and not all of their height. Said micro PV cells are connected to each other, mechanically and electrically.

In some embodiments, each micro PV cell has a top surface area that is smaller than one square centimeter; wherein segmentation of said single wafer, and wherein inclusion of craters among said micro PV cells, inhibits or reduces mechanical breakage of said PV cell array. In some embodiments, at least one of said craters is a U-shaped crater; wherein segmentation of said single wafer, and wherein inclusion of craters among said micro PV cells, inhibits or reduces mechanical breakage of said PV cell array. In some embodiments, at least one of said craters is a V-shaped crater; wherein segmentation of said single wafer, and wherein inclusion of craters among said micro PV cells, inhibits or reduces mechanical breakage of said PV cell array. In some embodiments, at least one of said craters is generally V-shaped, but has at least a first inner sidewall that is slanted at a first slanting angle, and has a second inner sidewall that is slanted at a second, different, slanting angle; wherein segmentation of said single wafer, and wherein inclusion of craters among said micro PV cells, inhibits or reduces mechanical breakage of said PV cell array. In some embodiments, said segmented PV cell array, due to segmentation of said single wafer and due to inclusion of said craters among said micro PV cells, is tougher and is less breakable relative to a non-segmented PV cell unit having the same overall area.

In some embodiments, said micro PV cells and the craters that separate them, are arranged in a crisscross pattern of (i) a first set of straight parallel lines, that intersect perpendicularly with (ii) a second set of straight parallel lines; wherein said pattern contributes to reducing mechanical breakability of said PV cell array. In some embodiments, said micro PV cells and the craters that separate them, are arranged in a pattern of (i) a first set of straight parallel lines, that intersect diagonally and non-perpendicularly with (ii) a second set of straight parallel lines; wherein said pattern contributes to reducing mechanical breakability of said PV cell array. In some embodiments, said micro PV cells and the craters that separate them, are arranged in a pre-defined pattern which comprises at least one non-straight line; wherein said pattern contributes to reducing mechanical breakability of said PV cell array. In some embodiments, said craters are completely filled with a filler material, from a lowest point of each said crater, upwardly to and being flush with a top surface of said single wafer. In some embodiments, said craters are only partially filled, and not completely filled, with a filler material, from a lowest point of each said crater, upwardly towards but not reaching a top surface of said single wafer.

In some embodiments, inner walls of said craters are coated with an inner coating material, which coats the inner walls of said craters but does not entirely fill said craters. In some embodiments, said filler material has pre-defined compressible properties that provide a particular level of flexibility to said PV cell array. In some embodiments, craters of a first region of said PV cell array is filled, partially or entirely, with a first filler material, which provides a first level of flexibility to said first region of the PV cell array; wherein craters of a second region of said PV cell array is filled, partially or entirely, with a second, different, filler material, which provides a second, different, level of flexibility to said second region of the PV cell array.

In some embodiments, a first region of said PV cell array features a first pre-defined spatial pattern of PV micro-cells and craters, which provides a first level of flexibility to said first region of the PV cell array; wherein a second region of said PV cell array features a second pre-defined spatial pattern of PV micro-cells and craters, which provides a second, different, level of flexibility to said second region of the PV cell array.

In some embodiments, a first region of said PV cell array has a first particular density of craters per unit-of-area, which provides a first level of flexibility to said first region of the PV cell array; wherein a second region of said PV cell array has a second, different, particular density of craters per unit-of-area, which provides a second, different, level of flexibility to said second region of the PV cell array.

In some embodiments, each crater has a particular depth, which is at least 10 percent of the thickness of said single wafer; wherein said particular depth of each crater contributes to reduction of mechanical breakability of said PV cell array. In some embodiments, each crater has a particular depth, which is at least 25 percent of the thickness of said single wafer; wherein said particular depth of each crater contributes to reduction of mechanical breakability of said PV cell array. In some embodiments, each crater has a particular depth, which is at least 50 percent of the thickness of said single wafer; wherein said particular depth of each crater contributes to reduction of mechanical breakability of said PV cell array. In some embodiments, each crater has a particular width, which is in a range of 10 to 50 percent of the thickness of said single wafer; wherein said particular width of each crater contributes to reduction of mechanical breakability of said PV cell array. In some embodiments, each crater has a particular width, which is in a range of 10 to 25 percent of the thickness of said single wafer; wherein said particular width of each crater contributes to reduction of mechanical breakability of said PV cell array.

In some embodiments, said craters are top-side craters that are formed downwardly relative to a top surface of said single wafer, and that do not reach a bottom surface of said single wafer; wherein said PV cell array further comprises additional craters, which are bottom-side craters, which extend upwardly from the bottom surface of said single wafer towards but not reaching the top surface of said single wafer; wherein said top-side craters and said bottom-side craters, contribute to reduction of mechanical breakability of said PV cell array.

In some embodiments, each top-side crater has a first crater-shape; wherein each bottom-side crater has a second, different, crater-shape; wherein inclusion in the same PV cell array, of (i) said top-side craters having the first crater-shape and (ii) said bottom-side craters having the second crater-shape, contributes to reduction of mechanical breakability of said PV cell array. In some embodiments, each top-side crater stores, partially or entirely, a first filler material; wherein each bottom-side crater stores, partially or entirely, a second, different, filler material; wherein inclusion in the same PV cell array, of (i) said top-side craters having the first filler material and (ii) said bottom-side craters having the second filler material, contributes to reduction of mechanical breakability of said PV cell array. In some embodiments, said top-side craters are arranged in a first spatial pattern; wherein said bottom-side craters are arranged in a second, different, spatial pattern; wherein inclusion in the same PV cell array, of (i) said top-side craters arranged in the first spatial pattern and (ii) said bottom-side craters arranged in the second spatial pattern, contributes to reduction of mechanical breakability of said PV cell array. In some embodiments, said top-side craters are arranged in a first density of craters per unit-of-area; wherein said bottom-side craters are arranged in a second, different, density of craters per unit-of-area; wherein inclusion in the same PV cell array, of (i) said top-side craters arranged in the first density and (ii) said bottom-side craters arranged in the second density, contributes to reduction of mechanical breakability of said PV cell array.

In some embodiments, a vertical thickness of each micro PV cell is smaller than one millimeter. In some embodiments, a vertical thickness of each micro PV cell is smaller than 0.3 millimeter. In some embodiments, at least some of the micro PV cells in said PV cell array, have at least one external side-wall that is slanted non-perpendicularly relative to a top surface of said single wafer; wherein inclusion of slanted side-walls of at least some of the micro PV cells, contributes to reduction of mechanical breakability of said PV cell array. In some embodiments, at least some of the micro PV cells in said PV cell array, have at least one external side-wall that is curved; wherein inclusion of curved side-walls of at least some of the micro PV cells, contributes to reduction of mechanical breakability of said PV cell array. In some embodiments, the micro PV cells of said PV cell array are covered with a transparent protective top-sheet. In some embodiments, the micro PV cells of said PV cell array are covered with a transparent top-sheet having optical concentrators that concentrate light towards particular active regions of the micro PV cells. In some embodiments, the micro PV cells of said PV cell array are mechanically inter-connected to each other via a bendable support sheet; wherein inclusion of said bendable support sheet contributes to (i) reduction of mechanical breakability of said PV cell array, and (ii) increase of mechanical flexibility of said PV cell array.

In some embodiments, each micro PV cell comprises a positive electrode and a negative electrode to output electric current generated by each such micro PV cell; wherein an electric conductor mesh connects, electrically, said micro PV cells and generates an aggregated electric output. In some embodiments, said craters are laser-cut grooves that are formed in particular places of said wafer. In some embodiments, said craters comprise corrugation-formed craters. In some embodiments, said craters comprise beam-based craters formed via a beam of light or radiation or laser. In some embodiments, said craters comprise DRIE-based craters that are formed via Deep Reactive Ion Etching (DRIE). In some embodiments, said craters comprise craters that are formed via dicing or cutting. In some embodiments, said craters comprise craters that are formed via dicing or cutting, wherein said dicing or cutting is performed along at least two different directions. In some embodiments, said craters comprise craters that are formed via dicing or cutting; wherein said dicing or cutting is performed along at least two different directions, which include at least one dimension that is non-perpendicular to a plane that holds electrical contacts of said micro PV-cells. In some embodiments, said craters comprise craters that are formed via dicing or cutting; wherein said dicing or cutting is performed along at least two different directions, which include at least one curved or non-straight direction.

In some embodiments, each micro PV-cell is a non-elongated micro PV-cell; wherein a ratio between (i) a horizontal length of a top area of each micro PV-cell, and (ii) a vertical length of the top area of each micro PV-cell, is not more than two-to-one. In some embodiments, said apparatus is a non-planar solar panel. In some embodiments, said apparatus is a roof of a vehicle, or is a vehicular component. In some embodiments, said apparatus is a roof of a building. In some embodiments, said apparatus is a roof shingle. In some embodiments, said apparatus is a roof or a side-panel of a device selected from the group consisting of: a drone, an aircraft, a watercraft, a spaceship, a satellite.

In some embodiments, an apparatus includes a segmented Photo Voltaic (PV) cell array, comprised of a plurality of micro PV cells; wherein the PV cell array comprises one of: (I) a single wafer that is segmented via a plurality of craters, (II) a portion of a single wafer that is segmented via a plurality of craters, (III) a set of two or more inter-connected wafers that are segmented via a plurality of craters; wherein said wafer is a wafer selected from the group consisting of: (i) a composite metallized wafer having an underlying metallization layer, wherein each crater penetrates an entirety of the non-metalized layers of said wafer but does not penetrate said underlying metallization layer of the wafer; (ii) a non-metallized semiconductor wafer, wherein each crater penetrates into 100 percent of the depth of said semiconductor wafer. Each crater creates a physical recess separation between two neighboring micro PV cells, which are still inter-connected to each other but only across some and not all of their height. The micro PV cells are connected to each other, mechanically and electrically.

Some embodiments provide a flexible and/or rollable and/or foldable and/or bendable Photovoltaic (PV) cell or PV device, having enhanced or improved properties of mechanical impact absorption, and having resilience or increased resilience or durability or increased durability against mechanical shocks, bending, folding, rolling, mechanical impacts, or other mechanical forces; and having the ability to better withstand such mechanical shocks or impact or forces without breaking and/or without becoming damaged and/or without damaging its operational functionality.

In some embodiments, the PV cell or PV device comprises: a semiconductor body that is comprised at least partially (or, that is comprised entirely and exclusively) of a semiconductor material (e.g., semiconductor substrate, semiconductor wafer), with a form-factor that includes a top surface, a bottom surface, and at least one sidewall. In some embodiments, the semiconductor body, and/or the semiconductor substrate, and/or the wafer or semiconductor wafer, in which gaps or craters or non-transcending gaps are formed to dissipate and/or absorb mechanical shocks and impacts, is free-standing or freestanding, is carrier-less and is not supported by any carrier or film or foil or metal film or metal foil or elastic film or elastic foil. In some embodiments, the semiconductor body, and/or the semiconductor substrate, and/or the wafer or semiconductor wafer, in which gaps or craters or non-transcending gaps are formed to dissipate and/or absorb mechanical shocks and impacts, does not require (and is not connected to, and is not mounted on, and is not mounted beneath, and is not attached to) a carrier or a carrier layer or a metal layer or a film or a foil or an elastic foil or an elastic layer or a flexible layer or a flexible foil or a rollable foil or a rollable layer or a foldable layer or a foldable film or a foldable foil; but rather, the integrated gaps or craters or non-transcending gaps that are included in the semiconductor wafer or substrate or body operate to dissipate and/or absorb mechanical shocks and impact, and operate to provide to the PV cell or PV device the resilience and non-breaking durability against mechanical shocks and impacts, and operate to provide to the PV cell or PV device an ability to bend or to flex or to be flexibly bent or to fold or to roll or to be flexible and/or foldable and/or rollable, only by virtue of such gaps or craters or non-transcending gaps in the semiconductor body or wafer or substrate itself, and without the need to mount or place or connect or attach or glue individual PV cells or micro-cells onto (or beneath) a flexible foil or flexible film or other carrier or support layer.

In some embodiments, the semiconductor body, and/or the semiconductor substrate, and/or the wafer or semiconductor wafer, in which gaps or craters or non-transcending gaps are formed to dissipate and/or absorb mechanical shocks and impacts, does not require (and is not connected to, and is not mounted on, and is not mounted beneath, and is not attached to) a non-substrate layer and/or a non-substrate support layer and/or a non-substrate carrier layer and/or a non-substrate film or a non-substrate foil and/or a non-substrate flexible layer and/or a non-substrate metal layer and/or a non-substrate fully-conductive layer and/or a non-substrate rigid layer and/or a non-substrate flexible-and-rigid or rigid-flex layer and/or a non-substrate insulator layer. In some embodiments, the semiconductor body, and/or the semiconductor substrate, and/or the wafer or semiconductor wafer, in which gaps or craters or non-transcending gaps are formed to dissipate and/or absorb mechanical shocks and impacts, does not require (and is not connected to, and is not mounted on, and is not mounted beneath, and is not attached to) a non-wafer layer and/or a non-wafer support layer and/or a non-wafer carrier layer and/or a non-substrate film or a non-wafer foil and/or a non-substrate flexible layer and/or a non-wafer metal layer and/or a non-wafer fully-conductive layer and/or a non-wafer rigid layer and/or a non-wafer flexible-and-rigid or rigid-flex layer and/or a non-wafer insulator layer.

In some embodiments, the semiconductor body, and/or the semiconductor substrate, and/or the wafer or semiconductor wafer, in which gaps or craters or non-transcending gaps are formed to dissipate and/or absorb mechanical shocks and impacts, does not require (and is not connected to, and is not mounted on, and is not mounted beneath, and is not attached to) a non-semiconductor layer and/or a non-semiconductor support layer and/or a non-semiconductor carrier layer and/or a non-semiconductor film or a non-semiconductor foil and/or a non-semiconductor flexible layer and/or a non-semiconductor metal layer and/or a non-semiconductor fully-conductive layer and/or a non-semiconductor rigid layer and/or a non-semiconductor flexible-and-rigid or rigid-flex layer and/or a non-semiconductor insulator layer.

In some embodiments, the semiconductor body, and/or the semiconductor substrate, and/or the wafer or semiconductor wafer, integrally includes a set of non-transcending gaps or "blind gaps", which penetrate only partially and not entirely into the wafer or substrate or semiconductor body, and which do not reach and do not exit or penetrate through both sides or both surfaces of the wafer or substrate or semiconductor body; and which exist and penetrate only in, or from, one side of the wafer or substrate or semiconductor body, either its top side or its bottom side but not both, or, either its top surface or bottom surface but not both; and this specific structure, realized the Applicants, provides the resilience against and/or the absorption of and/or the dissipation of mechanical shocks and impacts, and/or provides some or all of the capability to be flexible and/or rollable and/or flexible, and/or to modularly assume a non-planar structure or a curved structure or a convex structure or a concave structure.

In some embodiments, portions of semiconductor material (or semiconductor body, or semiconductor wafer) that are on opposite sides of a each such non-transcending gap or "blind gap" or crater, or that are immediately neighboring or bordering each such non-transcending gap or "blind gap" or crater, or that are immediately adjacent to each such non-transcending gap or "blind gap" or crater, become at least partially movable and/or flexible and/or rollable and/or foldable, relative to one another and/or relative to the general surface of the PV cell or the PV device; while a thin layer of the semiconductor body or semiconductor substrate or wafer remains intact and has no gaps and no craters and no holes and no "blind gaps" therein, located beneath those non-transcending gaps; and such think layer is sufficiently thin to flex or to roll or to fold or to at least partially change its three-dimensional structure from an entirely-planar surface to a non-planar surface or a partially-curved structure; and due to physical displacement or physical movement of the semiconductor body (or wafer, or substrate) that is neighboring each such non-transcending gap, they dissipate and/or absorb and/or withstand mechanical stresses and/or shocks and/or impacts and/or forces that may be applied (intentionally, or unintentionally) to that PV cell or to that PV device or to that semiconductor body or wafer or substrate; without breaking, or without breaking apart, or without creating broken pieces or singulated pieces or entirely-separate pieces; and those non-transcending gaps or craters or "blind gaps" within the semiconductor body or substrate or wafer operate as crack propagation inhibitor or crack prevention mechanisms or crack withstanding mechanism.

In some embodiments, the non-transcending gaps or craters or "blind gaps", penetrate into not more than 99 percent of the entire thickness of the semiconductor substrate or body or wafer; and leave the remaining thickness intact and non-penetrated and non-singulated and non-separated, to maintain the entire structure of a single unified semiconductor substrate (or wafer or body) which is still a single non-singulated/non-separated/non-separable unit or PV device (rather than being a collection of discrete/separate micro PV cells that are then connected via an additional flexible layer or support film or support foil).

In some embodiments, the non-transcending gaps or craters or "blind gaps", penetrate into not more than 98 percent of the entire thickness of the semiconductor substrate or body or wafer; or penetrate into not more than 97 percent of the entire thickness of the semiconductor substrate or body or wafer; or penetrate into not more than 96 percent of the entire thickness of the semiconductor substrate or body or wafer; or penetrate into not more than 95 percent of the entire thickness of the semiconductor substrate or body or wafer; or penetrate into not more than 90 percent of the entire thickness of the semiconductor substrate or body or wafer; or penetrate into not more than 85 percent of the entire thickness of the semiconductor substrate or body or wafer; or penetrate into not more than 80 percent of the entire thickness of the semiconductor substrate or body or wafer; or penetrate into not more than 75 percent of the entire thickness of the semiconductor substrate or body or wafer; or penetrate into not more than 66 percent of the entire thickness of the semiconductor substrate or body or wafer; or penetrate into not more than 50 percent of the entire thickness of the semiconductor substrate or body or wafer. In some embodiments, the non-transcending gaps or "blind gaps" or craters as described above, leave the remaining thickness intact and non-penetrated and non-singulated and non-separated. The Applicants have realized that for some implementation purposes of some types of PV devices or PV cells, the above-mentioned particular range of penetration depth may be particularly suitable for providing the mechanical shock absorption and/or the mechanical forces dissipation and/or the mechanical resilience and/or the crack inhibition mechanism and/or to provide the capability for the entire PV cell or the entire PV structure to become foldable and/or rollable and/or flexible without breaking and/or without cracking and/or without being functionally damaged or functionally degraded.

In some embodiments, the non-transcending gaps or craters or "blind gaps", penetrate into at least 50 percent but not more than 99 percent of the entire thickness of the semiconductor substrate or body or wafer; or penetrate into at least 66 percent but not more than 99 percent of the entire thickness of the semiconductor substrate or body or wafer; or penetrate into at least 75 percent but not more than 99 percent of the entire thickness of the semiconductor substrate or body or wafer; or penetrate into at least 80 percent but not more than 99 percent of the entire thickness of the semiconductor substrate or body or wafer; or penetrate into at least 85 percent but not more than 99 percent of the entire thickness of the semiconductor substrate or body or wafer; or penetrate into at least 90 percent but not more than 99 percent of the entire thickness of the semiconductor substrate or body or wafer; or penetrate into at least 95 percent but not more than 99 percent of the entire thickness of the semiconductor substrate or body or wafer.

In some embodiments, the non-transcending gaps or craters or "blind gaps", penetrate into at least 50 percent but not more than 95 percent of the entire thickness of the semiconductor substrate or body or wafer; or penetrate into at least 66 percent but not more than 95 percent of the entire thickness of the semiconductor substrate or body or wafer; or penetrate into at least 75 percent but not more than 95 percent of the entire thickness of the semiconductor substrate or body or wafer; or penetrate into at least 80 percent but not more than 95 percent of the entire thickness of the semiconductor substrate or body or wafer; or penetrate into at least 85 percent but not more than 95 percent of the entire thickness of the semiconductor substrate or body or wafer; or penetrate into at least 90 percent but not more than 95 percent of the entire thickness of the semiconductor substrate or body or wafer.

In some embodiments, the non-transcending gaps or craters or "blind gaps", penetrate into at least 50 percent but not more than 90 percent of the entire thickness of the semiconductor substrate or body or wafer; or penetrate into at least 66 percent but not more than 90 percent of the entire thickness of the semiconductor substrate or body or wafer; or penetrate into at least 75 percent but not more than 90 percent of the entire thickness of the semiconductor substrate or body or wafer; or penetrate into at least 80 percent but not more than 90 percent of the entire thickness of the semiconductor substrate or body or wafer; or penetrate into at least 85 percent but not more than 90 percent of the entire thickness of the semiconductor substrate or body or wafer.

The Applicants have realized that for some implementation purposes of some types of PV devices or PV cells, the above-mentioned particular values or ranges-of-values of penetration depth or penetration thickness, may be particularly suitable for providing the mechanical shock absorption and/or the mechanical forces dissipation and/or the mechanical resilience and/or the crack inhibition mechanism and/or to provide the capability for the entire PV cell or the entire PV structure to become foldable and/or rollable and/or flexible without breaking and/or without cracking and/or without being functionally damaged or functionally degraded.

In some embodiments, the resulting PV cell or PV device is flexible and/or rollable and/or foldable and/or bendable, and is freestanding and is non-supported and/or carrier-less; and has enhanced or improved properties of mechanical impact absorption due to having those set of gaps or "blind gaps" or craters or non-transcending gaps in the semiconductor material or substrate or body or wafer.

In some embodiments, the flexible and/or rollable and/or foldable and/or bendable PV cell is comprised of a single semiconductor substrate or a single semiconductor wafer or a single semiconductor body or a single semiconductor layer, which is segmented into neighboring segments or neighboring areas or neighboring regions by those set of non-transcending gaps or "blind gaps" or craters, which are placed only at one side of the semiconductor body (or wafer, or substrate); and which do not penetrate all the way through it to the other side or to the other surface, and do not "peek" or appear on the other side of the semiconductor body or substrate or wafer; and which do not fully divide and do not fully separate and do not fully singulate and do not fully create a full-depth barrier or any all-the-way-gap between any two neighboring portions or regions of the semiconductor body or substrate or wafer.

In some embodiments, at least some of those craters or gaps or "blind gaps" or non-transcending gaps, that are only at one side of the semiconductor body or wafer or substrate, contain or are filled with (entirely, or fully, or at least partially) a gap filler material; having force absorption properties and/or mechanical forces absorption properties and/or material toughening properties, which provides mechanical shock absorption and/or dissipation, and which is formed of a material that provides chemical durability and/or thermal durability and/or and mechanical durability. Such filler material(s) may include one or more of, or a combination or a mixture of two or more of: polyolefin elastomer (POE), and/or thermoplastic olefin (TPO), and/or ethylene vinyl acetate (EVA), and/or thermoplastic urethane (TPU), and/or one or more flexible or semi-flexible thermoplastics and/or elastomers and/or polymers with shock absorbing properties or impact absorbing properties or other suitable fillers or additives.

In some embodiments, the set of non-transcending gaps within said semiconductor body or wafer or substrate extend in a pattern forming a PV cell having segments or regions or areas of said semiconductor body or wafer or substrate, that are not fully isolated from each other, and that do not have a full barrier or a full space or a fully separating cavity between them.

In some embodiments, each segment or region or area of the semiconductor body or wafer or substrate, that is neighboring to or is bordering with a gap or crater or "blind gap" or non-transcending gap, includes at least two electrode contacts that are connected to a different side of a PN junction within its respective segment (or area, or region) of the semiconductor body or wafer or substrate or PV cell or PV device. In some embodiments, each electrode contact is electrically connected to a different side of a PN junction within its respective segment of the semiconductor body.

In some embodiments, each segment or region or area of the PV cell or the PV device or semiconductor body or wafer or substrate, that is neighboring (or is surrounded by) two or three or four or more such gaps or "blind gaps" or craters, has a top-side surface which is a polygon selected from the group consisting of: (a) a square; (b) a rectangle; (c) a decagon; (d) a hexagon; (e) a heptagon; and (f) an octagon. Other suitable structures may be used. In some embodiments, optionally, each side of said polygon has a length in the range of 0.1 to 3 millimeters, or 0.1 to 5 millimeters, or 0.1 to 6 millimeters, or 0.1 to 10 millimeters, or 0.5 to 10 millimeters, or 1 to 10 millimeters, or 1 to 6 millimeters, or 0.5 to 5 millimeters, or other suitable size or dimensions. In some embodiments, the bottom surface of each one of those segments or regions or areas, of the semiconductor body or wafer, has the same shape yet has different side lengths as the top surface thereof (e.g., such that each surface is formed as the same polygon but at different sizes or side-length; for example, a smaller top-side rectangular surface, and a larger bottom-side rectangular surface). In some embodiments, a thickness of each segment or region or area of the semiconductor body or wafer or substrate, from the top surface to the bottom surface, is in a range of 0.01 to 5 millimeters, or in a range of 0.01 to 6 millimeters, or in a range of 0.01 to 10 millimeters, or in a range of 0.01 to 3 millimeters, or in a range of 0.05 to 10 millimeters, or in a range of 0.05 to 5 millimeters, or in a range of 0.1 to 10 millimeters, or in a range of 0.01 to 5 millimeters, or in a range of 0.1 to 6 millimeters, or in other suitable range of values.

In some embodiments, at least one sidewall of at least one such segment or region or area of the semiconductor body or wafer or substrate (or PV cell, or PV device) is at a slope relative to the top surface, and/or has a curved surface.

In some embodiments, sidewalls of at least one segment or region or area of the semiconductor body or wafer or substrate, that are neighboring those craters or gaps or "blind gaps" or non-transcending gaps, are coated with a material that is different from the material from which those segments or regions or areas (of the semiconductor body or wafer or substrate) are formed. In some embodiments, the sidewalls of at least one such segment or region or area, of the semiconductor body or wafer or substrate, are coated with a passivation material or a passivation coating; for example, to increase PV efficiency, and/or to reduce or prevent recombination, and/or to promote charge-carrier selectivity, and/or to prevent or reduce non-desired recombination of photo-generated electron-hole pairs, and/or to achieve other benefits.

In some embodiments, at least a part of a sidewall of at least one such segment or region or area, of the semiconductor body or wafer or substrate, is coated with an electrically insulative material or coating. In some embodiments, at least a part of a sidewall of at least one such segment or region or area, of the semiconductor body or wafer or substrate, is coated with a compound that is produced by reacting the PV cell body material (or the semiconductor substrate or wafer) with a substance selected from the group consisting of: (a) oxygen, (b) ammonia, (c) nitrogen, (d) hydrogen, (e) argon, (f) a compound of two or more of said materials, (g) a mixture of two or more of said materials. In some embodiments, each of the electrode contacts is connected to a separate flexible conductor, which interconnects corresponding electrode contacts on separate segments (or regions, or areas) of the semiconductor body or substrate or wafer or PV cell or PV device.

In some embodiments, the PV cell or PV device may further include a clear polymer laminate or lamination layer, located on a surface of said one side of each such segment or region or area of the semiconductor body or substrate or wafer or PV cell or PV device; and/or a clear top sheet and/or encapsulant having optical concentrators located above those segments or areas or regions of the semiconductor body or substrate or wafer that perform the generation of energy using the PV effect, and such concentrators may improve or increase the energy generation. In some embodiments, the optical concentrators are formed in said clear top sheet by embossing, chemical etching, micromachining, laser ablation and/or other means, during or after said clear polymer laminate is affixed to said PV cell or PV device. In some embodiments, the optical concentrators are structured to direct sunlight or ambient light from an optimized inclination angle to an active area of a respective segment (or area, or region) of the semiconductor body or wafer or substrate or PV cell or PV device, by redirecting or steering or focusing or otherwise directing light headed towards one or more non-active parts (or portions, or areas, or side-walls, or regions) of the same or nearby segment (or region, or area) of the semiconductor body or wafer or substrate or PV cell or PV device.

In some embodiments, each segment or region or area of the semiconductor body or wafer or substrate (or PV cell, or PV device) comprises at least: a first electrode contact located under each such segment or area of region the semiconductor body or wafer or substrate; a second electrode contact located above each such segment or area or region of the semiconductor body or wafer or substrate, wherein each electrode contact is electrically connected to a different side of a PN junction within its respective segment (or area, or region) of the semiconductor body or wafer or substrate.

Some embodiments provide a single PV cell or a single PV device or a single PV article, that is comprised of a single semiconductor substrate or a single semiconductor wafer or a single semiconductor body; which is monolithic, e.g., is currently, and has been, a single item or a single article or a single component that was formed and remained a single component; and is not formed as a collection or two or more separate units or as a collection of two or more singulated or entirely-separated or entirely-discrete or entirely-gapped units that were arranged or placed together in proximity to each other yet onto a metal foil or onto a metal film or onto a flexible or elastic foil or film.

In some embodiments, the single PV cell or single PV device or single PV article is not a collection and is not an arrangement and is not an assembly of multiple discrete PV cells or of multiple discrete PV micro-cells, that each one of them has its own discrete and fully separated semiconductor substrate and/or its own discrete and fully separated semiconductor wafer and/or its own discrete and fully separated semiconductor body, and that have been merely placed to assembled or arranged together (or mounted together, or connected together) onto or beneath a flexible foil or a flexible film; but rather, the single PV cell or single PV device or single PV article has a single unified semiconductor substrate or semiconductor body or semiconductor wafer that is common to, and is shared by, all the regions or areas or portions of that single PV cell which includes therein (in that unified single semiconductor substrate or wafer or body) those craters or gaps or "blind gaps" or non-transcending gaps that penetrate only from one side (and not from both sides), which do not reach all the way through and do not reach all the way to the other side of the unified single semiconductor substrate or wafer or body.

In accordance with some embodiments, the flexible PV cell or PV device may be, or may include, a mono-crystalline PV cell or solar panel or solar device, a poly-crystalline PV cell or solar panel or solar device, a flexible PV cell or PV device that is an Interdigitated Back Contact (IBC) solar cell having said semiconductor wafer with said set of non-transcending gaps, and/or other suitable type of PV cell or PV device.

Some portions of the discussion above and/or herein may relate to regions or segments or areas, of the semiconductor body or substrate or wafer (or PV cell, or PV device); yet those "segments" are still touching each other and/or inherently connected to each other and/or non-separated from each other, as those "segments" are still connected by at least a thin portion or a thin bottom-side surface of the semiconductor substrate (or wafer, or body), which still holds and includes at least 1 (or at least 2, or at least 3, or at least 5, or at least 10, or at least 15, or at least 20, or at least 25, or at least 33; but not more than 50, or not more than 40) percent of the entire depth or the entire thickness (or the maximum thickness or depth) of the semiconductor substrate or body or wafer; as those "segments" are still connected at their base through such thin layer, and those "segments" have between them (or among them) the non-transcending gaps or the "blind gaps" or the craters that thus separate those "segments" but that do not fully divide or fully break or fully isolate any two such neighboring "segments" from each other.

Some embodiments provide a method of producing or manufacturing a flexible and/or rollable and/or bendable Photovoltaic (PV) cell or PV device, having enhanced properties of mechanical impact absorption and/or shock absorption and/or mechanical force dissipation and/or resilience to mechanical shocks. The method may include, producing or obtaining or receiving a semiconductor body or substrate or wafer, comprised at least partially of a semiconductor material or substrate or wafer with a form-factor that includes a top surface, a bottom surface, and at least one sidewall. The method further includes: producing or making a set of non-transcending gaps within said semiconductor body of said semiconductor material, by cutting or grooving or dicing or etching or scratching or cutting-out or laser-cutting or laser-etching or other suitable operations; wherein portions of semiconductor material on opposite sides of a respective non-transcending gap become movable relative to one another while a thin layer of said semiconductor body of said semiconductor material remains beneath said non-transcending gaps and is sufficiently thin to flex, and due to physical displacement dissipate mechanical stresses and absorb mechanical impacts applied to said semiconductor body; such that the method comprises producing said set of non-transcending gaps within said semiconductor body which acts or operates as crack propagation inhibitor and provides mechanical shock resilience to the PV cell; and such that the method produces said PV cell which is flexible and rollable, and is freestanding and carrier-less and non-supported, and has enhanced properties of mechanical impact absorption and/or mechanical shock dissipation and/or mechanical resilience, due to having said set of non-transcending gaps in the semiconductor material; wherein said flexible and rollable PV cell is comprised of a single semiconductor substrate which is segmented into segments by said set of non-transcending gaps which are placed only at one side of the semiconductor body, and wherein the method comprises placing or grooving or drilling or making or causing said set of non-transcending gaps only at one side (e.g., the top side, or the sun-facing or light-facing side, or the sunlight-absorbing side or the light-absorbing side) of the semiconductor body or substrate or wafer; and the method does not include, or the method excludes or avoids, production of similar to other gaps or craters on the other side or within the other side; and the method does not include, or the method excludes or avoids, singulating or dividing or breaking or entirely separating a single semiconductor substrate or wafer or body into two (or more) pieces or discrete singulated regions that are entirely separated from each via an entire space that follows along the entire depth (or height) of the semiconductor substrate or wafer or wafer. The method may further include: placing or filling or coating or injecting or adding or depositing, a gap filler material having force absorption properties and/or material toughening properties, into those non-transcending gaps, and thus providing mechanical shock absorption, wherein said gap filler material is formed of a material that provides chemical durability and/or thermal durability and/or mechanical durability.

In some embodiments, the non-transcending gaps or the "blind gaps" or craters or slits or grooves, are introduced and are formed only at a first side or at a first surface of the semiconductor substrate or body or wafer, and are not formed at both of the opposite surfaces (or sides) thereof. In some embodiments, the non-transcending gaps or the "blind gaps" or craters or slits or grooves, are introduced and are formed only at a first side or at a first surface of the semiconductor substrate or body or wafer, that is intended to face the sunlight or the light, or that is the active side of the PV device or PV cell, or that is intended to be the active side of the PV device or PV cell, or that is intended to be the electricity-generating side or surface that would generated electricity based on incoming sunlight or light or based on the PV effect; and they are not formed at the other (e.g., opposite, non-active) side or surface (e.g., the side that is not intended to be facing the sunlight or the light, or the side that is not intended to be producing electricity based on the PV effect).

In other embodiments, the non-transcending gaps or the "blind gaps" or craters or slits or grooves, are not introduced and are not formed at the side or surface of the semiconductor substrate or body or wafer, that is intended to face the sunlight or the light, or that is the active side of the PV device or PV cell, or that is intended to be the active side of the PV device or PV cell, or that is intended to be the electricity-generating side or surface that would generated electricity based on incoming sunlight or light or based on the PV effect; but rather, those non-transcending gaps or the "blind gaps" or craters or slits or grooves are formed at the other (e.g., opposite, non-active) side or surface, which is the side that is not intended to be facing the sunlight or the light, or the side that is not intended to be producing electricity based on the PV effect. Some implementations with this structure may advantageously provide the mechanical shock absorption and the mechanical forces dissipation capability, yet may also provide or maintain or achieve an increased level of PV-based electricity production since the gaps do not reduce the area of the light-exposed side or the light-facing side of the PV device.

In still other embodiments, the non-transcending gaps or the "blind gaps" or craters or slits or grooves, are introduced and are formed at both sides or at both surfaces of the semiconductor substrate or body or wafer; yet with an offset among the gaps of the first side and the gaps of the second side, in a zig-zag pattern of those gaps which zig-zag across the two sides of the semiconductor wafer or substrate or body; for example, a first gap located at the top surface on the left; then, a second gap located at the bottom surface to the right side of the first gap and not overlapping at all with the first gap; then, a third gap located at the top surface to the right side of the second gap and not overlapping at all with the second gap; then, a fourth gap located at the bottom surface to the right side of the third gap and not overlapping at all with the third gap; and so forth. In such structure, for example, any single point or any single location or any single region of the remaining semiconductor wafer or substrate or wafer, may have a gap or a crater or a "blind gap" only on one of its two sides, but not on both of its sides.

In yet other embodiments, the non-transcending gaps or the "blind gaps" or craters or slits or grooves, are introduced and are formed at both sides or at both surfaces of the semiconductor substrate or body or wafer; not necessarily with an offset among the gaps of the first side and the gaps of the second side, and not necessarily in a zig-zag pattern; but rather, by implementing any other suitable structure or pattern that still provides the mechanical shock resilience, and while also maintaining a sufficiently-thin layer of semiconductor substrate or body or wafer that is not removed and that is resilient to mechanical shocks and mechanical forces due to the craters or gaps that surround it.

Some embodiments include a flexible and/or rollable and/or foldable and/or bendable photovoltaic (PV) cell, having enhanced properties of mechanical impact absorption, the PV cell comprising: a semiconductor wafer that is freestanding and carrier-less, having a thickness, and having a first surface, and a having second surface that is opposite to said first surface; a set of non-transcending gaps, within said semiconductor wafer, wherein each non-transcending gap penetrates from the first surface of said semiconductor wafer towards the second surface of said semiconductor wafer but reaches to a depth of between 80 to 99 percent (or, between 85 to 99 percent; or, between 88 to 99 percent; or, between 90 to 99 percent; or, between 92 to 99 percent; or, between 95 to 99 percent) of the thickness of the semiconductor wafer, and does not reach said second surface; wherein each non-transcending gap does not entirely penetrate through an entirety of the thickness of said semiconductor wafer, wherein said semiconductor wafer maintains at least 1 percent of the thickness of the semiconductor wafer as an intact and non-penetrated thin layer of semiconductor wafer that remains intact and non-penetrated by said non-transcending gaps, wherein said intact and non-penetrated thin layer of semiconductor wafer absorbs and dissipates mechanical forces.

In some embodiments, each non-transcending gap is entirely filled with one or more filler materials that absorb mechanical shocks. In some embodiments, between 50 percent and 99 percent of a volume of each non-transcending gap, is filled with one or more filler materials that absorb mechanical shocks. In some embodiments, between 1 percent and 50 percent of a volume of each non-transcending gap, is filled with one or more filler materials that absorb mechanical shocks. In some embodiments, said flexible PV cell is an integrated part of a vehicular roof or a vehicular body part. In some embodiments, said flexible PV cell is an integrated part of: a marine vessel roof, or a marine vessel body part. In some embodiments, said flexible PV cell is an integrated part of a floating solar device. In some embodiments, said flexible PV cell is an integrated part of a device selected from the group consisting of: a drone, an aircraft, an aircraft body part, a satellite, a spaceship, a spacecraft, a military device, a military vehicle, a tank, an Armored Personnel Carrier (APC), a military aircraft, a military marine vessel. In some embodiments, said flexible PV cell is an integrated part of a building solar roof or a PV-capable shingle. In some embodiments, said flexible PV cell is an integrated part of: a helmet, or a wearable product, or a solar device that provides power to portable devices of hikers.

In some embodiments, said first surface is at a first side of the flexible PV cell that faces a light source and that generates electricity from light using a photovoltaic effect; wherein said second surface is at a second, opposite, side of the flexible PV cell which does not face the light source and which does not generate electricity from light; wherein each non-transcending gap penetrates from said first side towards, but not reaching, said second side; wherein each non-transcending gap reaches to a depth of between 80 to 99 percent of the distance between said first surface and said second surface.

In some embodiments, said first surface is at a first side of the flexible PV cell that does not face a light source and which does not generate electricity from light; wherein said second surface is at a second, opposite, side of the flexible PV cell which faces a light source and which generates electricity from light using a photovoltaic effect; wherein each non-transcending gap penetrates from said first side towards, but not reaching, said second side; wherein each non-transcending gap reaches to a depth of between 80 to 99 percent of the distance between said first surface and said second surface.

In some embodiments, said flexible PV cell is an Interdigitated Back Contact (IBC) solar cell having said semiconductor wafer with said set of non-transcending gaps.

In some embodiments, said flexible PV cell is integrated using a process selected from: an injection molding process, a compression molding process, an autoclave process, a wet layup process, a roto-molding process, a blow-molding process, a Resin Transfer Molding (RTM) process, a thermoforming process, a Sheet Molding Process (SMC), a Prepreg Compression Molding (PCM) process, a vacuum forming process, a reactive injection molding process, a calendering process, a batch lamination process, a semi-continuous lamination process, a continuous lamination process, a roll-to-roll lamination process, a double-belt lamination process.

In some embodiments, a method comprises: manufacturing a flexible and/or rollable and/or foldable and/or bendable photovoltaic (PV) cell having enhanced properties of mechanical impact absorption, by performing: (a) producing a semiconductor wafer that is freestanding and carrier-less, having a thickness, and having a first surface, and having a second surface that is opposite to said first surface; (b) producing a set of non-transcending gaps, within said semiconductor wafer, by making each non-transcending gap penetrate from the first surface of said semiconductor wafer towards the second surface of said semiconductor wafer, reaching to a depth of between 80 to 99 percent of the thickness of the semiconductor wafer, and not reaching said second surface; and by preventing each non-transcending gap from entirely penetrating through an entirety of the thickness of said semiconductor wafer, and by maintaining at least 1 percent of the thickness of the semiconductor wafer as an intact and non-penetrated thin layer of semiconductor wafer that remains intact and non-penetrated by said non-transcending gaps; wherein said intact and non-penetrated thin layer of semiconductor wafer absorbs and dissipates mechanical forces.

In some embodiments, the method comprises: entirely filling each of the non-transcending gaps, with one or more filler materials that absorb mechanical shocks. In some embodiments, the method comprises: partially filling, at least 50 percent of a volume of each of the non-transcending gaps, with one or more filler materials that absorb mechanical shocks. In some embodiments, the method comprises: partially filling, not more than 50 percent of a volume of each of the non-transcending gaps, with one or more filler materials that absorb mechanical shocks. In some embodiments, the method comprises: entirely filling each of the non-transcending gaps, with one or more filler materials that provide thermal durability to said semiconductor wafer. In some embodiments, the method comprises: partially filling, at least 50 percent of a volume of each of the non-transcending gaps, with one or more filler materials that provide thermal durability to said semiconductor wafer. In some embodiments, the method comprises: partially filling, not more than 50 percent of a volume of each of the non-transcending gaps, with one or more filler materials provide thermal durability to said semiconductor wafer.

Some embodiments provide a hybrid or unified or combined or singular photovoltaic (PV) device, comprising: (a) a rigid PV segment, comprising a first set of one or more PV cells that convert incoming light to electricity, wherein the rigid PV segment is non-foldable and non-bendable; and (b) a co-located flexible PV segment, comprising a second set of one or more PV cells that convert incoming light to electricity, wherein the flexible PV segment is foldable or bendable, wherein folding or bending of the flexible PV segment does not significantly damage the flexible PV segment. In some embodiments, each PV cell of said flexible PV segment is, by itself, a flexible PV cell having enhanced properties of mechanical impact absorption, or was (by itself, during the production process and/or during an encapsulation process) a flexible PV segment having enhanced properties of mechanical impact absorption, and comprises: a semiconductor wafer that is freestanding and carrier-less, having a thickness, and having a first surface, and a having second surface that is opposite to said first surface; a set of non-transcending gaps (or craters, or trenches, or grooves), within said semiconductor wafer, wherein each non-transcending gap penetrates from the first surface of said semiconductor wafer towards the second surface of said semiconductor wafer but reaches to a depth of between 50 to 99 percent of the thickness of the semiconductor wafer, and does not reach said second surface; wherein each non-transcending gap does not entirely penetrate through an entirety of the thickness of said semiconductor wafer; wherein said semiconductor wafer maintains between 1 to 50 percent of the thickness of the semiconductor wafer as an intact and non-penetrated thin layer of semiconductor wafer that remains intact and non-penetrated by said non-transcending gaps; wherein each non-transcending gap is filled with an elastomer that absorbs mechanical shocks and dissipates mechanical forces that are applied towards each said PV cell of said flexible PV segment; wherein said semiconductor wafer, that is freestanding and carrier-less, and excludes and does not comprise, and is not connected and not mounted on, any flexible film layer; wherein the non-transcending gaps in the semiconductor wafer, and the elastomer that fills the non-transcending gaps in the semiconductor wafer, absorb and dissipate mechanical forces and provide flexibility to said flexible PV cell; (c) one or more electric connectors, that connect between (i) electric current or electric voltage that are generated by the rigid PV segment, and (ii) electric current or electric voltage that are generated by the flexible PV segment; (d) a unified encapsulation layer or encapsulation sleeve or encapsulant, which encapsulates together both the rigid PV segment and the co-located flexible PV segment; wherein the rigid PV segment, the co-located flexible PV segment, the one or more electric connectors, and the unified encapsulation layer, form together said hybrid PV device which is a single stand-alone PV device that converts incoming light to electricity and that has at least one rigid region corresponding to said rigid PV segment and at least one flexible region corresponding to said co-located flexible PV segment.

In some embodiments, the rigid PV segment is a rigid planar PV segment; wherein the flexible PV segment is a flexible non-planar PV segment; wherein the rigid planar PV segment and the flexible non-planar PV segment are co-located next to each other and are electrically connected to each other, and are encapsulated by the same unified encapsulation layer.

In some embodiments, the rigid PV segment is a rigid planar PV segment; wherein the flexible PV segment is a flexible planar PV segment; wherein the rigid planar PV segment and the flexible planar PV segment are co-located next to each other and are electrically connected to each other, and are encapsulated by the same unified encapsulation layer.

In some embodiments, the rigid PV segment is a rigid non-planar PV segment; wherein the flexible PV segment is a flexible non-planar PV segment; wherein the rigid non-planar PV segment and the flexible non-planar PV segment are co-located next to each other and are electrically connected to each other, and are encapsulated by the same unified encapsulation layer.

In some embodiments, the rigid PV segment is a rigid non-planar PV segment; wherein the flexible PV segment is a flexible planar PV segment; wherein the rigid non-planar PV segment and the flexible planar PV segment are co-located next to each other and are electrically connected to each other, and are encapsulated by the same unified encapsulation layer.

In some embodiments, the rigid PV segment is pre-encapsulated by itself within a first particular encapsulant which is functionally suitable for rigid PV segments; wherein the flexible PV segment is pre-encapsulated by itself within a second particular encapsulant which is functionally suitable for flexible PV segments and which is different from the first particular encapsulant of the rigid PV segment; wherein the pre-encapsulated rigid PV segment and the pre-encapsulated flexible PV segment are co-located and are both further encapsulated by said unified encapsulation layer of the PV hybrid device.

In some embodiments, said hybrid PV device comprises said rigid PV segment at a first particular device-region that is intended to be maintained non-folded and not-bended; wherein said hybrid PV device comprises said flexible PV segment at a second particular device-region that is intended to be folded or bended.

In some embodiments, the rigid PV segment is configured to generate, on average, a first value I1 of electric current; wherein the flexible PV segment is configured to generate, on average, a second value I2 of electric current; wherein a difference between I1 and I2 is less than 10 percent of I1; wherein the rigid PV segment and the flexible PV segment are electrically connected to each other in series due to said difference between I1 and I2.

In some embodiments, the rigid PV segment is configured to generate, on average, a first value I1 of electric current; wherein the flexible PV segment is configured to generate, on average, a second value I2 of electric current; wherein a difference between I1 and I2 is at least 10 percent of I1; wherein the rigid PV segment and the flexible PV segment are electrically connected to each other in parallel due to said difference between I1 and I2.

In some embodiments, the hybrid PV device comprises a plurality of co-located PV segments which comprise: a plurality of rigid PV segments and a plurality of flexible PV segments, that are all co-located; wherein each one of the rigid PV segments is electrically connected, directly or indirectly, to at least one of the flexible PV segments; wherein each one of the flexible PV segments is electrically connected, directly or indirectly, to at least one of the rigid PV segments.

In some embodiments, said hybrid PV device comprises a first particular rigid PV segment that is co-located adjacent to a first particular flexible PV segment; wherein the first particular rigid PV segment is configured to generate, on average, a first value I1 of electric current; wherein the first particular flexible PV segment is configured to generate, on average, a second value I2 of electric current; wherein a difference between I1 and I2 is less than 10 percent of I1; wherein the first particular rigid PV segment and the first particular flexible PV segment are electrically connected to each other in series due to said difference between I1 and I2; wherein said hybrid PV device comprises a second particular rigid PV segment that is co-located adjacent to a second particular flexible PV segment; wherein the second particular rigid PV segment is configured to generate, on average, a third value I3 of electric current; wherein the second particular flexible PV segment is configured to generate, on average, a fourth value I4 of electric current; wherein a difference between I3 and I4 is less than 10 percent of I3; wherein the second particular rigid PV segment and the second particular flexible PV segment are electrically connected to each other in series due to said difference between I3 and I4.

In some embodiments, the hybrid PV device comprises a plurality of co-located PV segments which comprise: a plurality of rigid PV segments and a plurality of flexible PV segments, that are all co-located; wherein a pair of two co-located PV segments, that generate respectively a first value of average electric current I1 and a second value of average electric current I2, are electrically connected to each other in series if a difference between I1 and I2 is less than N percent of I1, and are electrically connected to each other in parallel if the difference between I1 and I2 is at least N percent of I1; wherein N is a pre-defined threshold value between 0 and 25.

In some embodiments, at least one of the PV segments comprises: a silicon wafer, having a plurality of craters that penetrate into the silicon wafer and do not reach a bottom side of the silicon wafer; wherein the plurality of craters assist in mechanical forces absorption and provide resilience to mechanical forces.

In some embodiments, the rigid PV segment is configured to generate, on average, a first value I1 of electric current; wherein the co-located flexible PV segment is configured to generate, on average, a second value I2 of electric current; wherein a difference between I1 and I2 is at least 10 percent of I1; wherein the rigid PV segment and the co-located flexible PV segment are electrically connected to each other indirectly via a Direct Current to Direct Current (DC/DC) converter unit that converts a level of electric current generated by the rigid PV segment to a level of electric current generated by the flexible PV segment.

In some embodiments, the rigid PV segment is configured to generate, on average, a first value I1 of electric current; wherein the co-located flexible PV segment is configured to generate, on average, a second value I2 of electric current; wherein a difference between I1 and I2 is at least 10 percent of I1; wherein the rigid PV segment and the co-located flexible PV segment are electrically connected to each other indirectly via a Direct Current to Direct Current (DC/DC) converter unit that converts a level of electric current generated by the flexible PV segment to a level of electric current generated by the rigid PV segment.

In some embodiments, the unified encapsulation layer, which encapsulates together both the rigid PV segment and the co-located flexible PV segment, comprises at least: a top-side encapsulating layer, which is transparent and enables passage of light therethrough, and is located at a first side of the PV device that is intended to receive incoming illumination for electricity generation; a bottom-side encapsulating layer, which is non-transparent and blocks passage of light therethrough, and is located at a second side of the PV device that is not intended to receive incoming illumination for electricity generation.

In some embodiments, the unified encapsulation layer, which encapsulates together both the rigid PV segment and the co-located flexible PV segment, comprises at least: a top-side encapsulating layer, which is transparent and enables passage of light therethrough, and is located at a first side of the PV device that is intended to receive incoming illumination for electricity generation; a bottom-side encapsulating layer, which is transparent and enables passage of light therethrough, and is located at a second side of the PV device that is also intended to receive incoming illumination for electricity generation; wherein the hybrid PV device is a bi-facial PV device or a dual-direction PV device that is capable of receiving incoming light at two opposite sides of the hybrid PV device and converts said incoming light to electricity.

In some embodiments, the bottom-side encapsulating layer comprises a metal layer that provides structural and mechanical support to said hybrid PV device; wherein said metal layer is located within said unified encapsulation layer, which encapsulates together both the rigid PV segment and the co-located flexible PV segment.

In some embodiments, the rigid PV segment is located at a first particular region of the hybrid PV device that is expected to receive a first level of light energy; wherein the flexible PV segment is located at a second particular region of the hybrid PV device that is expected to receive a second level of light energy that is smaller than said first level of light energy.

In some embodiments, the unified encapsulation layer, which encapsulates together both the rigid PV segment and the co-located flexible PV segment, comprises: a first encapsulation layer, which is a transparent top-side unified encapsulation layer that covers a top-side of the rigid PV segment and a top-side of the flexible PV segment; a second encapsulation layer, which is a non-transparent bottom-side unified encapsulation layer that covers a bottom-side of the rigid PV segment and a bottom-side of the flexible PV segment.

In some embodiments, the unified encapsulation layer, which encapsulates together both the rigid PV segment and the co-located flexible PV segment, comprises: a first encapsulation layer, which is a transparent top-side unified encapsulation layer that covers a top-side of the rigid PV segment and a top-side of the flexible PV segment; a second encapsulation layer, which is a transparent bottom-side unified encapsulation layer that covers a bottom-side of the rigid PV segment and a bottom-side of the flexible PV segment; wherein the hybrid PV device is a bi-facial PV device or a dual-direction PV device, that is capable of receiving incoming light at two opposite sides of the hybrid PV device and converts said incoming light to electricity.

In some embodiments, the top-side unified encapsulation layer is formed of one or more materials selected from: polycarbonate, polymethyl methacrylate, epoxy, polyester, acrylic, thermosetting polymer, prepreg material impregnated with a polymer, prepreg fiber sheets impregnated with resin, prepreg material impregnated with epoxy, prepreg material impregnated with polyester, prepreg material impregnated with polyurethane, prepreg material impregnated with acrylic, a mixture of two or more of above-mentioned materials, a combination two or more of above-mentioned materials; wherein the bottom-side unified encapsulation layer is formed of one or more materials selected from: polycarbonate, polymethyl methacrylate, polyurethane, polyethylene, polypropylene, polyamide, Acrylonitrile Butadiene Styrene (ABS), rubber, plastic, polymer, flexible plastic, flexible polymer, rigid plastic, rigid polymer, epoxy, polyester, acrylic, thermosetting polymer, prepreg material impregnated with a polymer, prepreg fiber sheets impregnated with resin, prepreg material impregnated with epoxy, prepreg material impregnated with polyester, prepreg material impregnated with polyurethane, prepreg material impregnated with acrylic, a mixture of two or more of above-mentioned materials, a combination two or more of above-mentioned materials.

In some embodiments, the rigid PV segment is pre-encapsulated within a first pre-encapsulation material, separately from the co-located flexible PV segment; wherein the flexible PV segment is pre-encapsulated within a second pre-encapsulation material, separately from the co-located rigid PV segment; wherein the first pre-encapsulation material is a material selected from: Polyolefin Elastomer (POE), Thermoplastic Polyurethane (TPU), Thermoplastic Olefin or Thermoplastic Polyolefin (TPO) or olefinic thermoplastic elastomer, Ethylene-vinyl acetate (EVA), poly (ethylene-vinyl acetate) (PEVA), epoxy, polyester, acrylic, thermosetting polymer, prepreg material impregnated with a polymer, prepreg fiber sheets impregnated with resin, prepreg material impregnated with epoxy, prepreg material impregnated with polyester, prepreg material impregnated with polyurethane, prepreg material impregnated with acrylic, a mixture of two or more of above-mentioned materials, a combination two or more of above-mentioned materials; wherein the second pre-encapsulation material is a material selected from: Polyolefin Elastomer (POE), Thermoplastic Polyurethane (TPU), Thermoplastic Olefin or Thermoplastic Polyolefin (TPO) or olefinic thermoplastic elastomer, Ethylene-vinyl acetate (EVA), poly (ethylene-vinyl acetate) (PEVA), epoxy, polyester, acrylic, thermosetting polymer, prepreg material impregnated with a polymer, prepreg fiber sheets impregnated with resin, prepreg material impregnated with epoxy, prepreg material impregnated with polyester, prepreg material impregnated with polyurethane, prepreg material impregnated with acrylic, a mixture of two or more of above-mentioned materials, a combination two or more of above-mentioned materials.

In some embodiments, the hybrid PV device comprises a plurality of co-located PV segments which include at least two rigid PV segments and at least two flexible PV segments; wherein at least a first PV segment of said plurality of co-located PV segments is electrically connected in series to a second PV segment of said plurality of PV segments; wherein at least a third PV segment of said plurality of co-located PV segments is electrically connected in parallel to a fourth PV segment of said plurality of PV segments.

In some embodiments, the hybrid PV device comprises a plurality of co-located PV segments which include at least two rigid PV segments and at least two flexible PV segments; wherein at least a first rigid PV segment of said plurality of co-located PV segments is electrically connected in series to a second flexible PV segment of said plurality of PV segments; wherein at least a third rigid PV segment of said plurality of co-located PV segments is electrically connected in parallel to a fourth flexible PV segment of said plurality of PV segments.

In some embodiments, the rigid PV segment comprises: (I) at least one rigid PV segment, that is rigid and was rigid prior to encapsulation; and (II) at least one co-located additional rigid PV segment, that is rigid but was flexible prior to encapsulation and become fixedly rigid during encapsulation or post encapsulation.

In some embodiments, the flexible PV segment is structured to gradually become a rigid and non-flexible PV segment during encapsulation or post encapsulation.

In some embodiments, the hybrid PV device comprises: one or more flexible PV segments, and one or more co-located non-planar rigid PV segments, that are together encapsulated by said unified encapsulation layer; wherein the hybrid PV device is one of: a vehicular component that generates electricity for a vehicle, a rooftop PV solar panel that generates electricity for a venue.

In some embodiments, at least one of the flexible PV segments is a flexible PV cell that excludes any thin-film component and that is not a thin-film PV cell, and that comprises: a silicon wafer, having a plurality of non-transcending craters that penetrate into between 50 to 99 percent of a depth of the silicon wafer and do not reach a bottom side of the silicon wafer; wherein the plurality of non-transcending craters absorb mechanical forces and provide to the PV device resilience against mechanical forces.

In some embodiments, the hybrid PV device is a vehicular component that generates electricity for a vehicle. In some embodiments, the hybrid PV device is a rooftop PV solar panel that generates electricity for a venue. In some embodiments, the hybrid PV device is self-floating and self-buoyant on water, as the entirety of the hybrid PV device has Specific Weight that is smaller than one.

In some embodiments, the hybrid PV device comprises: (i) at least one generally-planar flexible PV segment, that is co-located with (ii) at least one non-planar rigid PV segment; wherein all of said PV segments are encapsulated by a unified encapsulant.

In some embodiments, the hybrid PV device comprises: (i) at least one non-planar flexible PV segment, that is co-located with (ii) at least one non-planar rigid PV segment; wherein all of said PV segments are encapsulated by a unified encapsulant.

In some embodiments, the hybrid PV device comprises: (i) at least one generally-planar flexible PV segment, that is co-located with (ii) at least one generally-planar rigid PV segment; wherein all of said PV segments are encapsulated by a unified encapsulant.

In some embodiments, the hybrid PV device comprises: (i) at least one non-planar flexible PV segment, that is co-located with (ii) at least one non-planar rigid PV segment; wherein all of said PV segments are encapsulated by a unified encapsulant.

Functions, operations, components and/or features described herein with reference to one or more embodiments of the present invention, may be combined with, or may be utilized in combination with, one or more other functions, operations, components and/or features described herein with reference to one or more other embodiments of the present invention. The present invention may comprise any possible combinations, re-arrangements, assembly, re-assembly, or other utilization of some or all of the modules or functions or components that are described herein, even if they are discussed in different locations or different chapters of the above discussion, or even if they are shown across different drawings or multiple drawings.

While certain features of some demonstrative embodiments of the present invention have been illustrated and described herein, various modifications, substitutions, changes, and equivalents may occur to those skilled in the art. Accordingly, the claims are intended to cover all such modifications, substitutions, changes, and equivalents.

What is claimed is:
1. A hybrid photovoltaic (PV) device, comprising:
(a) a rigid PV segment, comprising a first set of one or more PV cells that convert incoming light to electricity, wherein the rigid PV segment is non-foldable and non-bendable;
(b) a co-located flexible PV segment, comprising a second set of one or more PV cells that convert incoming light to electricity, wherein the flexible PV segment is foldable or bendable, wherein folding or bending of the flexible PV segment does not significantly damage the flexible PV segment;
wherein each PV cell of said flexible PV segment is, by itself, a flexible PV cell having enhanced properties of mechanical impact absorption and mechanical resilience to forces, and comprises:
a semiconductor wafer
having a thickness, and having a first surface, and a having second surface that is opposite to said first surface;
a set of non-transcending gaps, within said semiconductor wafer,
wherein each non-transcending gap penetrates from the first surface of said semiconductor wafer towards the second surface of said semiconductor wafer but reaches to a depth of between 50 to 99 percent of the thickness of the semiconductor wafer, and does not reach said second surface;

wherein each non-transcending gap does not entirely penetrate through an entirety of the thickness of said semiconductor wafer, wherein said semiconductor wafer maintains between 1 to 50 percent of the thickness of the semiconductor wafer as an intact and non-penetrated thin layer of semiconductor wafer that remains intact and non-penetrated by said non-transcending gaps, wherein each non-transcending gap is filled with an elastomer that absorbs mechanical shocks and dissipates mechanical forces that are applied towards each said PV cell of said flexible PV segment;

wherein the non-transcending gaps in the semiconductor wafer, and the elastomer that fills the non-transcending gaps in the semiconductor wafer, absorb and dissipate mechanical forces and provide flexibility to said flexible PV cell;

(c) one or more electric connectors, that connect between (i) electric current or electric voltage that are generated by the rigid PV segment, and (ii) electric current or electric voltage that are generated by the flexible PV segment;

(d) a unified encapsulation layer, which encapsulates together both the rigid PV segment and the co-located flexible PV segment;

wherein the rigid PV segment, the co-located flexible PV segment, the one or more electric connectors, and the unified encapsulation layer, form together said hybrid PV device which is a single stand-alone PV device that converts incoming light to electricity and that has at least one rigid region corresponding to said rigid PV segment and at least one flexible region corresponding to said co-located flexible PV segment.

2. The hybrid PV device of claim 1,
wherein the rigid PV segment is a rigid planar PV segment,
wherein the flexible PV segment is a flexible non-planar PV segment,
wherein the rigid planar PV segment and the flexible non-planar PV segment are co-located next to each other and are electrically connected to each other, and are encapsulated by the same unified encapsulation layer.

3. The hybrid PV device of claim 1,
wherein the rigid PV segment is a rigid planar PV segment,
wherein the flexible PV segment is a flexible planar PV segment,
wherein the rigid planar PV segment and the flexible planar PV segment are co-located next to each other and are electrically connected to each other, and are encapsulated by the same unified encapsulation layer.

4. The hybrid PV device of claim 1,
wherein the rigid PV segment is a rigid non-planar PV segment,
wherein the flexible PV segment is a flexible non-planar PV segment,
wherein the rigid non-planar PV segment and the flexible non-planar PV segment are co-located next to each other and are electrically connected to each other, and are encapsulated by the same unified encapsulation layer.

5. The hybrid PV device of claim 1,
wherein the rigid PV segment is a rigid non-planar PV segment,
wherein the flexible PV segment is a flexible planar PV segment,
wherein the rigid non-planar PV segment and the flexible planar PV segment are co-located next to each other and are electrically connected to each other, and are encapsulated by the same unified encapsulation layer.

6. The hybrid PV device of claim 1,
wherein the rigid PV segment is pre-encapsulated by itself within a first particular encapsulant which is functionally suitable for rigid PV segments;
wherein the flexible PV segment is pre-encapsulated by itself within a second particular encapsulant which is functionally suitable for flexible PV segments and which is different from the first particular encapsulant of the rigid PV segment;
wherein the pre-encapsulated rigid PV segment and the pre-encapsulated flexible PV segment are co-located and are both further encapsulated by said unified encapsulation layer of the PV hybrid device.

7. The hybrid PV device of claim 1,
wherein said hybrid PV device comprises said rigid PV segment at a first particular device-region that is intended to be maintained non-folded and not-bended;
wherein said hybrid PV device comprises said flexible PV segment at a second particular device-region that is intended to be folded or bended.

8. The hybrid PV device of claim 1,
wherein the rigid PV segment is configured to generate, on average, a first value I1 of electric current;
wherein the flexible PV segment is configured to generate, on average, a second value I2 of electric current;
wherein a difference between I1 and I2 is less than 10 percent of I1;
wherein the rigid PV segment and the flexible PV segment are electrically connected to each other in series due to said difference between I1 and I2.

9. The hybrid PV device of claim 1,
wherein the rigid PV segment is configured to generate, on average, a first value I1 of electric current;
wherein the flexible PV segment is configured to generate, on average, a second value I2 of electric current;
wherein a difference between I1 and I2 is at least 10 percent of I1;
wherein the rigid PV segment and the flexible PV segment are electrically connected to each other in parallel due to said difference between I1 and I2.

10. The hybrid PV device of claim 1,
wherein the hybrid PV device comprises a plurality of co-located PV segments which comprise: a plurality of rigid PV segments and a plurality of flexible PV segments, that are all co-located;
wherein each one of the rigid PV segments is electrically connected, directly or indirectly, to at least one of the flexible PV segments;
wherein each one of the flexible PV segments is electrically connected, directly or indirectly, to at least one of the rigid PV segments.

11. The hybrid PV device of claim 1,
wherein said hybrid PV device comprises a first particular rigid PV segment that is co-located adjacent to a first particular flexible PV segment;
wherein the first particular rigid PV segment is configured to generate, on average, a first value I1 of electric current;
wherein the first particular flexible PV segment is configured to generate, on average, a second value I2 of electric current;

wherein a difference between I1 and I2 is less than 10 percent of I1;
wherein the first particular rigid PV segment and the first particular flexible PV segment are electrically connected to each other in series due to said difference between I1 and I2;
wherein said hybrid PV device comprises a second particular rigid PV segment that is co-located adjacent to a second particular flexible PV segment;
wherein the second particular rigid PV segment is configured to generate, on average, a third value I3 of electric current;
wherein the second particular flexible PV segment is configured to generate, on average, a fourth value I4 of electric current;
wherein a difference between I3 and I4 is less than 10 percent of I3;
wherein the second particular rigid PV segment and the second particular flexible PV segment are electrically connected to each other in series due to said difference between I3 and I4.

12. The hybrid PV device of claim 1,
wherein the hybrid PV device comprises a plurality of co-located PV segments which comprise: a plurality of rigid PV segments and a plurality of flexible PV segments, that are all co-located;
wherein a pair of two co-located PV segments, that generate respectively a first value of average electric current I1 and a second value of average electric current I2, are electrically connected to each other in series if a difference between I1 and I2 is less than N percent of I1, and are electrically connected to each other in parallel if the difference between I1 and I2 is at least N percent of I1; wherein N is a pre-defined threshold value between 0 and 25.

13. The hybrid PV device of claim 1,
wherein at least one of the PV segments comprises:
a silicon wafer, having a plurality of craters that penetrate into the silicon wafer and do not reach a bottom side of the silicon wafer; wherein the plurality of craters assist in mechanical forces absorption and provide resilience to mechanical forces.

14. The hybrid PV device of claim 1,
wherein the rigid PV segment is configured to generate, on average, a first value I1 of electric current;
wherein the co-located flexible PV segment is configured to generate, on average, a second value I2 of electric current;
wherein a difference between I1 and I2 is at least 10 percent of I1;
wherein the rigid PV segment and the co-located flexible PV segment are electrically connected to each other indirectly via a Direct Current to Direct Current (DC/DC) converter unit that converts a level of electric current generated by the rigid PV segment to a level of electric current generated by the flexible PV segment.

15. The hybrid PV device of claim 1,
wherein the rigid PV segment is configured to generate, on average, a first value I1 of electric current;
wherein the co-located flexible PV segment is configured to generate, on average, a second value I2 of electric current;
wherein a difference between I1 and I2 is at least 10 percent of I1;
wherein the rigid PV segment and the co-located flexible PV segment are electrically connected to each other indirectly via a Direct Current to Direct Current (DC/DC) converter unit that converts a level of electric current generated by the flexible PV segment to a level of electric current generated by the rigid PV segment.

16. The hybrid PV device of claim 1,
wherein the unified encapsulation layer, which encapsulates together both the rigid PV segment and the co-located flexible PV segment, comprises at least:
a top-side encapsulating layer, which is transparent and enables passage of light therethrough, and is located at a first side of the PV device that is intended to receive incoming illumination for electricity generation;
a bottom-side encapsulating layer, which is non-transparent and blocks passage of light therethrough, and is located at a second side of the PV device that is not intended to receive incoming illumination for electricity generation.

17. The hybrid PV device of claim 1,
wherein the unified encapsulation layer, which encapsulates together both the rigid PV segment and the co-located flexible PV segment, comprises at least:
a top-side encapsulating layer, which is transparent and enables passage of light therethrough, and is located at a first side of the PV device that is intended to receive incoming illumination for electricity generation;
a bottom-side encapsulating layer, which is transparent and enables passage of light therethrough, and is located at a second side of the PV device that is also intended to receive incoming illumination for electricity generation;
wherein the hybrid PV device is a bi-facial PV device or a dual-direction PV device that is capable of receiving incoming light at two opposite sides of the hybrid PV device and converts said incoming light to electricity.

18. The hybrid PV device of claim 1,
wherein the bottom-side encapsulating layer comprises a metal layer that provides structural and mechanical support to said hybrid PV device;
wherein said metal layer is located within said unified encapsulation layer, which encapsulates together both the rigid PV segment and the co-located flexible PV segment.

19. The hybrid PV device of claim 1,
wherein the rigid PV segment is located at a first particular region of the hybrid PV device that is expected to receive a first level of light energy;
wherein the flexible PV segment is located at a second particular region of the hybrid PV device that is expected to receive a second level of light energy that is smaller than said first level of light energy.

20. The hybrid PV device of claim 1,
wherein the unified encapsulation layer, which encapsulates together both the rigid PV segment and the co-located flexible PV segment, comprises:
a first encapsulation layer, which is a transparent top-side unified encapsulation layer that covers a top-side of the rigid PV segment and a top-side of the flexible PV segment;
a second encapsulation layer, which is a non-transparent bottom-side unified encapsulation layer that covers a bottom-side of the rigid PV segment and a bottom-side of the flexible PV segment.

21. The hybrid PV device of claim 1,
wherein the unified encapsulation layer, which encapsulates together both the rigid PV segment and the co-located flexible PV segment, comprises:

a first encapsulation layer, which is a transparent top-side unified encapsulation layer that covers a top-side of the rigid PV segment and a top-side of the flexible PV segment;
a second encapsulation layer, which is a transparent bottom-side unified encapsulation layer that covers a bottom-side of the rigid PV segment and a bottom-side of the flexible PV segment;
wherein the hybrid PV device is a bi-facial PV device or a dual-direction PV device, that is capable of receiving incoming light at two opposite sides of the hybrid PV device and converts said incoming light to electricity.

22. The hybrid PV device of claim 1,
wherein the top-side unified encapsulation layer is formed of one or more materials selected from: polycarbonate, polymethyl methacrylate, epoxy, polyester, acrylic, thermosetting polymer, prepreg material impregnated with a polymer, prepreg fiber sheets impregnated with resin, prepreg material impregnated with epoxy, prepreg material impregnated with polyester, prepreg material impregnated with polyurethane, prepreg material impregnated with acrylic, a mixture of two or more of above-mentioned materials, a combination two or more of above-mentioned materials;
wherein the bottom-side unified encapsulation layer is formed of one or more materials selected from: polycarbonate, polymethyl methacrylate, polyurethane, polyethylene, polypropylene, polyamide, Acrylonitrile Butadiene Styrene (ABS), rubber, plastic, polymer, flexible plastic, flexible polymer, rigid plastic, rigid polymer, epoxy, polyester, acrylic, thermosetting polymer, prepreg material impregnated with a polymer, prepreg fiber sheets impregnated with resin, prepreg material impregnated with epoxy, prepreg material impregnated with polyester, prepreg material impregnated with polyurethane, prepreg material impregnated with acrylic, a mixture of two or more of above-mentioned materials, a combination two or more of above-mentioned materials.

23. The hybrid PV device of claim 1,
wherein the rigid PV segment is pre-encapsulated within a first pre-encapsulation material, separately from the co-located flexible PV segment;
wherein the flexible PV segment is pre-encapsulated within a second pre-encapsulation material, separately from the co-located rigid PV segment;
wherein the first pre-encapsulation material is a material selected from: Polyolefin Elastomer (POE), Thermoplastic Polyurethane (TPU), Thermoplastic Olefin or Thermoplastic Polyolefin (TPO) or olefinic thermoplastic elastomer, Ethylene-vinyl acetate (EVA), poly (ethylene-vinyl acetate) (PEVA), epoxy, polyester, acrylic, thermosetting polymer, prepreg material impregnated with a polymer, prepreg fiber sheets impregnated with resin, prepreg material impregnated with epoxy, prepreg material impregnated with polyester, prepreg material impregnated with polyurethane, prepreg material impregnated with acrylic, a mixture of two or more of above-mentioned materials, a combination two or more of above-mentioned materials;
wherein the second pre-encapsulation material is a material selected from: Polyolefin Elastomer (POE), Thermoplastic Polyurethane (TPU), Thermoplastic Olefin or Thermoplastic Polyolefin (TPO) or olefinic thermoplastic elastomer, Ethylene-vinyl acetate (EVA), poly (ethylene-vinyl acetate) (PEVA), epoxy, polyester, acrylic, thermosetting polymer, prepreg material impregnated with a polymer, prepreg fiber sheets impregnated with resin, prepreg material impregnated with epoxy, prepreg material impregnated with polyester, prepreg material impregnated with polyurethane, prepreg material impregnated with acrylic, a mixture of two or more of above-mentioned materials, a combination two or more of above-mentioned materials.

24. The hybrid PV device of claim 1,
wherein the hybrid PV device comprises a plurality of co-located PV segments which include at least two rigid PV segments and at least two flexible PV segments;
wherein at least a first PV segment of said plurality of co-located PV segments is electrically connected in series to a second PV segment of said plurality of PV segments;
wherein at least a third PV segment of said plurality of co-located PV segments is electrically connected in parallel to a fourth PV segment of said plurality of PV segments.

25. The hybrid PV device of claim 1,
wherein the hybrid PV device comprises a plurality of co-located PV segments which include at least two rigid PV segments and at least two flexible PV segments;
wherein at least a first rigid PV segment of said plurality of co-located PV segments is electrically connected in series to a second flexible PV segment of said plurality of PV segments;
wherein at least a third rigid PV segment of said plurality of co-located PV segments is electrically connected in parallel to a fourth flexible PV segment of said plurality of PV segments.

26. The hybrid PV device of claim 1,
wherein the rigid PV segment comprises: (I) at least one rigid PV segment, that is rigid and was rigid prior to encapsulation; and (II) at least one co-located additional rigid PV segment, that is rigid but was flexible prior to encapsulation and become fixedly rigid during encapsulation or post encapsulation.

27. The hybrid PV device of claim 1, wherein the hybrid PV device comprises:
one or more flexible PV segments, and one or more co-located non-planar rigid PV segments, that are together encapsulated by said unified encapsulation layer;
wherein the hybrid PV device is one of:
a vehicular component that generates electricity for a vehicle,
a rooftop PV solar panel that generates electricity for a venue.

28. The hybrid PV device of claim 1,
wherein at least one of the flexible PV segments is a flexible PV cell that excludes any thin-film component and that is not a thin-film PV cell, and that comprises:
a silicon wafer, having a plurality of non-transcending craters that penetrate into between 50 to 99 percent of a depth of the silicon wafer and do not reach a bottom side of the silicon wafer;
wherein the plurality of non-transcending craters absorb mechanical forces and provide to the PV device resilience against mechanical forces.

29. The hybrid PV device of claim 1,
wherein the hybrid PV device is a vehicular component that generates electricity for a vehicle.

30. The hybrid PV device of claim 1, wherein the hybrid PV device is a rooftop PV solar panel that generates electricity for a venue.

\* \* \* \* \*